(12) United States Patent
Ohtani et al.

(10) Patent No.: US 8,222,690 B2
(45) Date of Patent: Jul. 17, 2012

(54) VERTICAL POWER MOSFET SEMICONDUCTOR APPARATUS HAVING SEPARATE BASE REGIONS AND MANUFACTURING METHOD THEREOF

(75) Inventors: Kinya Ohtani, Kanagawa (JP); Kenya Kobayashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 32 days.

(21) Appl. No.: 12/923,859

(22) Filed: Oct. 12, 2010

(65) Prior Publication Data

US 2011/0024832 A1 Feb. 3, 2011

Related U.S. Application Data

(62) Division of application No. 11/500,332, filed on Aug. 8, 2006, now abandoned.

(30) Foreign Application Priority Data

Aug. 26, 2005 (JP) ................................. 2005-246180

(51) Int. Cl.
*H01L 29/66* (2006.01)
(52) U.S. Cl. ........ 257/330; 257/328; 257/329; 257/331; 257/E29.262
(58) Field of Classification Search .................. 257/328, 257/329, 330, 331, E27.02, E29.183, E29.262
See application file for complete search history.

(56) References Cited

U.S. PATENT DOCUMENTS

| 5,072,266 | A | 12/1991 | Bulucea et al. |
| 5,689,128 | A | 11/1997 | Hshieh et al. |
| 5,929,481 | A | 7/1999 | Hshieh et al. |
| 5,998,837 | A | 12/1999 | Williams |
| 6,413,822 | B2 * | 7/2002 | Williams et al. .............. 438/270 |
| 2005/0032287 | A1 | 2/2005 | Nakazawa et al. |
| 2005/0035398 | A1 | 2/2005 | Williams et al. |
| 2005/0042815 | A1 | 2/2005 | Williams et al. |

FOREIGN PATENT DOCUMENTS

JP 09-036362 A 2/1997

(Continued)

OTHER PUBLICATIONS

United States Office Action dated May 26, 2011 in U.S. Appl. No. 12/585,381.
United States Office Action dated Nov. 9, 2011 in U.S. Appl. No. 12/585,381.
Japanese Office Action dated Nov. 15, 2011 with English translation.

*Primary Examiner* — Robert Huber
(74) *Attorney, Agent, or Firm* — McGinn Intellectual Property Law Group, PLLC

(57) ABSTRACT

A semiconductor apparatus includes a doped semiconductor layer formed on a semiconductor substrate of a first conductivity type and first and second gate trenches formed in the semiconductor layer, the second gate trench being separated from the first gate trench in a first direction. The doped semiconductor layer includes a low concentration base region of a second conductivity typed formed between the first and second gate trenches, a first source region of the first conductivity type, a second source region of the first conductivity type, a first high concentration base region of the second conductivity type, and a second high concentration base region of the second conductivity type formed so that the first and second high concentration base regions are separated by the low concentration base region, and the second high concentration base region is not below both of the first and second source regions.

3 Claims, 50 Drawing Sheets

FOREIGN PATENT DOCUMENTS

| | | |
|---|---|---|
| JP | 2001-135817 A | 5/2001 |
| JP | 2001-203353 A | 7/2001 |
| JP | 2001-308328 A | 11/2001 |
| JP | 2005-5655 | 1/2005 |

* cited by examiner

VERTICAL POWER MOSFET SEMICONDUCTOR APPARATUS HAVING SEPARATE BASE REGIONS AND MANUFACTURING METHOD THEREOF

CROSS REFERENCE TO RELATED APPLICATIONS

This is a divisional application of U.S. patent application Ser. No. 11/500,332, filed Aug. 8, 2006, now abandoned, which claims priority to Japanese Patent Application No. 2005-246180 filed Aug. 26, 2005, the contents of which are both incorporated in their entirety.

BACKGROUND OF THE INVENTION

1. Field of the Invention

The present invention relates to a semiconductor apparatus and a manufacturing method thereof.

2. Description of Related Art

A vertical power MOSFET (Metal-Oxide Semiconductor Field Effect Transistor) as a MOSFET for a high pressure is known in the art. As an example of such a power MOSFET, a trench gate MOSFET is well known. This trench gate MOSFET includes a gate electrode inside a trench with a channel formed in a vertical direction to a principle surface of a semiconductor substrate. This allows a reduction in cell pitch, and highly integrated semiconductor is achieved, and also a low ON-resistance is achieved.

Besides a strong demand in a reduction of manufacturing cost, a lower ON-resistance and a higher destruction resistance are desired as characteristics of such a power MOSFET. The ON-resistance of a power MOSFET should be as small as possible in order to suppress a drop in voltage and increase of heat, for example. Destruction resistance of off-state power MOSFET should be as high as possible for a large voltage.

A conventional semiconductor apparatus disclosed in U.S. Pat. No. 5,072,266 is known, for example. FIG. 25 is a cross-sectional diagram of a conventional semiconductor apparatus disclosed in U.S. Pat. No. 5,072,266.

As shown in FIG. 25, a semiconductor apparatus 800 includes an N type epitaxial layer 902 and a P type base diffusion layer 903 over an N type semiconductor substrate 901. A trench 910 is formed to reach the N type epitaxial layer 902 from the P type base diffusion layer 903. A gate electrode 912 is embedded in the trench 910 via a gate insulating film 911.

A N type source diffusion layer 904 is formed near the trench 910 on the P type base diffusion layer 903. A P+ type diffusion layer 905 is formed between the N type source diffusion layer 904. The P+ type diffusion layer 905 reaches the N type epitaxial layer 902 from a surface of the P type base diffusion layer 903, to a deeper position than the trench 910. The conventional semiconductor apparatus 800 is provided with the P+ type diffusion layer 905 formed deeper than the P+ type diffusion layer 905 so as to improve destruction resistance.

Another conventional semiconductor apparatus disclosed in Japanese Unexamined Patent Application Publication No. 2005-5655 is known. FIG. 26 is a cross-sectional diagram of the conventional semiconductor apparatus disclosed in Japanese Unexamined Patent Application Publication No. 2005-5655.

As shown in FIG. 26, the conventional semiconductor apparatus 900 includes a P+ type diffusion layer 906 below a P type base diffusion layer 903. The P+ type diffusion layer 906 is formed deeper than the trench 910. An N+ type diffusion layer 907 is formed at the bottom of the trench 910. The conventional semiconductor 900 improves destruction resistance by forming the P+ type diffusion layer 906 and the N+ type diffusion layer 907.

However with the semiconductor apparatus 800 shown in FIG. 25, it is necessary to form the P+ type diffusion layer 905 deeper than the trench 910 from the surface of the P type base diffusion layer 903. So, an intensive thermal diffusion is required during manufacturing process. Intensive thermal diffusion causes other diffusion layers to be deeper and to be wider, thereby increasing the width of the semiconductor apparatus 800. Deeper diffusion layers increase ON-resistance. Furthermore larger width of a diffusion layer increases an interval between trenches and a size of a cell, which is a unit region, surrounded by the trenches. This influences a chip size of a semiconductor apparatus, and increases a manufacturing cost.

The conventional semiconductor apparatus 900 shown in FIG. 26 improves destruction resistance by the P+ type diffusion layer 906 formed deeper than the trench 910 and the N+ type diffusion layer 907 formed at a bottom of the trench 910. Destruction resistance could be deteriorated only with the P+ type diffusion layer 906. Electric field can be concentrated to a portion extended to the N type semiconductor substrate 901 side (drain side), as of the P+ type diffusion layer 906, to deteriorate destruction resistance. To prevent a concentration of electric field and improve destruction resistance, both the P+ type diffusion layer 906 and the N+ type diffusion layer 907 are required.

As described in the foregoing, in a conventional semiconductor apparatus, if a P+ type region is formed deeper than a trench from a surface of a P type base layer, size of a cell and manufacturing cost increase. Furthermore without an N+ type layer formed at the bottom of a trench, destruction resistance of a semiconductor apparatus could be deteriorated. Accordingly it has now been discovered that in a conventional technique for realizing a semiconductor device that is a high destruction resistance and a low ON-resistance, there were problems that a configuration of a semiconductor apparatus and a manufacturing method were complicated and the manufacturing cost was increased.

SUMMARY OF THE INVENTION

According to an aspect of the present invention, there is provided a semiconductor apparatus including a doped semiconductor layer formed on a semiconductor substrate of a first conductivity type, and a first gate trench formed in the semiconductor layer, a second gate trench formed in the semiconductor layer separated from the first gate trench in a first direction. The doped semiconductor layer including a low concentration base region of a second conductivity type formed between the first and second gate trenches, the low concentration base region having a first edge in touch with the first gate trench and a second edge in touch with the second gate trench, a first source region of the first conductivity type formed at an upper surface of the low concentration base region, a second source region of the first conductivity type formed at the upper surface of the low concentration base region separated from the first source region in a second direction perpendicular to the first direction, each of the first and second source regions having a first edge in touch with the first gate trench and a second edge in touch with the second gate trench, a first high concentration base region of the second conductivity type formed at an upper surface of the low concentration base region between the first and second source regions, the first high concentration base region having a first edge in touch with the first gate trench, a second edge in touch with the second gate trench, a third edge in touch with the first source region, and a fourth edge in touch with the second source region, and a second high concentration base region of the second conductivity type formed below the first high concentration base region so that the first and second high concentration base regions are separated by the low concentration base region and the second high concentration base region is not provided below both of the first and second source regions.

According to another aspect of the present invention semiconductor apparatus that comprises a first semiconductor layer of a first conductive type; a low concentration base region of a second conductive type formed on the first semiconductor layer; a gate electrode formed in a trench with insulating film on an inner surface of the trench that is formed to reach the first semiconductor layer from a surface of the low concentration base region; a source region of the first conductive type formed, contacting the insulating film, on the surface of the low concentration base region; a first high concentration base region of the second conductive type formed on the surface of the low concentration base region; and a second high concentration base region of the second conductive type formed to be included inside the low concentration base region, separated from the first high concentration base region, and closer to the first high concentration base region than a depth order of a bottom surface of the trench.

With this semiconductor apparatus, the first high and the second high concentration base regions are formed inside the low concentration base region, thereby suppressing an operation of a parasitic bipolar transistor and reducing a base resistance of the parasitic bipolar transistor. This achieves a high destruction resistance and a low ON-resistance with a simple configuration, so that manufacturing cost of a semiconductor apparatus is reduced.

According to another aspect of the present invention, there is provided a method of manufacturing a semiconductor apparatus that comprises forming a trench on a surface of a first semiconductor layer of a first conductive type; forming a gate electrode in the trench with an insulating film on an inner surface of the trench; forming a low concentration base region of a second conductive type on the surface of the first semiconductor layer; forming a source region of the first conductive type on a surface of the low concentration base region; forming a first high concentration base region of the second conductive type on the surface of the low concentration base region; and forming a second high concentration base region of the second conductive type to be included in the low concentration base region, separated from the first high concentration base region, and closer to the first high concentration base region than a depth order of a bottom surface of the trench.

With this manufacturing method, the first and the second high concentration base regions are formed inside the low concentration base region, thereby suppressing an operation of a parasitic bipolar transistor and reducing a base resistance of the parasitic bipolar transistor. This achieves a high destruction resistance and a low ON-resistance with a simple configuration, so that manufacturing cost of a semiconductor apparatus is reduced.

The present invention provides a semiconductor apparatus that achieves a high destruction resistance and a low ON-resistance with a simple configuration, thereby reducing manufacturing cost.

BRIEF DESCRIPTION OF THE DRAWING

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

A semiconductor apparatus of a first embodiment is explained hereinafter in detail. The semiconductor apparatus of this embodiment relates to a trench gate MOSFET comprised of rectangular cells. The trench gate MOSFET includes a first P+ type diffusion layer in an upper portion of the P type base diffusion layer, and a second P+ type diffusion layer in a lower portion of the P type base diffusion layer.

Figure 1:
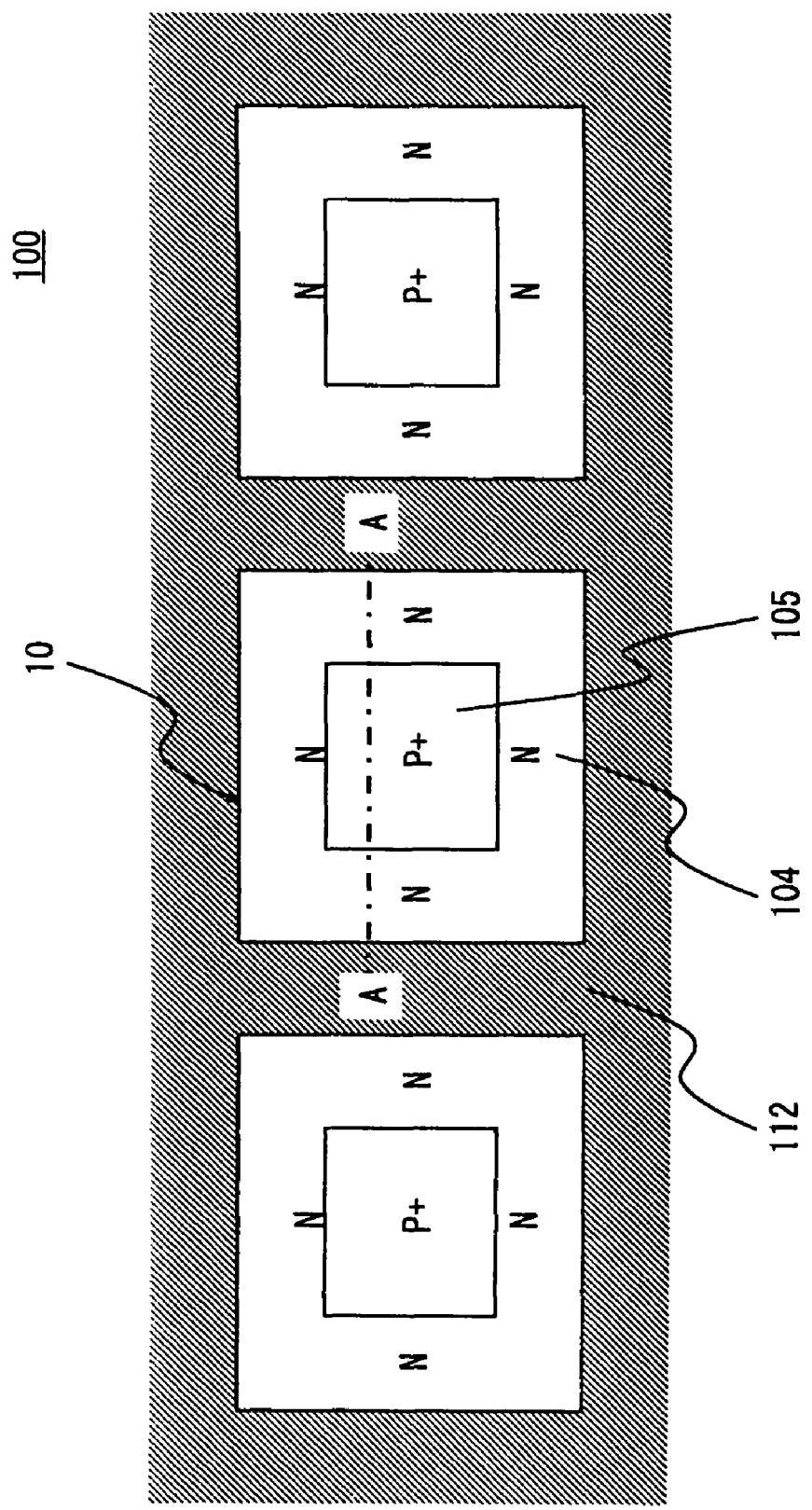
FIG. 1 is a plan view showing a configuration of a semiconductor apparatus according to the present invention.
Figure 2:
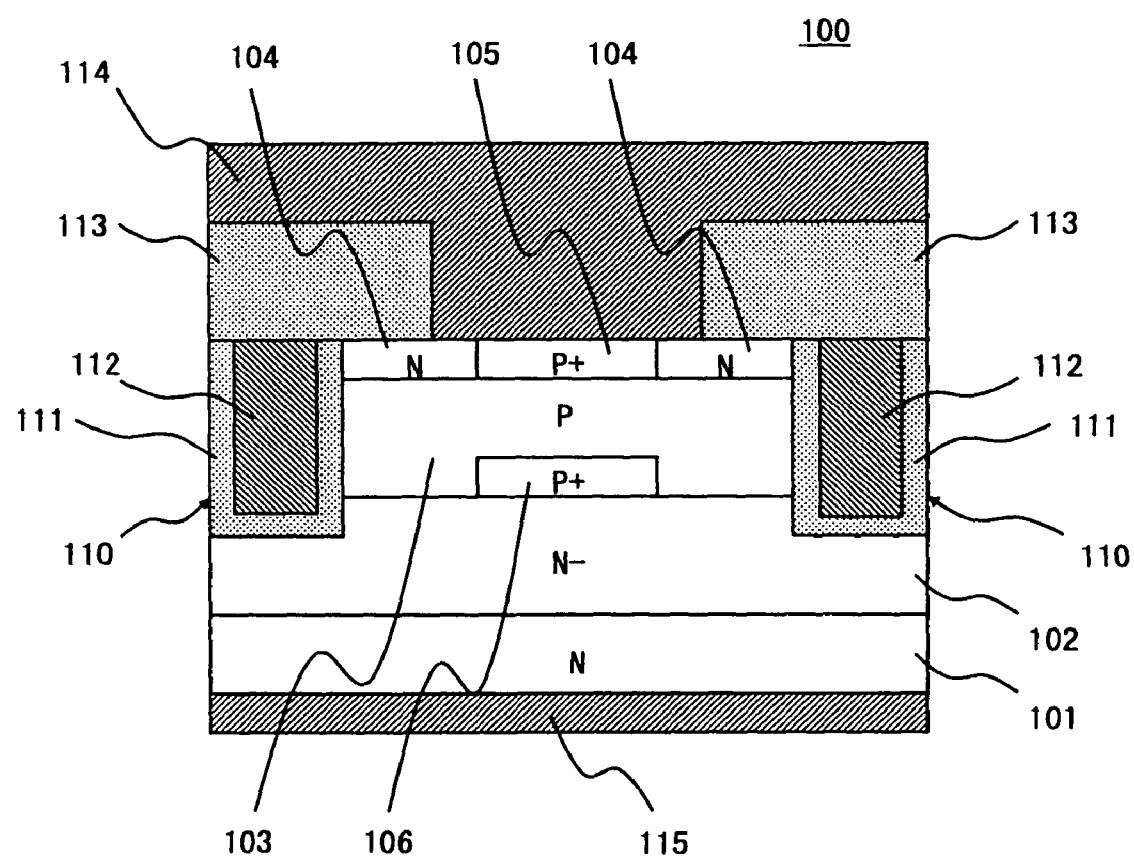
FIG. 2 is a cross-sectional diagram showing a configuration of a semiconductor apparatus according to the present invention.

A configuration of the semiconductor apparatus of this embodiment is described hereinafter with reference to FIGS. 1 and 2. A semiconductor apparatus 100 is a vertical power MOSFET for high pressure. The semiconductor apparatus 100 is a trench gate MOSFET. FIG. 1 is a plan view of the semiconductor apparatus 100. FIG. 2 is a cross-sectional diagram taken along the line A-A of FIG. 1. In FIG. 1, an interlayer dielectric 113 and a source electrode 114 are not shown.

As shown in FIG. 1, the semiconductor apparatus 100 includes a plurality of rectangular unit cells (rectangular cells) 10. Each of the unit cells is placed separated from each other. The unit cell 10 includes an N type source diffusion layer 104 formed around the unit cell 10, and a P+ type diffusion layer 105 formed on a center of the unit cell 10. A gate electrode 112 is placed in a region between the respective cells 10.

As shown in FIG. 2, the semiconductor apparatus 100 includes an N type semiconductor substrate 101. The N type semiconductor substrate 101 is an N type high concentration semiconductor substrate. The semiconductor substrate is formed of silicon substrate, for example. Over an entire surface of the N type semiconductor substrate 101, an N− type epitaxial layer 102 is formed. The N− type epitaxial layer 102 is an N type low concentration semiconductor layer of its impurity concentration is lower than the N type semiconductor substrate 101. The N− type epitaxial layer 102 and the N type semiconductor substrate 101 form a first N type semiconductor layer. The N− type epitaxial layer 102 operates as a drain of a MOSFET.

A P type base diffusion layer 103 is formed on the N− type epitaxial layer 102. The P type base diffusion layer 103 is a P type low concentration semiconductor region (low density base region). Further, while MOSFET is operating, a channel is formed near the gate electrode 112, and the P type base diffusion layer 103 is to include the channel region (region where the channel is formed).

The N type source diffusion layer 104 is formed in a region near the gate electrode 112 on the P type base diffusion layer 103. The region near the gate electrode 112 contacts a gate oxide film and has a specified width. The N type source diffusion layer 104 is an N type high concentration semiconductor region (source region). The N type source diffusion layer 104 acts as a source of MOSFET.

The first P+ type diffusion layer 105 is formed between N type source diffusion layer 104 on the P type base diffusion layer. The N type source diffusion layer 104 is not formed in the region where the first P+ type diffusion layer 105 is formed. The first P+ type diffusion layer 105 is P type high concentration semiconductor region (a first high concentration base region). The first P+ type diffusion layer 105 acts as a base contact region of MOSFET.

A second P+ type diffusion layer 106 is formed at the bottom of the P type base diffusion layer 103. The second P+ type diffusion layer 106 is located in a region inside the P type base diffusion layer 103. The second P+ type diffusion layer 106 is formed separated from the first P+ type diffusion layer 105. The second P+ type diffusion layer 106 is formed deeper than the first P+ type diffusion layer 105 and shallower than the bottom of the trench 110. The second P+ type diffusion layer 106 is formed straight below the first P+ type diffusion layer 105. The second P+ type diffusion layer 106 is P type high concentration semiconductor region (a second high concentration base region) as with the first P+ type diffusion layer. In this embodiment, widths of the first P+ type diffusion layer 105 and the second P+ type diffusion layer 106 are almost the same. Further, the second P+ type diffusion layer 106 is located straight below the first P+ type diffusion layer 105. The second P+ type diffusion layer 106 prevents an avalanche current from flowing to operate parasitic bipolar transistor, which is described later in detail. The second P+ type diffusion layer 106 also reduces a base resistance of the parasitic bipolar transistor.

The trench 110 is formed over the N type semiconductor substrate 101. The trench 110 penetrates the N type source diffusion layer 104 and the P type base diffusion layer 103 from the surface of the N type source diffusion layer 104 and the P type base diffusion layer 103 to reach the N− type epitaxial layer 102. A gate oxide film (gate insulating film) 111 is formed to cover the inner surface of the trench 110. The gate electrode 112 is embedded into the trench 110. The gate electrode 112 is formed by polysilicon, for example. The trench 110 is filled with the polysilicon to its opening.

The interlayer dielectric 113 is formed on the gate electrode 112. The interlayer dielectric 113 is formed to cover the opening of the trench 110 and a part of the N type source diffusion layer 104. The interlayer dielectric 113 includes a contact hole, which is not shown, that pulls the gate electrode 112 to outside.

The source electrode 114 is formed on the N type source diffusion layer 104, the first P+ type diffusion layer 105, and the interlayer dielectric 113. The source electrode 114 is electrically connected with the N type source diffusion layer 104 via a contact hole formed on the surface of the N type source diffusion layer 104.

A drain electrode 115 is formed over an entire surface of the bottom of the N type semiconductor substrate 101. The drain electrode 115 is formed on the opposite surface (backside) of a semiconductor apparatus to the front surface where the trench 110 is formed. This backside is an opposite surface to a surface where the source electrode 114 is formed.

Figure 3A:
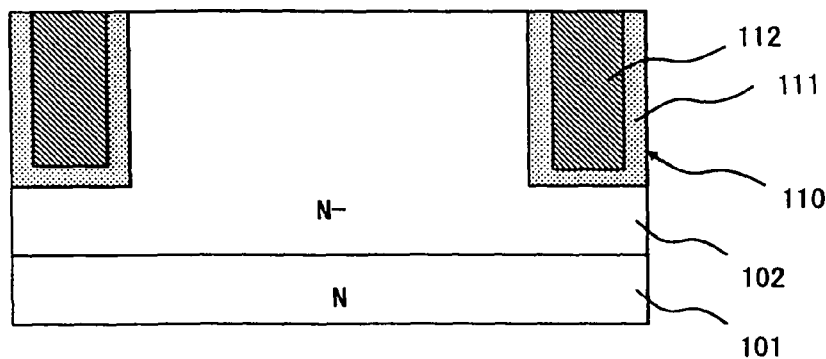
FIGS. 3A to 3D are cross-sectional diagrams explaining a manufacturing method of the semiconductor apparatus according to the present invention.

A method of manufacturing a semiconductor apparatus of this embodiment is described hereinafter in detail with reference to FIGS. 3A to 3D. Firstly as shown in FIG. 3A, the N− type epitaxial layer 102 is formed on the N type semiconductor substrate 101. Then selectively perform plasma silicon etching on the surface of the N− type epitaxial layer 102 using a photolithography method to form the trench 110. Then form the gate oxide film 111 using thermal oxidation method on the inner surface of the trench 110. After that form a polysilicon on the surface of the N− type epitaxial layer 102 and the inner surface of the trench 10. Fill high concentration impurity (phosphorus) in this polysilicon and process with high temperature. After the high-temperature process, etch back the polysilicon formed on unnecessary portion to leave the polysilicon only on the inner surface of the trench 110. This is how the gate electrode 112 is formed.

Figure 3B:
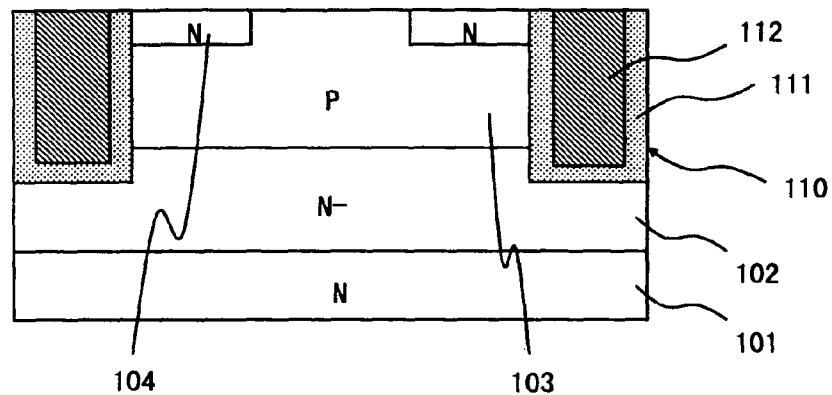

Next as shown in FIG. 3B, boron is implanted by ion implantation from the surface of the N− type epitaxial layer 102, then heat treatment is performed to form the P type base diffusion layer 103. Then form a resist mask using photolithography method, implant arsenic by ion implantation to a portion adjacent to the trench 110, and perform heat treatment. This is how the N type source diffusion layer 104 is formed.

Figure 3C:
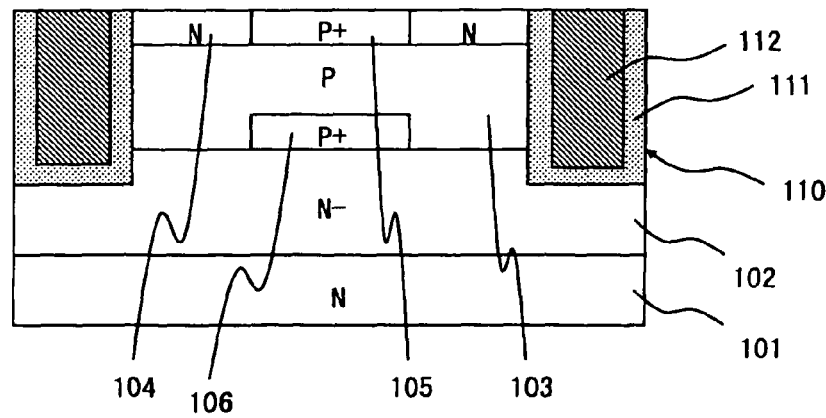

After that, as shown in FIG. 3C, forma resist mask using photolithography method, implant boron twice by ion implantation to a center part of a cell, and perform heat treatment. This is how the first P+ type diffusion layer 105 and the second P+ type diffusion layer 106.

At this time, adjust the position (depth) where the second P+ type diffusion layer 106 is formed depending on an amount of energy to implant ion. Higher the energy to implant, deeper the ion is implanted, and deeper the second P+ type diffusion layer 106 is formed. The amount of energy to implant so as to form the second P+ type diffusion layer 106 needs to be determined in a way that the second P+ type diffusion layer 106 is separated from the first P+ type diffusion layer 105 and is formed inside the P type base diffusion layer 103.

Specifically, to form the first P+ type diffusion layer 105, a short range ion implantation is performed, and to form the second P+ type diffusion layer 106, a longer range ion implantation is performed. For example an energy to form the first P+ type diffusion layer 105 is low, approximately 30 keV. On the other hand an energy to form the second P+ type diffusion layer 106 is high, approximately 300 keV.

Furthermore, impurity concentration of the second P+ type diffusion layer 106 should be adjusted according to an amount of ion dose to be implanted. The more the amount of dose, the higher the impurity concentration of the second P+ type diffusion layer 106. High impurity concentration causes an electric field in the portion to be higher and a resistance value to be lower. Therefore, higher dose amount better suppresses a breakdown current to flow in parasitic bipolar transistor and also better reduces a base resistance of the parasitic bipolar transistor. For example the amount of dos to form the second P+ type diffusion layer 106 is more or equal to $1 \times 10^{11}$ atom/cm². The first P+ type diffusion layer 105 and the second P+ type diffusion layer 106 could be formed using different masks.

In this embodiment, the P+ type diffusion layer is not consecutively formed from the surface of the P type base diffusion layer 103 to a deeper position, but ion is implanted for the second P+ type diffusion layer 106 separately from for the first P+ type diffusion layer 105. Thus it is possible to form the P+ type diffusion layer with higher concentration to the bottom of the P type base diffusion layer 103. It also eliminates the needs for an intensive heat treatment.

Figure 3D:
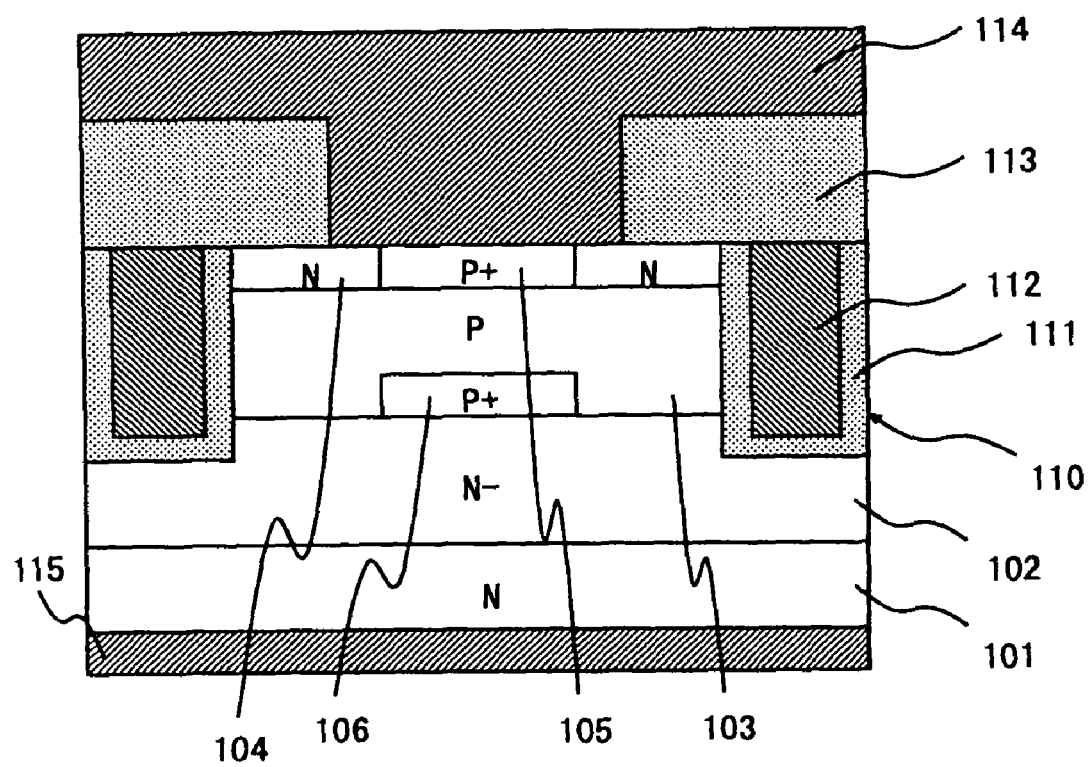

Then as shown in FIG. 3D, form a silicon oxide film using CVD method, pattern the silicon oxide film using photolithography and dry etching methods so as to form the interlayer dielectric 113. The interlayer dielectric 113 is planar or reticular shape that covers the gate electrode 112 and a part of the N type source diffusion layer 104. After that, form an aluminum film over an entire surface of the semiconductor substrate and the interlayer dielectric 113 using spatter method. Then pattern the aluminum film using photolithography and dry etching methods to form the source electrode 114. After that, form the drain electrode 115 on a backside of the N type semiconductor substrate 101 using spatter method. This is how the semiconductor apparatus 100 is completed.

In this embodiment, the first P+ type diffusion layer 105 and the second P+ type diffusion layer 106 are formed after the N type source diffusion layer 104. However they may be formed after forming a contact between the N type source diffusion layer 104 and the source electrode 114 or forming the interlayer dielectric 113. For example after a contact is formed, implant ion from the contact hole to form the first P+ type diffusion layer 105 and the second P+ type diffusion layer 106. In this case, the contact hole must be expanded by etching it and a part of the N type source diffusion layer 104 must be exposed to form the first P+ type diffusion layer 105 and the second P+ type diffusion layer 106 in a way that the N type source diffusion layer 104 contacts with the source electrode 114.

Figure 4A:
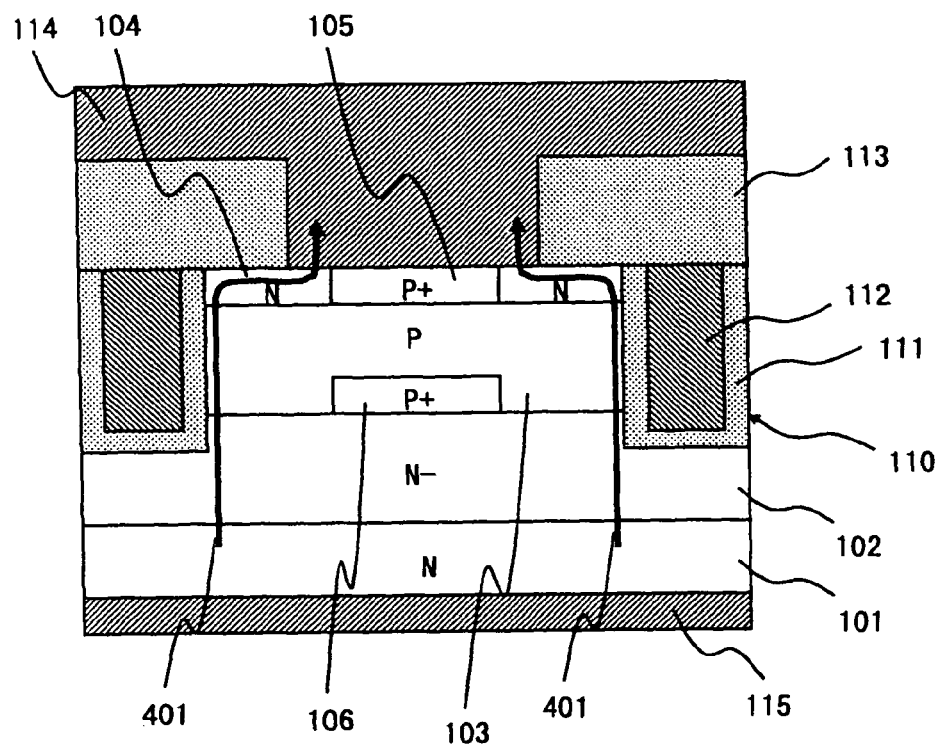
FIGS. 4A and 4B are cross-sectional diagrams explaining an operation of the semiconductor apparatus according to the present invention.

An operation of the semiconductor apparatus of this embodiment is described hereinafter in detail with reference to FIGS. 4A and 4B. FIG. 4A illustrates a current flow while MOSFET is turned on. If a voltage more than or equal to threshold is applied between the gate electrode 112 and the source electrode 114, a channel region is formed in the P type base diffusion layer 103 near the gate electrode 112. Then a charge moves from the N type source diffusion layer 104 to the N type semiconductor substrate 101. The current flows from the drain electrode 115 to the source electrode 114 through near the gate electrode 112 in a direction indicated by arrows 401. In this embodiment, the second P+ type diffusion layer 106 is formed separated from the first P+ type diffusion layer 105. Accordingly regardless the size of the second P+ type diffusion layer 106, a P+ type diffusion layer can be formed in a region avoiding the channel region (threshold of MOSFET). Therefore, providing the second P+ type diffusion layer 106 does not influence a characteristic at a normal operation such as threshold of MOSFET. This indicates that the ON-resistance of the semiconductor apparatus 100 is as low as a semiconductor apparatus without the second P+ type diffusion layer 106.

Figure 4B:
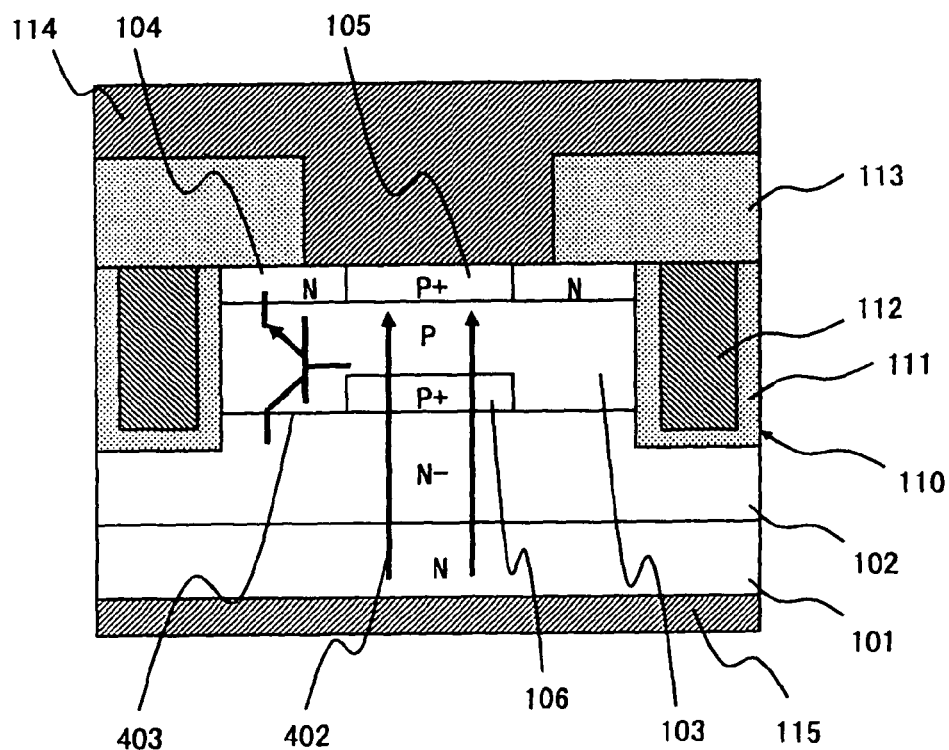

FIG. 4B illustrates a current flow while MOSFET is turned off and a breakdown has been occurred. Specifically it illustrates a flow of an avalanche current. FIG. 4B shows a current flow by switching L load, for example. A counter-electromotive voltage is generated by switching L load, and if it exceeds a withstand pressure of MOSFET, an avalanche current is generated. At this time a potential difference between the avalanche current and a diffusion layer resistance of the P type base diffusion layer 103 is generated, consequently a parasitic bipolar transistor 403 attempts to operate that is parasitized on the N type source diffusion layer 104, the P type base diffusion layer 103, and the N− type epitaxial layer 102. However in this embodiment, the avalanche current flows through the second P+ type diffusion layer 106 to a direction indicated by arrows 402. This is because that electric field is concentrated to the bottom of the second P+ type diffusion layer 106 which is mounted to the bottom of the P type base diffusion layer 103. Accordingly the parasitic bipolar transistor 403 does not operate and thermal destruction by bipolar transistor is not generated, thereby preventing MOSFET from being destroyed and also improving destruction resistance against an avalanche operation in L load.

Effects of the semiconductor apparatus of this embodiment are explained hereinafter with reference to simulation results shown in FIGS. 27A to 30B.

Figure 27A:
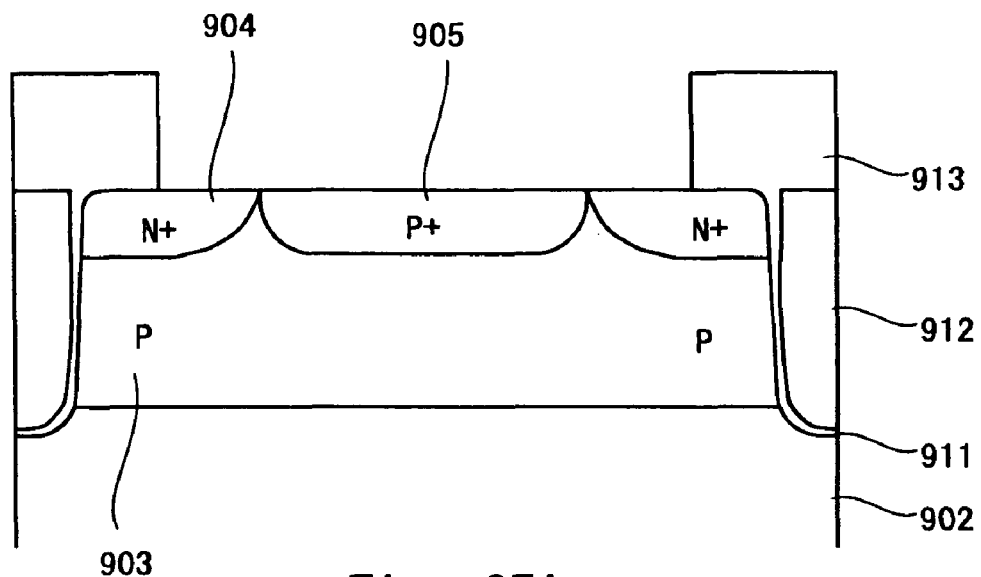
FIGS. 27A and 27B are cross-sectional diagrams showing a simulation result at a breakdown of a semiconductor apparatus without a second P+ type diffusion layer according to the present invention.
Figure 27B:
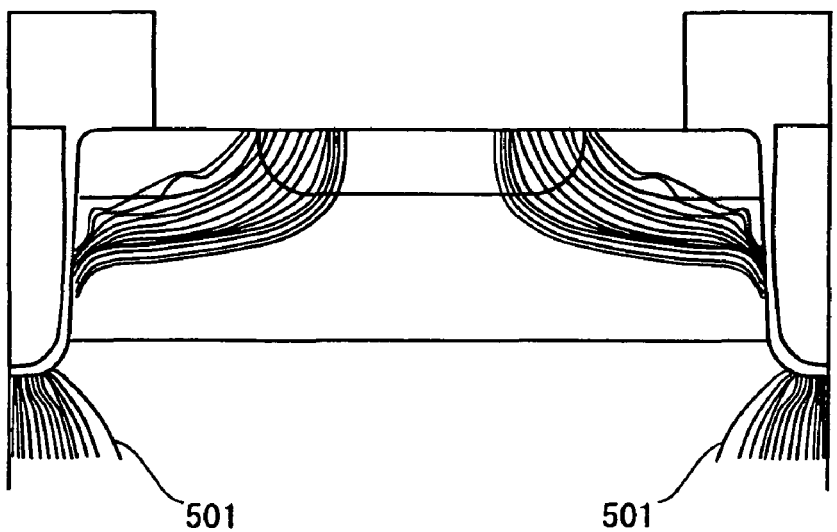

FIGS. 27A and 27B illustrate simulation results at a semiconductor apparatus breakdown without the second P+ type diffusion layer 106. As shown in FIG. 27A, in this case, only a P+ type diffusion layer 905 is formed in a surface of the P type base diffusion layer 903. If a counter-electromotive voltage is applied to the semiconductor apparatus to generate an avalanche current, avalanche currents are concentrated to flow near a gate oxide film 911, as indicated by 501 in FIG. 27B. Accordingly if the semiconductor apparatus shown in FIG. 2 does not have the second P+ type diffusion layer 106, a gate oxide film is fragile to heat at a breakdown, and the semiconductor apparatus can be easily destroyed.

Figure 28A:
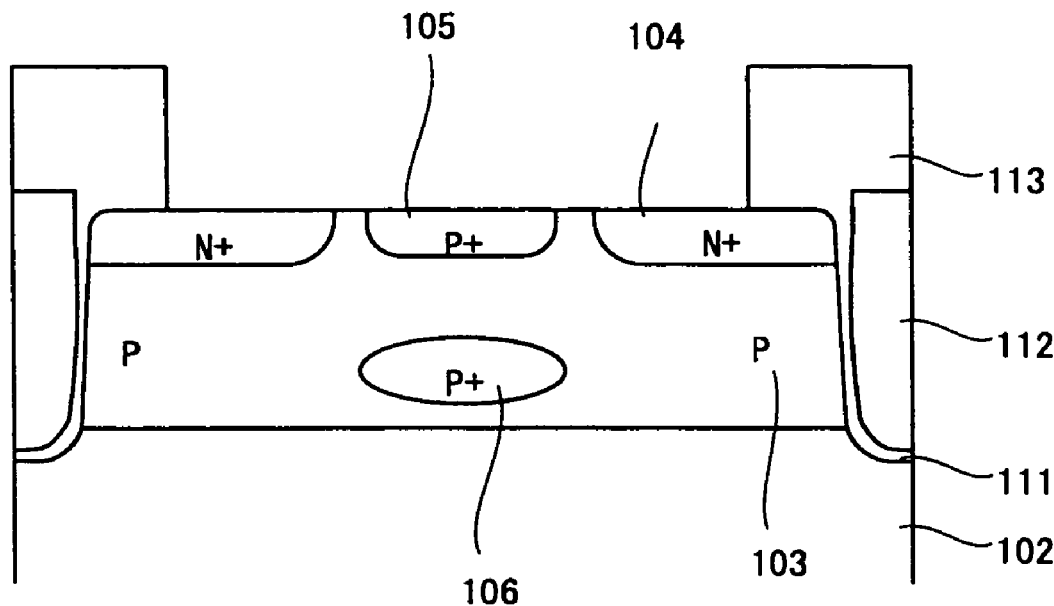
FIGS. 28A and 28B are cross-sectional diagrams showing a simulation result at a breakdown of a semiconductor apparatus according to the present invention.
Figure 28B:
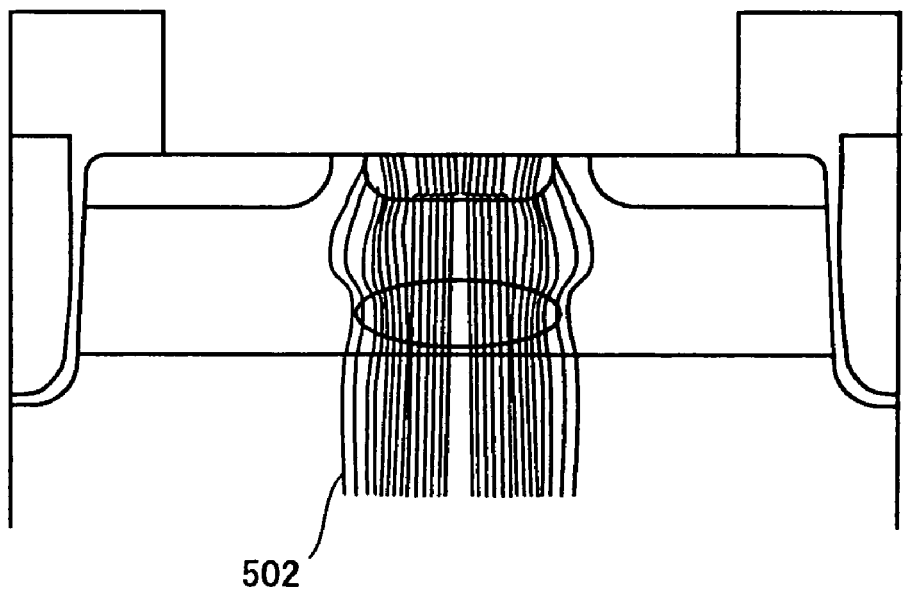

FIGS. 28A and 28B show simulation results at a breakdown in the semiconductor apparatus of this embodiment. As shown in FIG. 28A, the semiconductor apparatus of this embodiment includes the first P+ type diffusion layer 105 and the second P+ type diffusion layer 106 as with FIG. 2. If a counter-electromotive voltage is applied to the semiconductor apparatus to generate an avalanche current, the avalanche current flows through the second P+ type diffusion layer 104 as indicated by 502 in FIG. 28B. Accordingly in the embodiment of this embodiment, current does not flow near a gate oxide film 111, leading a gate oxide film to strong against destruction at a breakdown, and the semiconductor apparatus is not be destroyed easily.

Figure 29A:
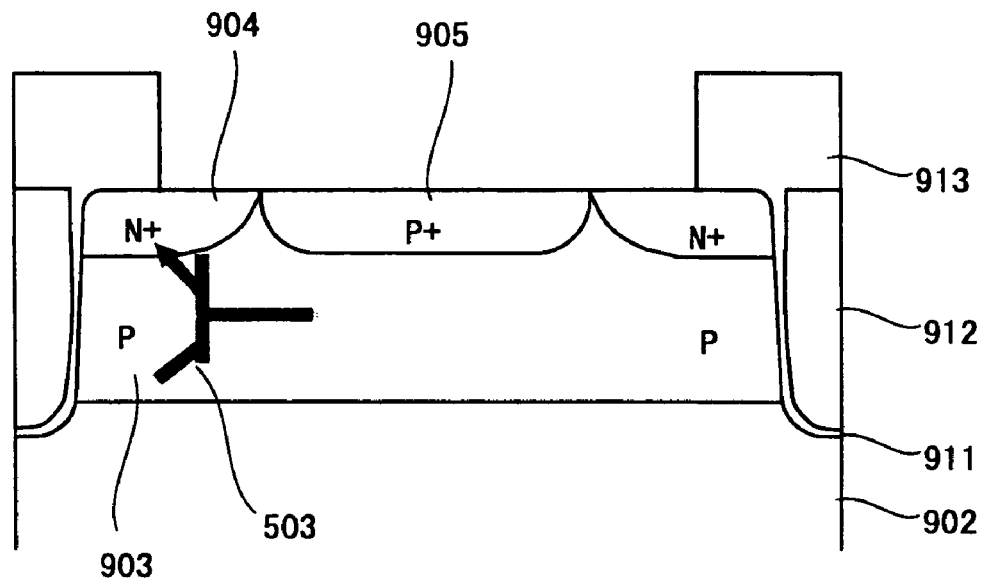
FIGS. 29A and 29B are cross-sectional diagrams showing a simulation result of a leakage current in a semiconductor apparatus without a second P+ type diffusion layer according to the present invention.
Figure 29B:
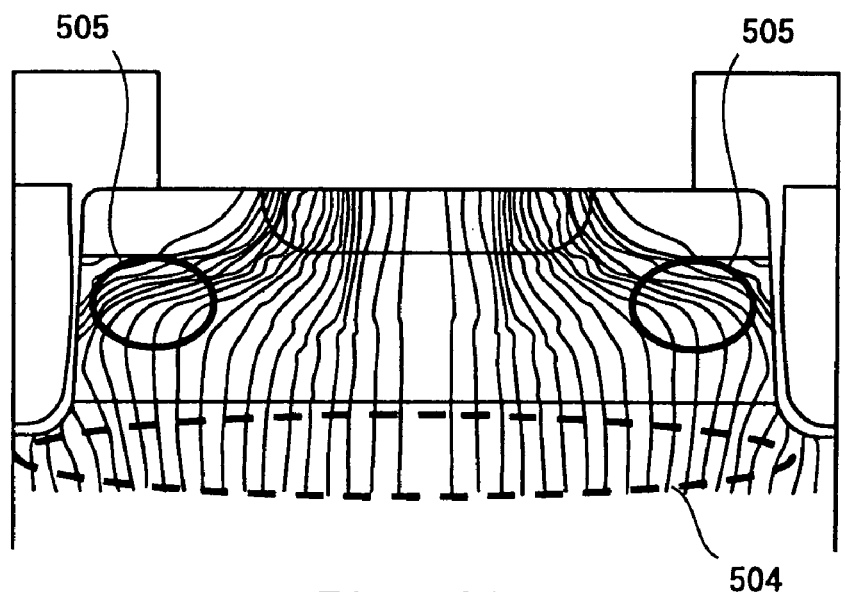

FIGS. 29A and 29B show simulation results of a leakage current in a semiconductor apparatus without the second P+ type diffusion layer 106. As shown in FIG. 29A, only a P+ type diffusion layer 905 is formed on the P type base diffusion layer 903 in this semiconductor apparatus. A parasitic bipolar transistor 503 is parasitized near a gate electrode 912 in the P type base diffusion layer 903. A simulation of the leakage current in the semiconductor apparatus in this case is indicated by 504 in FIG. 29B, where leak currents flow from an entire surface of the N type epitaxial layer 902 to the P+ type diffusion layer 905 formed in the surface of the P type base diffusion layer 903. Density of the lines indicating the leak current 503 corresponds to a current value. The density is higher and current is larger in a region under the N type source diffusion layer 904, as indicated by 505. Therefore, if a base resistance of the parasitic bipolar transistor 503 is large and the leak currents 504 keep flowing, the parasitic bipolar transistor 503 is easy to be operated. Accordingly a junction between the gate oxide film 911, the P type base diffusion layer 903, and the N type epitaxial layer 902 are easy to be destroyed due to heat, meaning that the semiconductor apparatus is fragile.

Figure 30A:
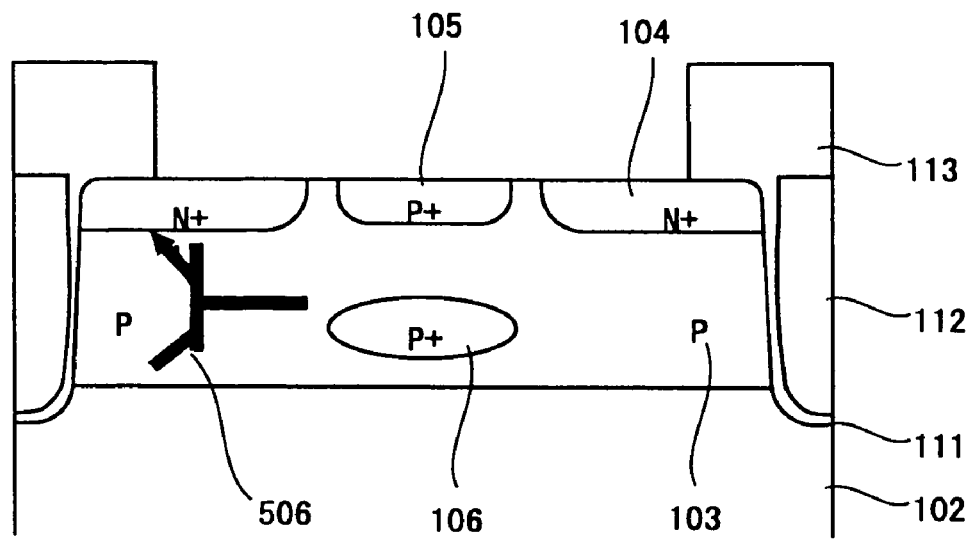
FIGS. 30A and 30B are cross-sectional diagrams showing a simulation result of a leakage current in a semiconductor apparatus according to the present invention.
Figure 30B:
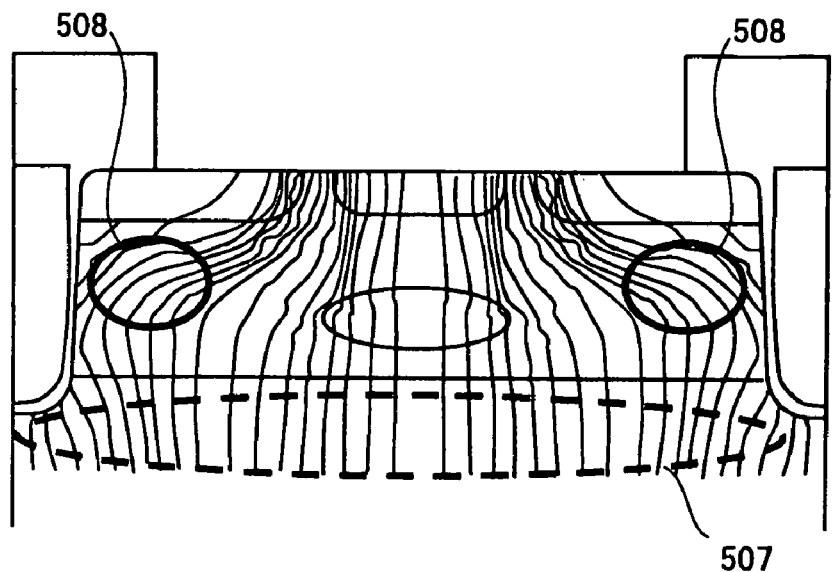

FIGS. 30A and 30B show simulation results of leakage current in the semiconductor apparatus of this embodiment. As shown in FIG. 30A, the semiconductor apparatus of this embodiment includes the first P+ type diffusion layer 105 and the second P+ diffusion layer 106 as with FIG. 2. A parasitic bipolar transistor 506 is parasitized near the gate electrode 112 in the P type base diffusion layer 103. A simulation of leakage current in this semiconductor apparatus is indicated by 507 in FIG. 30B, where leakage currents flow from an entire surface of the N− type epitaxial layer 102 to the P+ type diffusion layer 105 formed in the surface of the P type base diffusion layer 103. Density of the lines indicating the leak current 507 corresponds to a current value. The density is lower and current is smaller in a region under the N type source diffusion layer 104, as indicated by 508. Therefore, if a base resistance of the parasitic bipolar transistor 506 is small and the leak currents 507 keep flowing, it is difficult for the parasitic bipolar transistor 506 to operate. Accordingly a junction between the gate oxide film 111, the P type base diffusion layer 103, and the N− type epitaxial layer 102 are hard to be destroyed by heat, meaning that the semiconductor apparatus is hard to be destroyed.

In the above example, an example is explained where the first P+ type diffusion layer 105 and the second P+ type diffusion layer 106 have the same width. However the width, thickness, and shapes are not restricted to this but may be different. If the first P+ type diffusion layer 105 is narrower than the second P+ type diffusion layer 106, a part of the second P+ type diffusion layer 106 resides straight below the first P+ type diffusion layer 105. If the second P+ type diffusion layer 106 is narrower than the first P+ type diffusion layer 105, a part of the second P+ type diffusion layer 106 resides straight below the first P+ type diffusion layer 105. As long as the first P+ type diffusion layer 105 overlaps the second P+ type diffusion layer 106 even over a part of the diffusion layers, an identical effect can be obtained with different width, thickness, and shape.

Figure 5A:
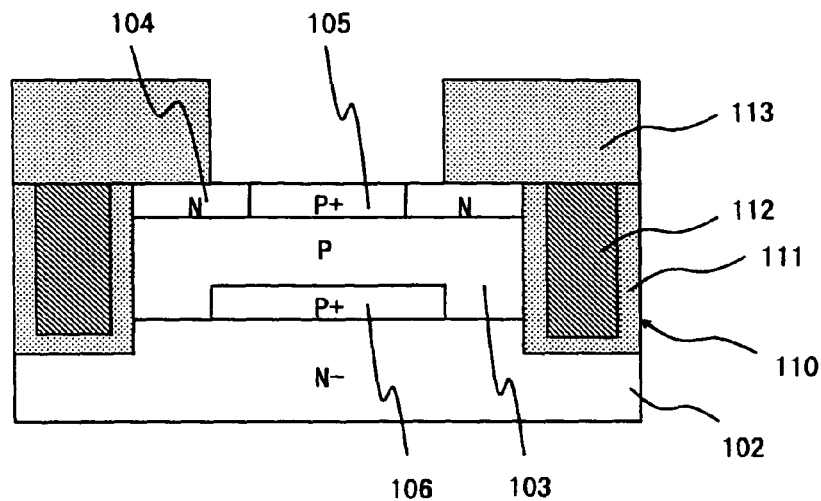
FIGS. 5A to 5C are cross-sectional diagrams showing a configuration of a semiconductor apparatus according to the present invention.
Figure 5B:
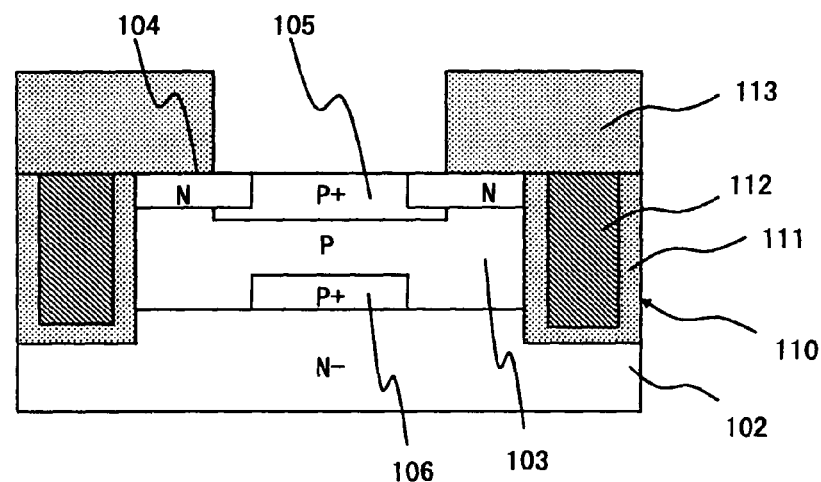
Figure 5C:
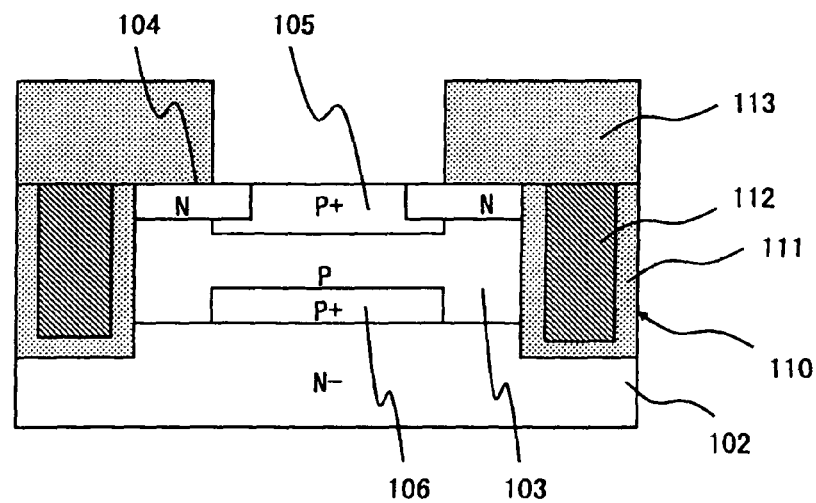

FIG. 5A is an example where the second P+ type diffusion layer 106 is wider than the first P+ type diffusion layer 105. FIG. 5B is an example where the first P+ type diffusion layer 105 is wider than the second P+ type diffusion layer 106. FIG. 5C is an example where both of the first P+ type diffusion layer 105 and the second P+ type diffusion layer 106 are wider than FIG. 2. If the first P+ type diffusion layer 105 or the second P+ type diffusion layer 106 is large, it can be formed by implanting ion from a contact hole, for example. To be specific, an end of the P+ type diffusion layer in this case is positioned to a contact hole of the N type source diffusion layer 104 or a side of the interlayer dielectric 113.

Figure 25:
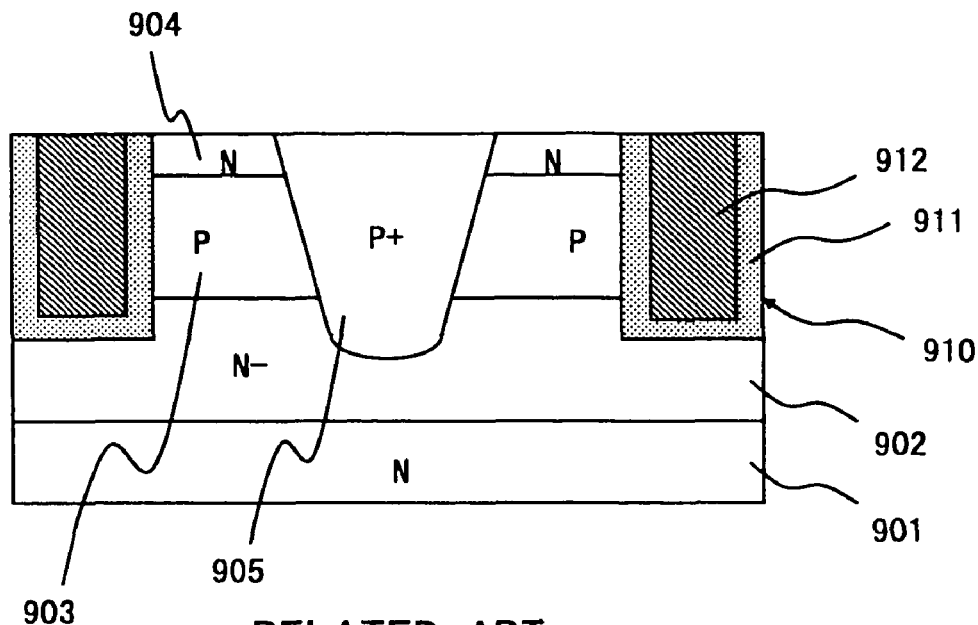
FIG. 25 is a cross-sectional diagram showing a configuration of a semiconductor apparatus according to a conventional technique.
Figure 26:
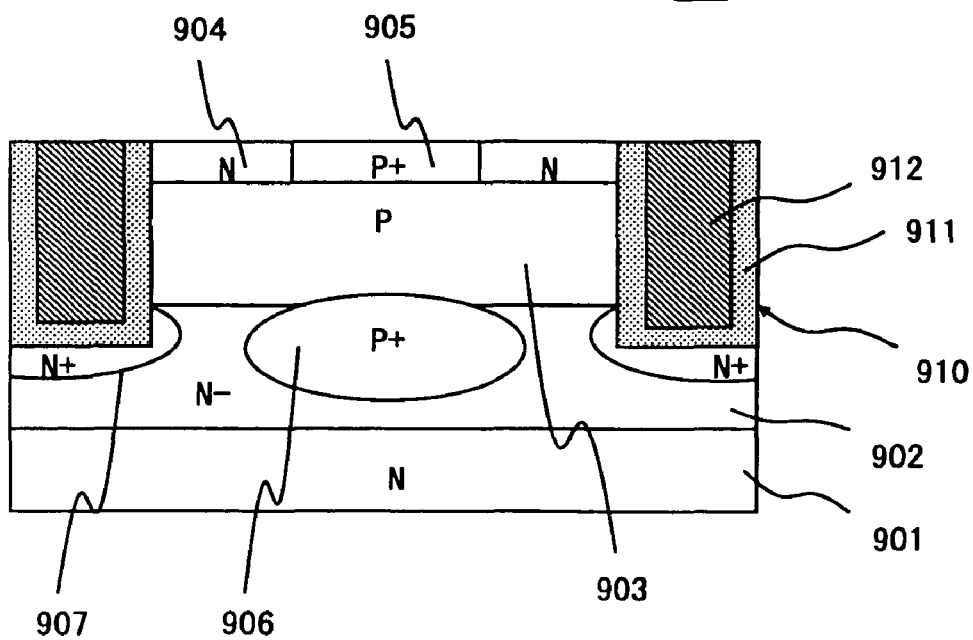
FIG. 26 is a cross-sectional diagram showing a configuration of a semiconductor apparatus according to a conventional technique.

As described in the foregoing, this embodiment includes P+ type diffusion layers formed to an upper and a bottom parts of a P type base diffusion layer, separated from each other. This helps improve destruction pressure because a breakdown current flows away near parasitic bipolar transistor. Especially with a plurality of P+ type diffusion layers provided inside the P type base diffusion layer, N+ type diffusion layer is not required at the bottom of a trench as opposed to a conventional technique shown in FIG. 26. Furthermore by a high energy implantation to form the P type diffusion layers separated from each other, other diffusion layers can be formed shallower than a conventional technique because an intensive thermal treatment as in a conventional technique shown in FIG. 25 is not necessary. Therefore, both a low ON-resistance and a high destruction resistance can be achieved with a simple configuration.

Second Embodiment

A semiconductor apparatus of a second embodiment is described hereinafter in detail. The semiconductor apparatus of this embodiment is a trench gate MOSFET formed by rectangular cells. A trench gate MOSFET includes a first P+ type diffusion layer in an upper part of the P type base diffusion layer, and a second P+ type diffusion layer formed in the middle in vertical direction in the P type base diffusion layer.

Figure 6:
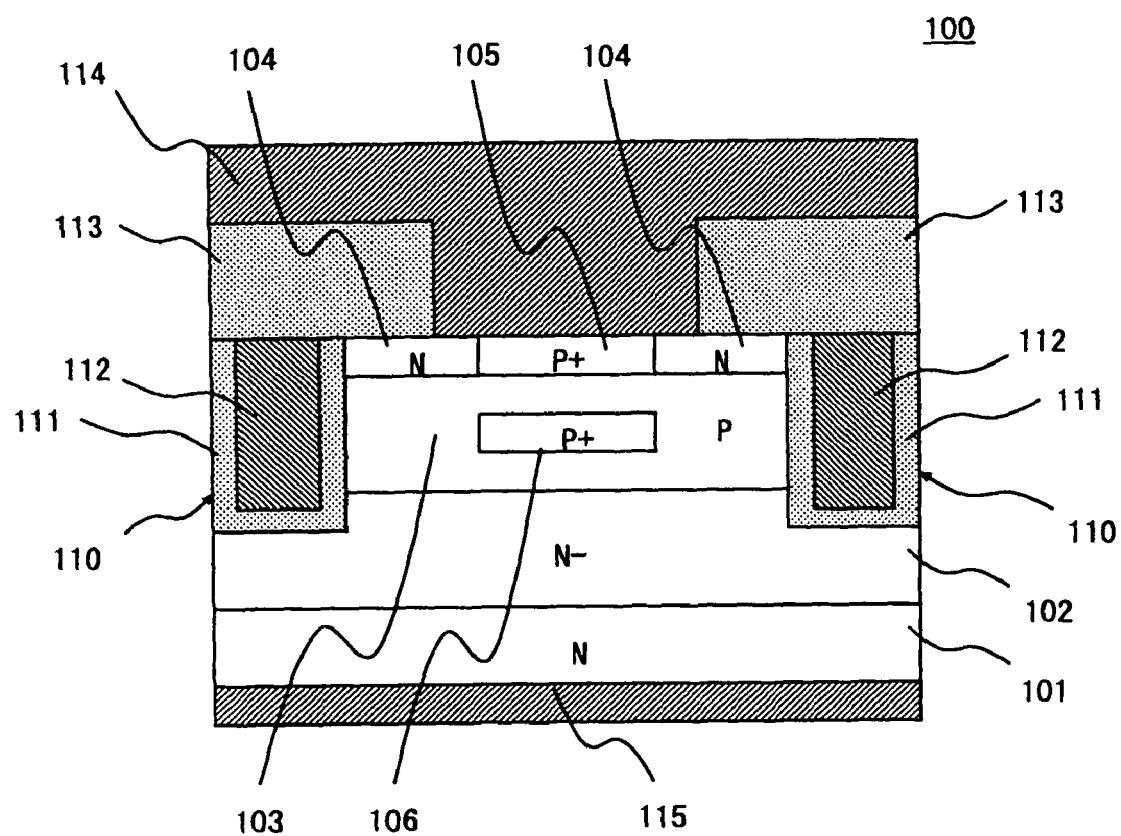
FIG. 6 is a cross-sectional diagram showing a configuration of a semiconductor apparatus according to the present invention.

A configuration of the semiconductor apparatus of this embodiment is described hereinafter in detail with reference to FIG. 6. A plan view of a semiconductor apparatus 100 is the same as FIG. 1. FIG. 6 is a cross-sectional diagram taken along the line A-A of FIG. 1. In FIG. 6, components identical to those in FIG. 2 are denoted by reference numerals identical to those therein.

In this embodiment, as compared to the first embodiment, a position where the second P+ type diffusion layer 106 is different. In this example, the second P+ type diffusion layer 106 is formed at almost the middle position in vertical direction in the P type base diffusion layer 103. The position where the second P+ type diffusion layer 106 is anywhere inside the P type base diffusion layer 103 and separated from the first P+ type diffusion layer 105. In this example, the first P+ type diffusion layer 105 had almost the same width as the second P+ type diffusion layer 106.

A method of manufacturing the semiconductor apparatus of the second embodiment is similar to FIG. 3. The second P+ type diffusion layer 106 is formed almost at the middle position in vertical direction in the P type base diffusion layer 103 by reducing an energy amount for ion implantation than the first embodiment at FIG. 3C. For example implant ion to the first P+ type diffusion layer 105 by a low energy of approximately 30 keV, and implant ion to the second P+ type diffusion layer 106 by the middle energy of approximately 200 keV. Then perform a thermal treatment to form the first P+ type diffusion layer 105 and the second P+ type diffusion layer 106.

In this embodiment, by locating the second P+ type diffusion layer 106 lower than the first P+ type diffusion layer 105, it is possible to further reduce a base resistance of parasitic bipolar transistor that is parasitized as in FIG. 4B. For example if a large current keeps flowing after breakdown, secondary breakdown may be generated and the parasitic bipolar transistor will operate in this condition. However in this embodiment, because of a low base resistance, a potential difference between an emitter and a collector of the parasitic bipolar transistor is small, accordingly no large current flows to the parasitic bipolar transistor. Therefore, reducing the base resistance of the parasitic bipolar transistor improves destruction resistance against secondary breakdown.

Furthermore in this embodiment, an identical effect can be achieved if the first P+ type diffusion layer 105 and the second P+ type diffusion layer 106 have different widths, as with the first embodiment.

Figure 7A:
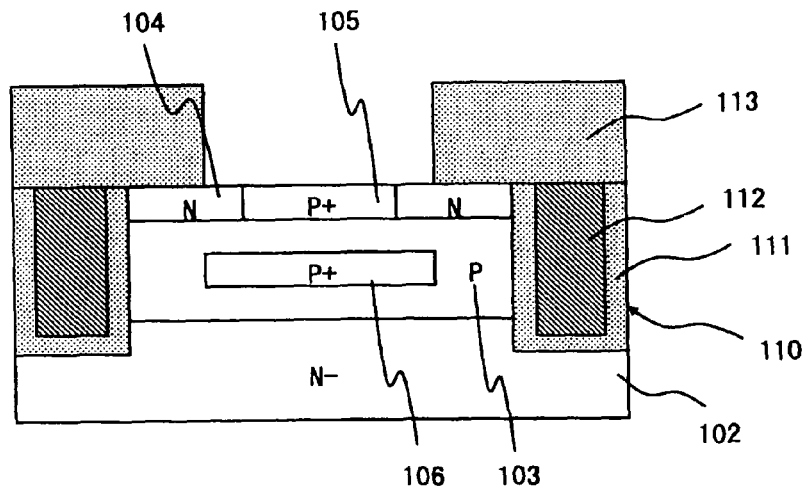
FIGS. 7A to 7C are cross-sectional diagrams showing a configuration of a semiconductor apparatus according to the present invention.
Figure 7B:
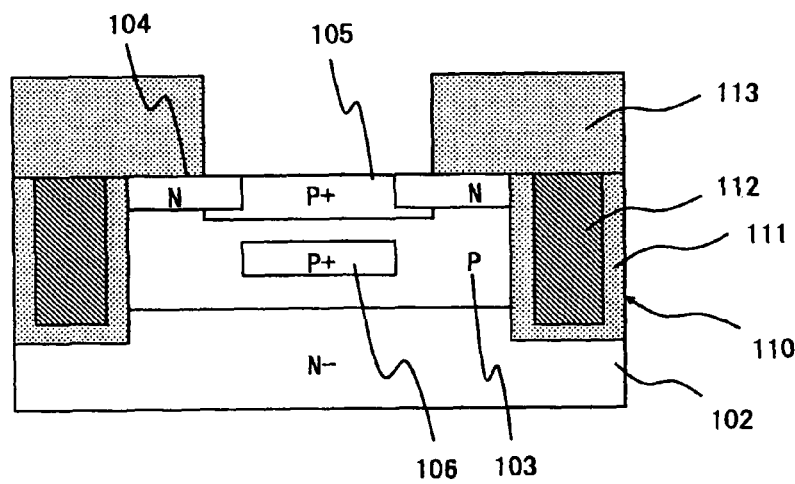
Figure 7C:
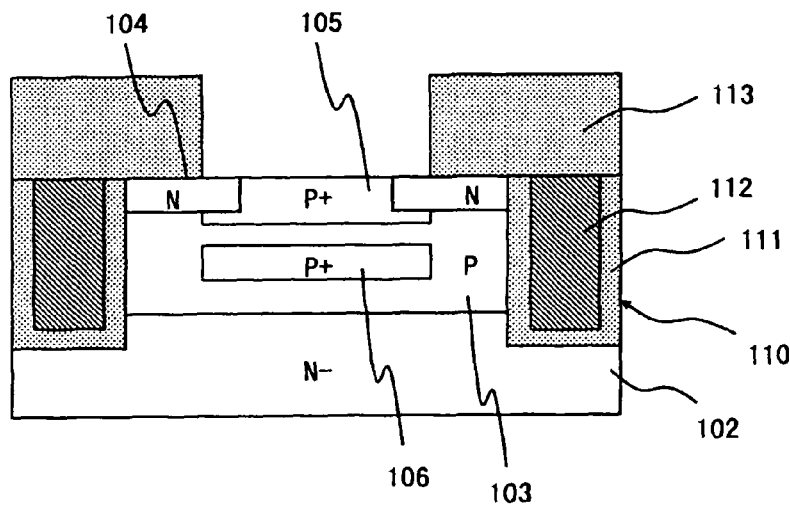

FIG. 7A is an example where the second P+ type diffusion layer 106 is wider than the first P+ type diffusion layer 105. FIG. 7B is an example where the first P+ type diffusion layer 105 is wider than the second P+ type diffusion layer 106. FIG. 7C is an example where both of the first P+ type diffusion layer 105 and the second P+ type diffusion layer 106 are wider than FIG. 6. In this case, the first P+ type diffusion layer 105 or the second P+ type diffusion layer 106 having wider width can be formed by implanting ion from a contact hole.

As described in the foregoing, in this embodiment, P+ type diffusion layers are formed in an upper part of the P type base diffusion layer and in the middle in vertical direction in the P type base diffusion layer, separated from each other. This achieves an improvement in destruction resistance and a reduction in manufacturing cost as with the first embodiment. It also reduces a base resistance of parasitic bipolar transistor, thereby improving destruction resistance against secondary breakdown.

Third Embodiment

A semiconductor apparatus of a third embodiment is described hereinafter in detail. The semiconductor apparatus of this embodiment is a trench gate type MOSFET formed by rectangular cells. The trench gate MOSFET includes a first P+ type diffusion layer in an upper part of the P type base diffusion layer, a second P+ type diffusion layer in the middle in vertical direction in the P type base diffusion layer, and a third P+ type diffusion layer in a lower part of the P type base diffusion layer.

Figure 8:
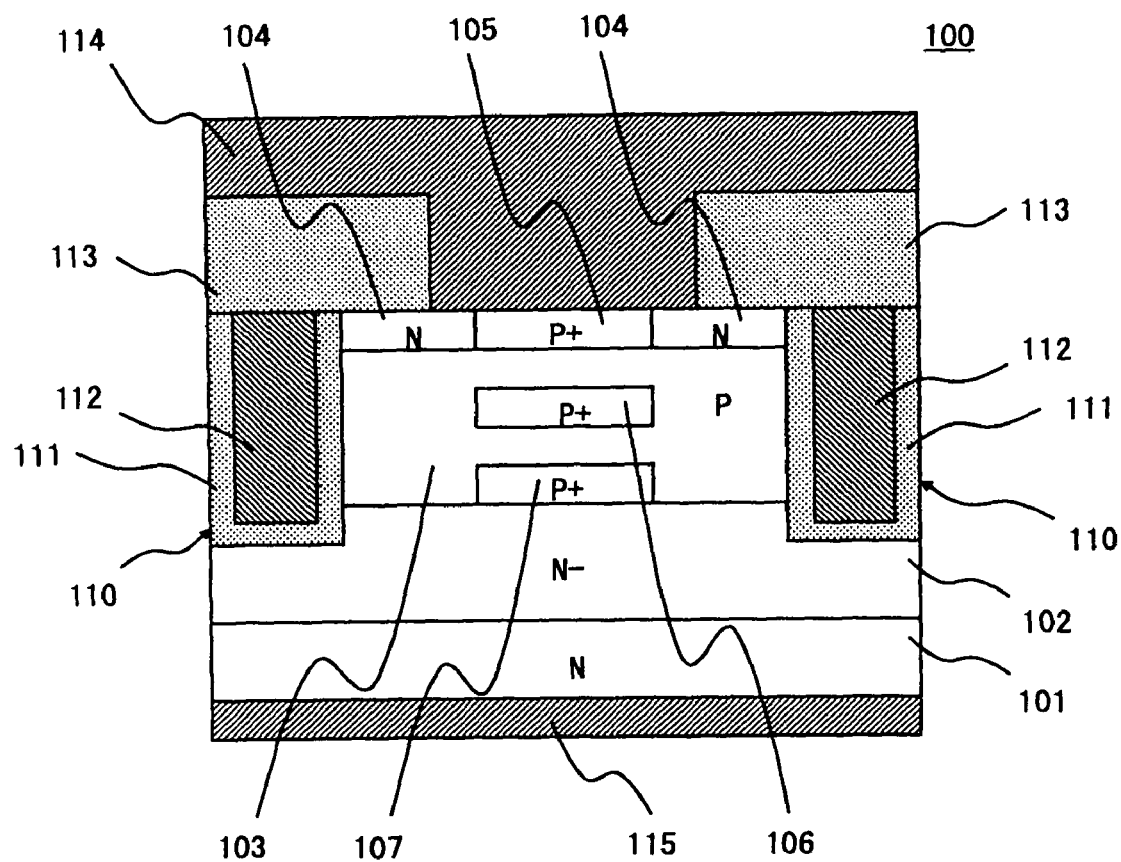
FIG. 8 is a cross-sectional diagram showing a configuration of a semiconductor apparatus according to the present invention.

A configuration of a semiconductor apparatus of this embodiment is described hereinafter in detail with reference to FIG. 8. A plan view of a semiconductor apparatus 100 is identical to FIG. 1. FIG. 8 is a cross-sectional diagram taken along the line A-A of FIG. 1. In FIG. 8, components identical to those in FIG. 1 are denoted by reference numerals identical to those therein.

In this embodiment, a third P+ type diffusion layer 107 is provided in addition to the configurations of the first and the second embodiments. This embodiment is an example of mounting both the second P+ type diffusion layer 106 of the first embodiment and the second P+ type diffusion layer 106 of the second embodiment. In this example, the second P+ type diffusion layer 106 is formed in almost middle position in vertical direction in the P type base diffusion layer 103. The third P+ type diffusion layer 107 is formed at the bottom of the P type base diffusion layer 103. In this example, widths of the first P+ type diffusion layer 105, the second P+ type diffusion layer 106, and the third P+ type diffusion layer 107 are almost the same.

A manufacturing method is similar to FIGS. 3A to 3D. For example at FIG. 3C, the second P+ type diffusion layer 106 is formed in almost an middle position in vertical direction in the P type base diffusion layer 103 by having the same amount of energy for ion implantation with the first and the second embodiments so as to form the third P+ type diffusion layer 107 at the bottom of the P type base diffusion layer 103. For example ion is implanted to the first P+ type diffusion layer 105 with a low energy of approximately 30 keV. For the second P+ type diffusion layer 106, implant ion with a middle energy of approximately 200 keV. Further, for the third P+ type diffusion layer 107, implant ion with a high energy of approximately 300 keV. After ion is implanted, perform a thermal treatment to form the first P+ type diffusion layer 105, the second P+ type diffusion layer 106, and the third P+ type diffusion layer 107.

In this embodiment, effects of the first and the second embodiments can be obtained by combining the first and the second embodiment, thereby further improving destruction resistance.

In this embodiment, as with the first and the second embodiments, the first P+ type diffusion layer 105, the second P+ type diffusion layer 106, and the third P+ type diffusion layer 107 are not restricted to have the same width but may have different widths. Even with the different widths, an identical effect can be achieved.

Figure 9A:
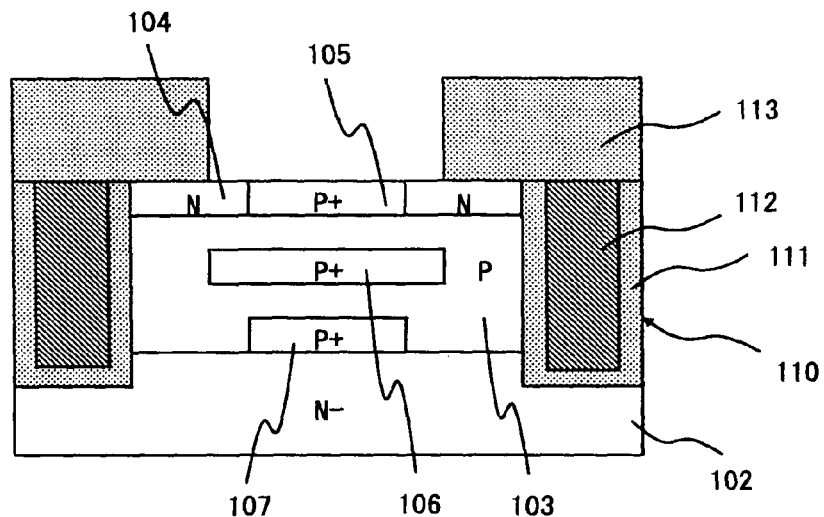
FIGS. 9A to 9D are cross-sectional diagrams showing a configuration of a semiconductor apparatus according to the present invention.
Figure 9B:
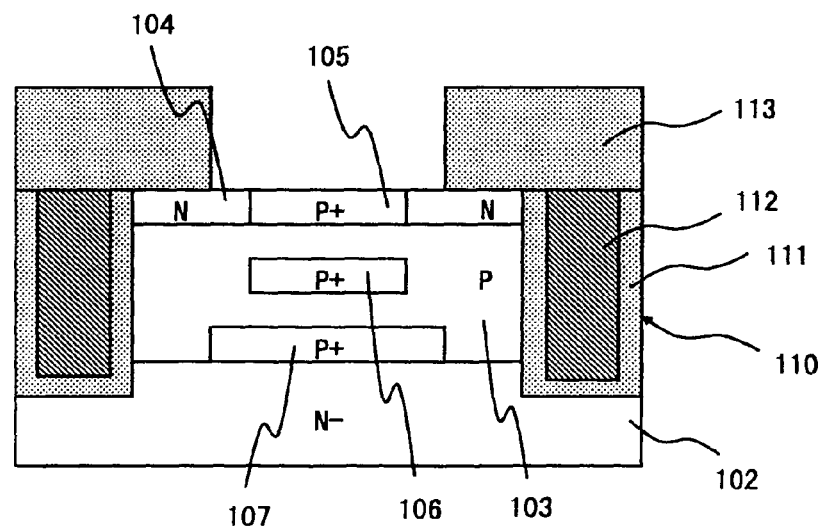
Figure 9C:
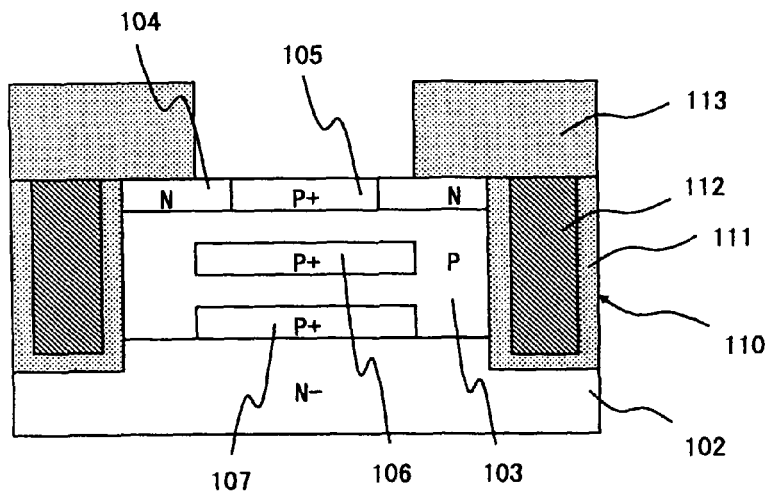
Figure 9D:
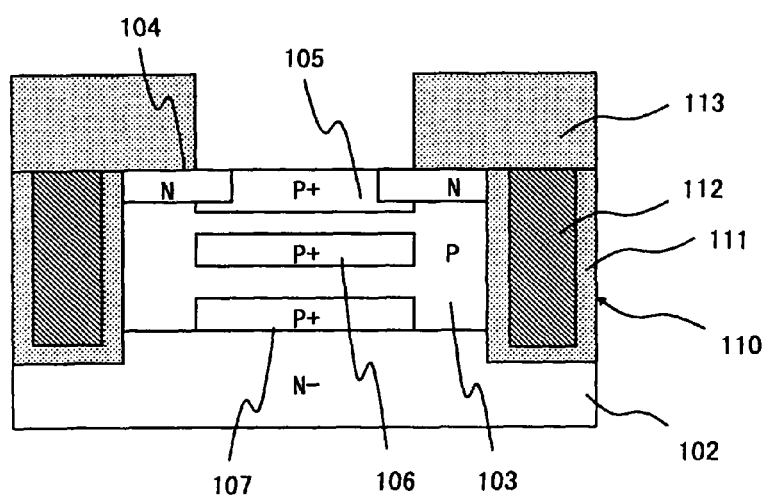

FIG. 9A is an example where the second P+ type diffusion layer 106 is wider than the first P+ type diffusion layer 105 and the third P+ type diffusion layer 107. FIG. 9B is an example where the third P+ type diffusion layer 107 is wider than the first P+ type diffusion layer 106 and the second P+ type diffusion layer 106. FIG. 9C is an example where the second P+ type diffusion layer 105 and the third P+ type diffusion layer 107 are wider than the first P+ type diffusion layer 106. FIG. 9D is an example where all of the first P+ type diffusion layer 105, the second P+ type diffusion layer 106, and the third P+ type diffusion layer 107 are wider than FIG. 8. In this example, the first P+ type diffusion layer 105, the second P+ type diffusion layer 106 or the third P+ type diffusion layer 107 having wider widths can be implanted with ion from a contact hole.

As described in the foregoing, in this embodiment, P+ type diffusion layers are formed in an upper part of the P type base diffusion layer, in the middle in vertical direction in the P type base diffusion layer, and in a lower part of the P type base diffusion layer, separated from each other. This facilitates a breakdown current to flow near the P+ type diffusion layer better than the first and the second embodiments. Moreover, base resistance of parasitic bipolar transistor can further be reduced. Accordingly it is possible to increase destruction resistance of avalanche operation and the parasitic bipolar transistor against secondary breakdown.

Fourth Embodiment

A semiconductor apparatus of this embodiment is a trench gate MOSFET of rectangular cell. The trench gate MOSFET includes a first P+ type diffusion layer in an upper part of the P type base diffusion layer, and a second P+ type diffusion layer in a lower part of the P type base diffusion layer.

Figure 10:
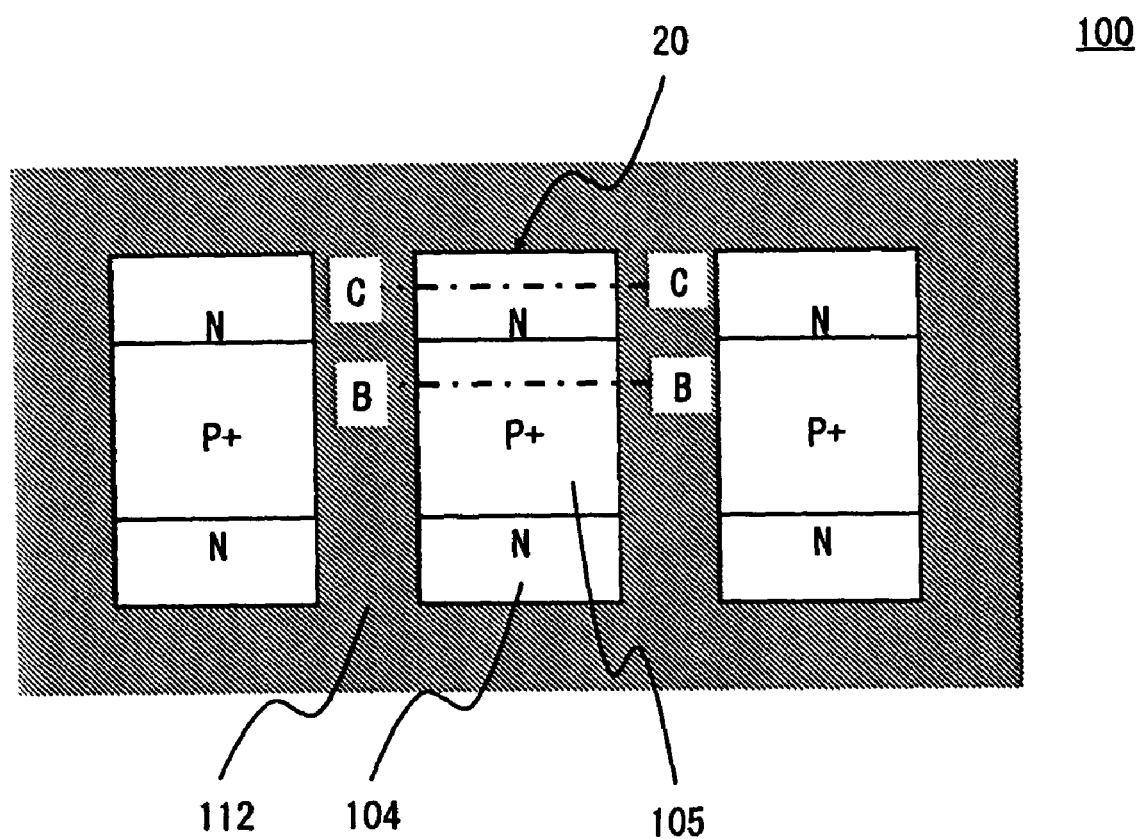
FIG. 10 is a plan view showing a configuration of a semiconductor apparatus according to the present invention.
Figure 11A:
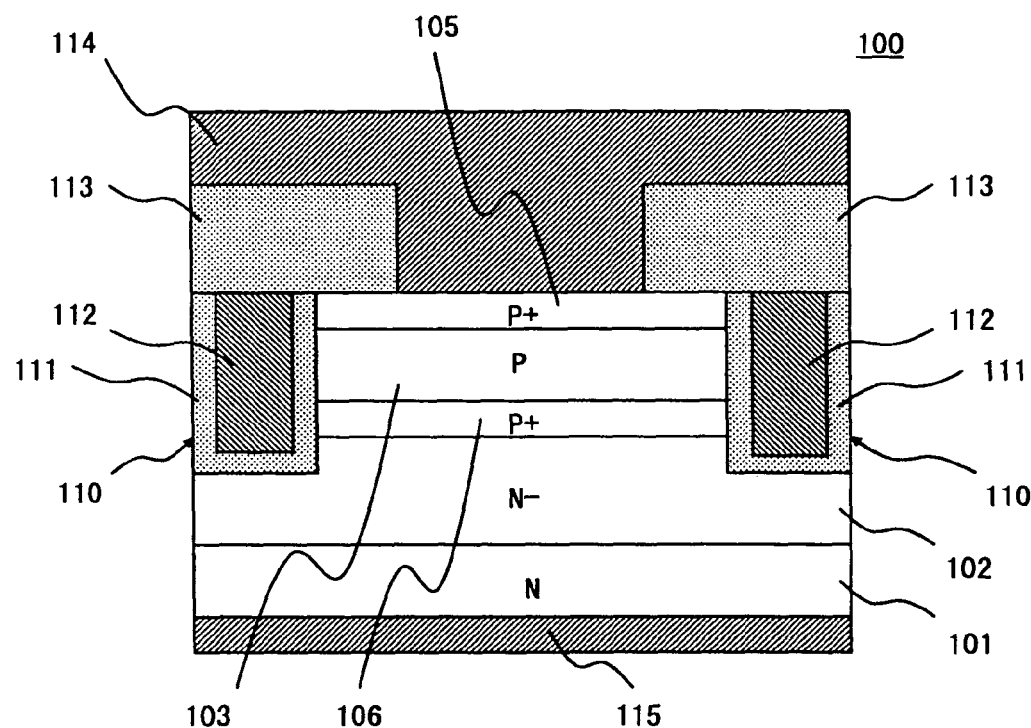
FIG. 11A is a cross-sectional diagram taken along the line B-B in FIG. 10 showing a configuration of a semiconductor apparatus according to the present invention.
Figure 11B:
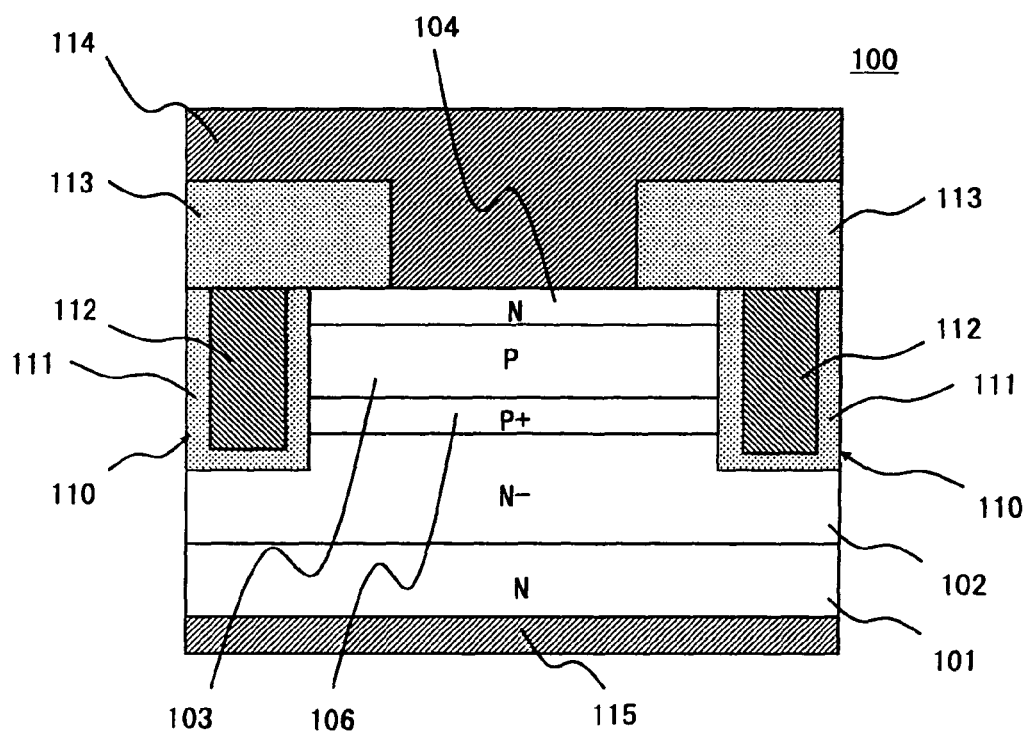
FIG. 11B is a cross-sectional diagram taken along the line C-C in FIG. 10 showing a configuration of a semiconductor apparatus according to the present invention.

A configuration of the semiconductor apparatus of this embodiment is described hereinafter in detail with reference to FIGS. 10 to 11B. A semiconductor apparatus 100 is an example of cells having different shapes as compared to the semiconductor apparatus of the first embodiment. FIG. 10 is a plan view of the semiconductor apparatus 100. FIG. 11A is a cross-sectional diagram taken along the line B-B of FIG. 10. FIG. 11B is a cross-sectional diagram taken along the line C-C of FIG. 10. In FIG. 10, the interlayer dielectric 113 and the source electrode are not shown. 114.

As shown in FIG. 10, the semiconductor apparatus 100 includes a plurality of rectangular unit cells 20. Each of the unit cell 20 is formed separated from each other. The N type source diffusion layer 104 and the P+ type diffusion layer 105 form the surface of each unit cell 20. The N type source diffusion layer 104 is formed to both ends of respective unit cells 20. The P+ type diffusion layer 105 is formed at the center part of the unit cell 20. Unlike FIG. 1, two N type source diffusion layers 104 are separated. Further, the gate electrode 112 is placed in a region between respective unit cells 20.

As shown in FIGS. 11A and 11B, cross-section configuration of the semiconductor apparatus 100 is basically the same as the first embodiment. In FIG. 11, components identical to those in FIG. 2 are denoted by reference numerals identical to those therein.

In a center part (cross section B-B of the unit cell 20), the first P+ type diffusion layer 105 is formed on an entire surface of the P type base diffusion layer 103, and the second P+ type diffusion layer 106 is formed on an entire surface of the bottom of the P type base diffusion layer 103. In the both ends of the unit cell 20 (cross section C-C of the unit cell 20), the N type source diffusion layer 104 is formed on an entire surface of the P type base diffusion layer 103, and the second P+ type diffusion layer 106 is formed on an entire surface of the bottom of the P type base diffusion layer 103. In this embodiment, the second P+ type diffusion layer 106 is wider than the first P+ type diffusion layer 105. The second P+ type diffusion layer 106 is formed to an entire surface of the bottom of the P+ type base diffusion layer 103.

A method of manufacturing is identical to the first embodiment thus an explanation is omitted. In this embodiment as with the first embodiment, the first P+ type diffusion layer 105 and the second P+ type diffusion layer 106 may have the same or different widths.

Figure 12A:
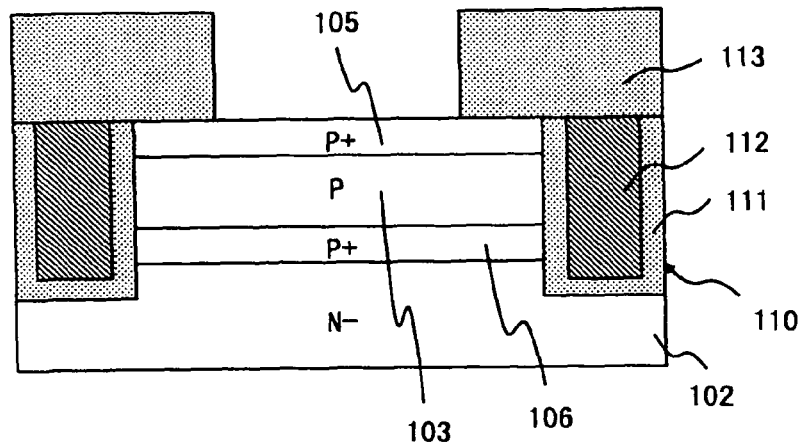
FIGS. 12A, 12C and 12E are cross-sectional diagrams taken along the line B-B in FIG. 10 showing a configuration of a semiconductor apparatus according to the present invention.
Figure 12B:
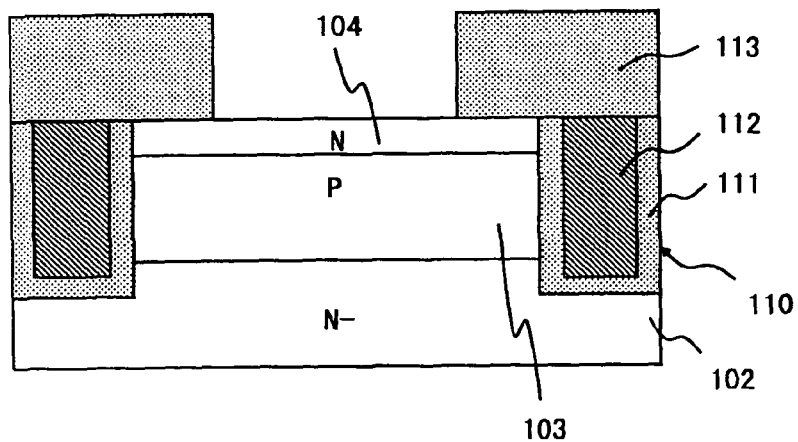
FIGS. 12B, 12D and 12F are cross-sectional diagrams taken along the line C-C in FIG. 10 showing a configuration of a semiconductor apparatus according to the present invention.

FIGS. 12A and 12B are examples where the first P+ type diffusion layer 105 has the same width as the second P+ type diffusion layer 106. The second P+ type diffusion layer 106 is formed below the first P+ type diffusion layer 105. The second P+ type diffusion layer 106 is not formed below the N type source diffusion layer 104.

Figure 12C:
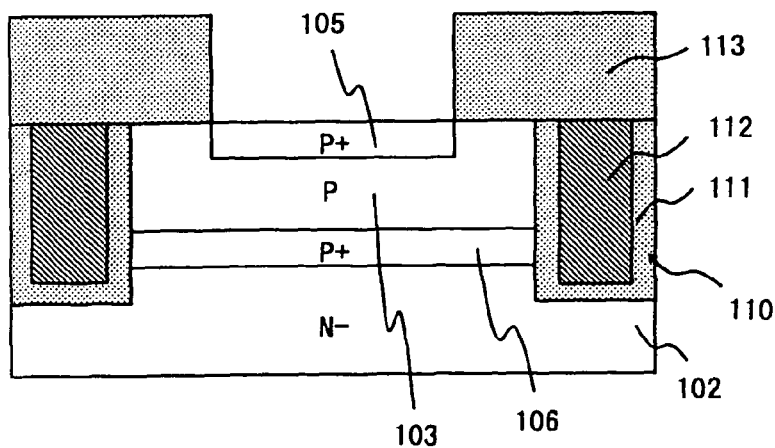
Figure 12D:
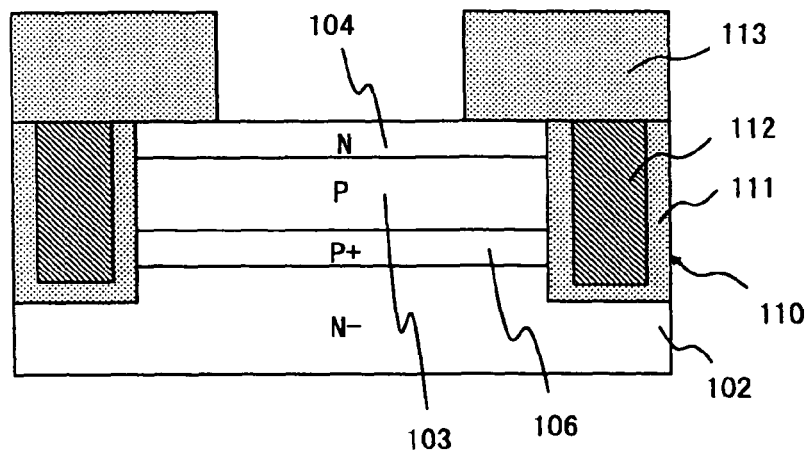
Figure 12E:
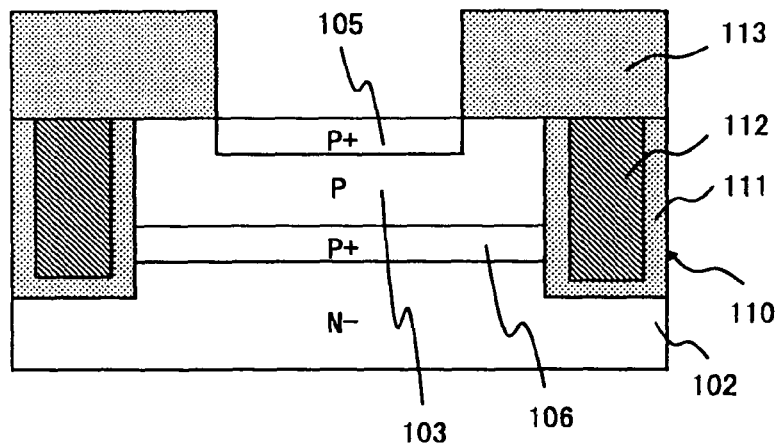
Figure 12F:
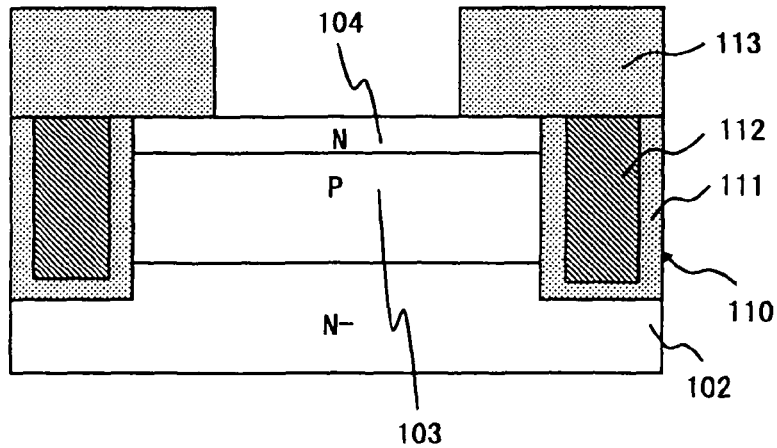
Figure 13A:
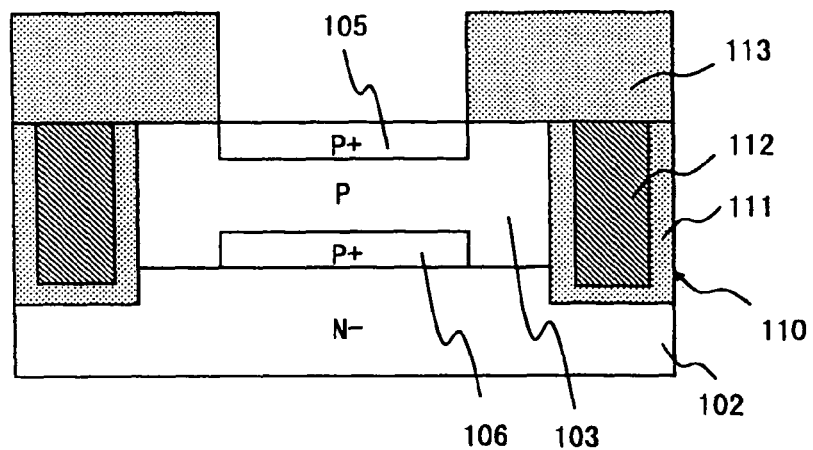
FIGS. 13A, 13C, 13E and 13G are cross-sectional diagrams taken along the line B-B in FIG. 10 showing a configuration of a semiconductor apparatus according to the present invention.
Figure 13B:
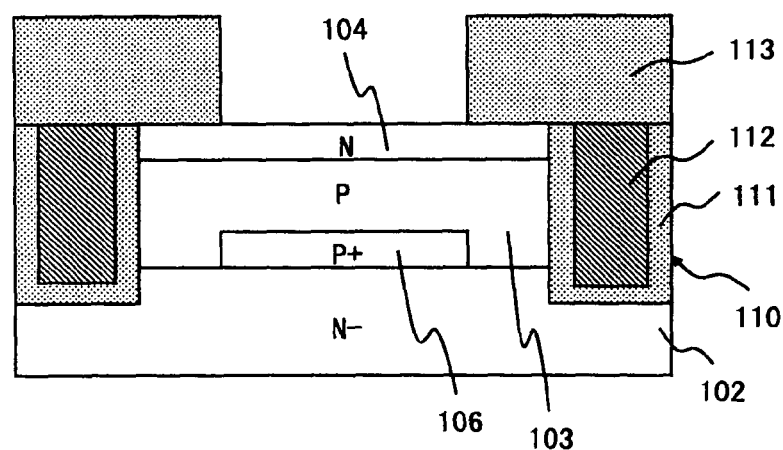
FIGS. 13B, 13D, 13F and 13H are cross-sectional diagrams taken along the line C-C in FIG. 10 showing a configuration of a semiconductor apparatus according to the present invention.
Figure 13C:
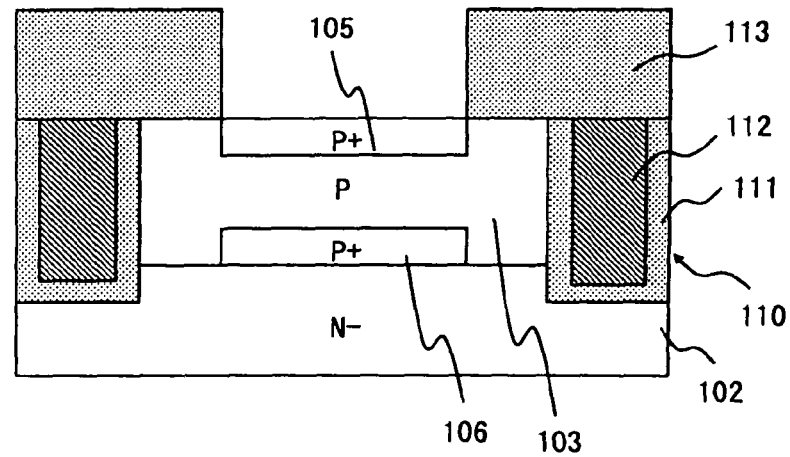
Figure 13D:
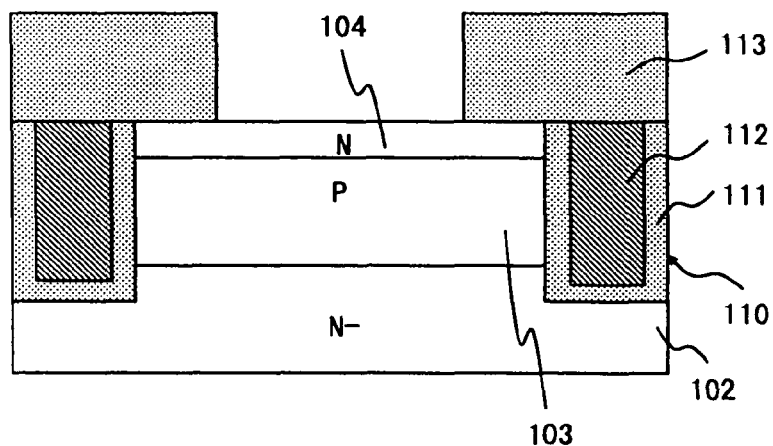
Figure 13E:
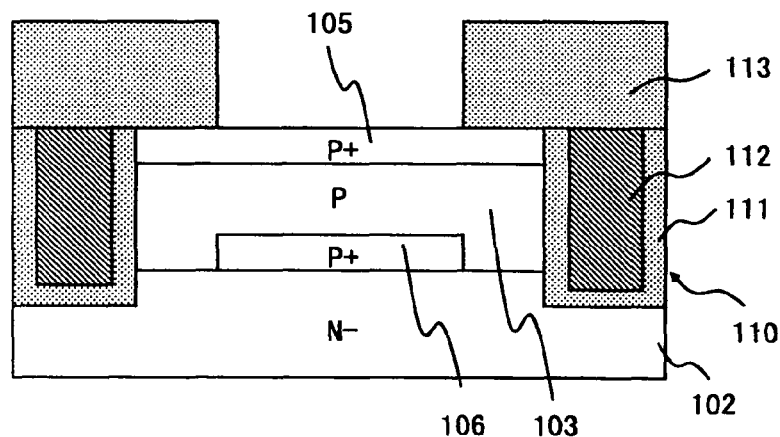
Figure 13F:
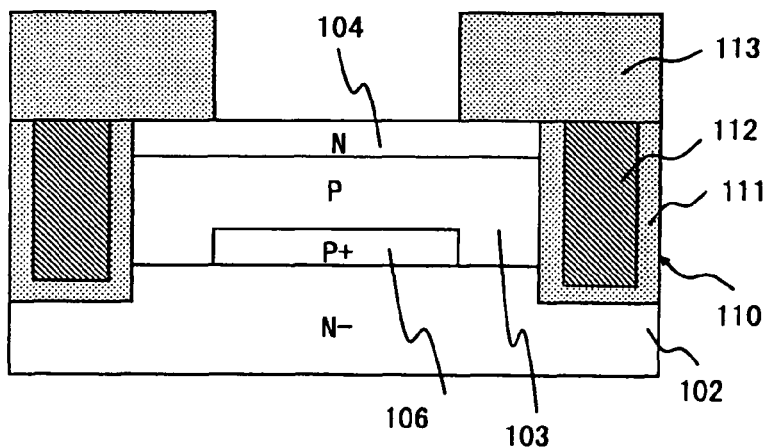
Figure 13G:
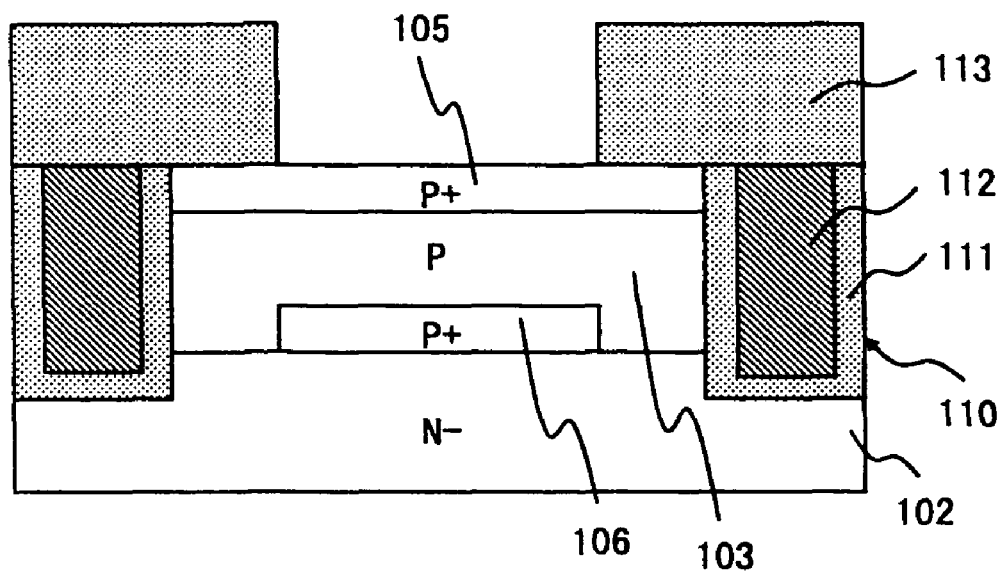
Figure 13H:
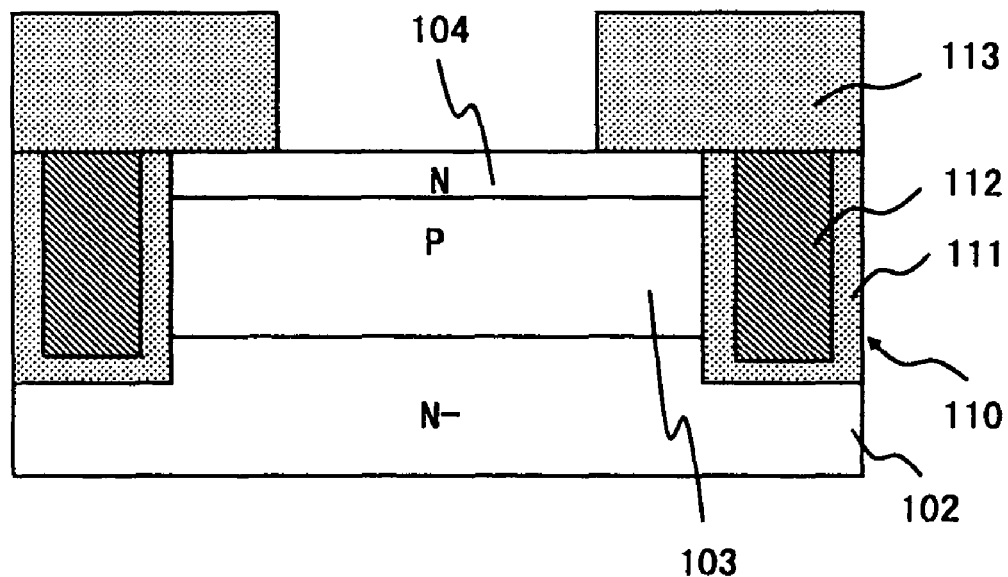

FIGS. 12C and 12D are examples where the first P+ type diffusion layer 105 is narrow having a similar configuration with FIGS. 11A and 11B. FIGS. 12E and 12F are examples where the first P+ type diffusion layer 105 is narrow having a similar configuration with the FIGS. 12A and 12B. FIGS. 13A and 13B are examples where both of the first P+ type diffusion layer 105 and the second P+ type diffusion layer 106 are narrow having a similar configuration with FIGS. 11A and 11B. FIGS. 13C and 13D are examples where both of the first P+ type diffusion layer 105 and the second P+ type diffusion layer 106 are narrow having a similar configuration with FIGS. 12A and 12B. FIGS. 13E and 13F are examples where the first P+ type diffusion layer 106 is narrow having a similar configuration with FIGS. 11A and 11B. FIGS. 13G and 13H are examples where the second P+ type diffusion layer 106 is narrow having a similar configuration with FIGS. 12A and 12B.

As described in the foregoing, in this embodiment of using rectangular cells, it is possible to improve destruction resistance and reduce manufacturing cost as with the first embodiment by forming P+ type diffusion layers in an upper part of the P type base diffusion layer and a lower part of the P type base diffusion layer.

Fifth Embodiment

A semiconductor apparatus of a fifth embodiment is described hereinafter in detail. A semiconductor apparatus of this embodiment is a trench gate MOSFET of rectangular cells. The trench gate MOSFET includes a first P+ type diffusion layer in an upper part of the P type base diffusion layer and a second P+ type diffusion layer in the middle in vertical direction in the P type base diffusion layer.

Figure 14A:
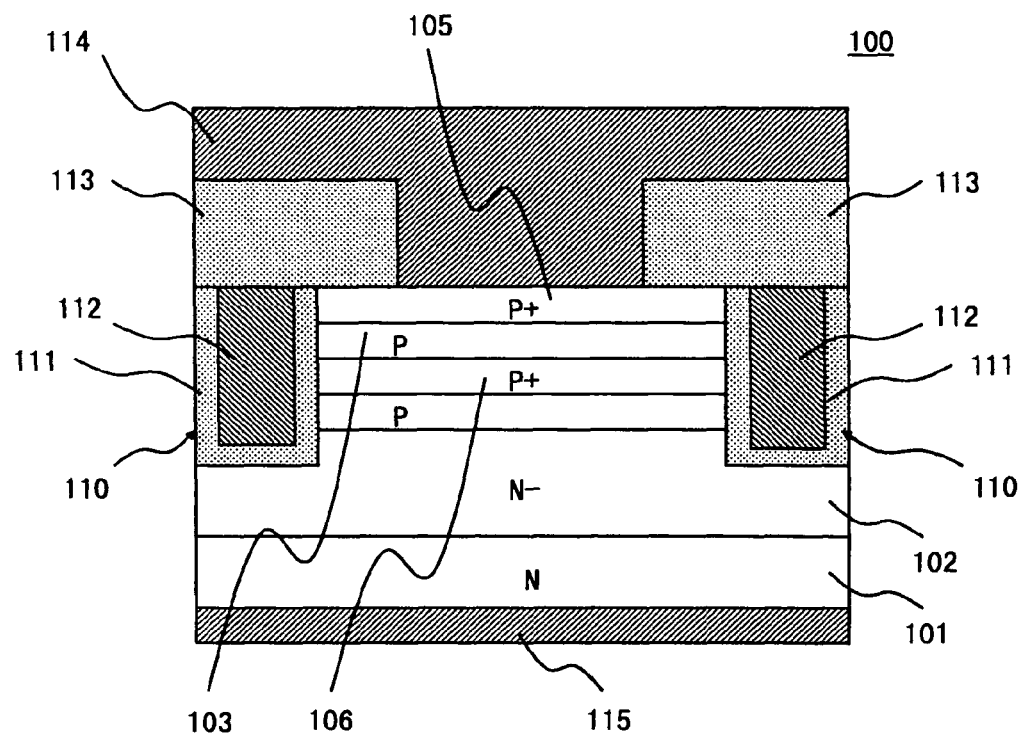
FIG. 14A is a cross-sectional diagram taken along the line B-B in FIG. 10 showing a configuration of a semiconductor apparatus according to the present invention.
Figure 14B:
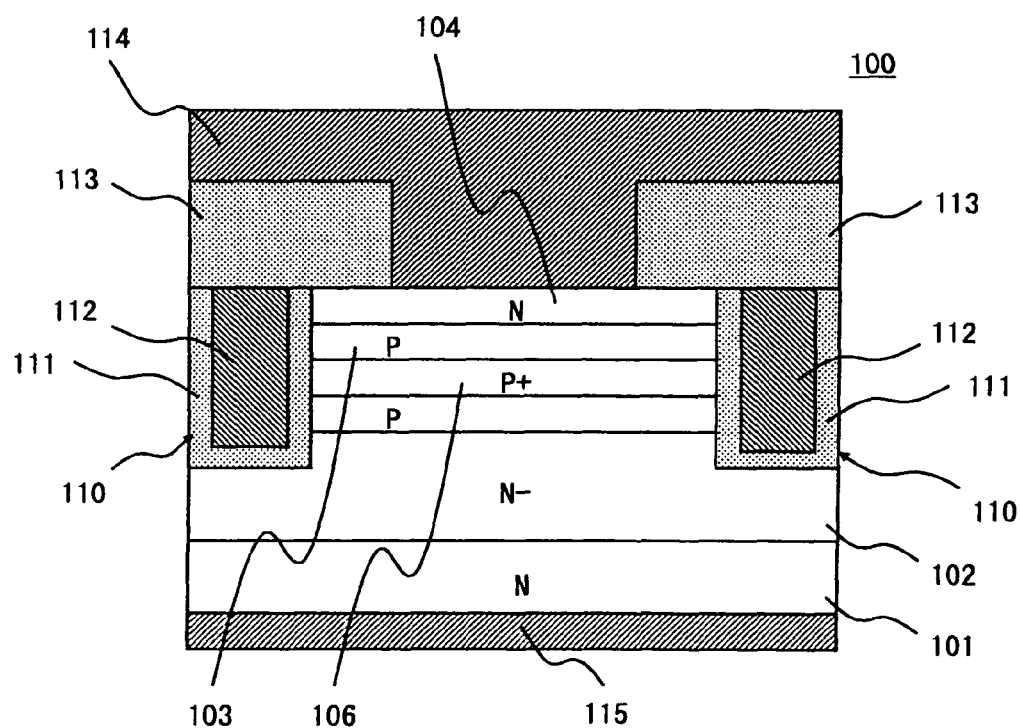
FIG. 14B is a cross-sectional diagram taken along the line C-C in FIG. 10 showing a configuration of a semiconductor apparatus according to the present invention.

A configuration of the semiconductor apparatus of this embodiment is described hereinafter with reference to FIGS. 14A and 14B. The semiconductor apparatus 100 is an example of cells having different shapes as compared to the semiconductor apparatus of the second embodiment. A plan view of the semiconductor apparatus 100 is identical to FIG. 10. FIG. 14A is a cross-sectional diagram taken along the line B-B of FIG. 10. FIG. 14B is a cross-sectional diagram taken along the line C-C of FIG. 10.

As shown in FIGS. 14A and 14B, a cross-section configuration of the semiconductor apparatus 100 is basically the same as the second embodiment. In FIGS. 14A and 14B, components identical to those in FIG. 6 are denoted by reference numerals identical to those therein.

In a center part (cross section B-B of the unit cell 20), the first P+ type diffusion layer 105 is formed on an entire surface of the P type base diffusion layer 103, and the second P+ type diffusion layer 106 is formed on an entire surface of approximately the middle part in vertical direction in the P type base diffusion layer 103. In the both ends of the unit cell 20 (cross section C-C of the unit cell 20), the N type source diffusion layer 104 is formed on an entire surface of the P type base diffusion layer 103, and the second P+ type diffusion layer 106 is formed on an entire surface of the middle part in vertical direction in the P type base diffusion layer 103. In this example, the second P+ type diffusion layer 106 is wider than the first P+ type diffusion layer 105, and the second P+ type diffusion layer 106 is formed on an entire surface of the bottom of the P+ type base diffusion layer 103.

A manufacturing method is identical to the second embodiment, thus an explanation is omitted. Furthermore in this embodiment, as with the second embodiment, the first P+ type diffusion layer 105 and the second P+ type diffusion layer 106 may be the same or different widths.

Figure 15A:
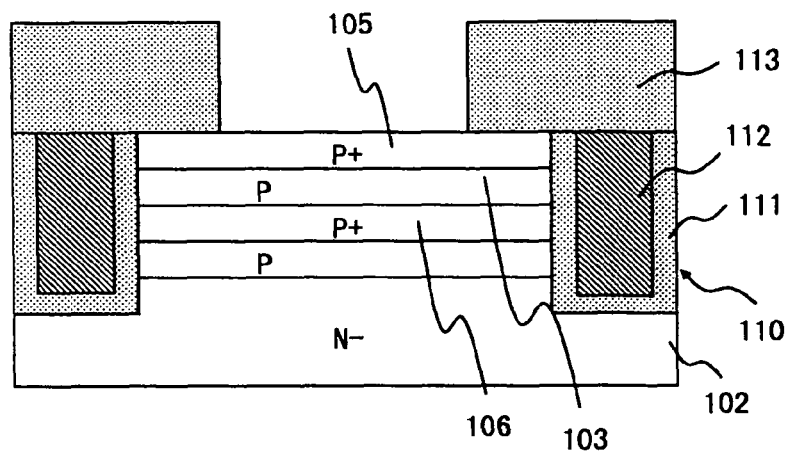
FIGS. 15A, 15C and 15E are cross-sectional diagrams taken along the line B-B in FIG. 10 showing a configuration of a semiconductor apparatus according to the present invention.
Figure 15B:
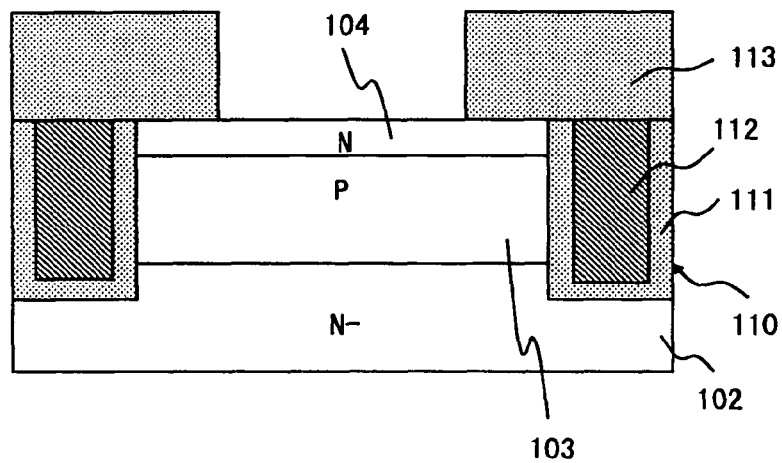
FIGS. 15B, 15D and 15F are cross-sectional diagrams taken along the line C-C in FIG. 10 showing a configuration of a semiconductor apparatus according to the present invention.

FIGS. 15A and 15B are examples where the first P+ type diffusion layer 105 and the second P+ type diffusion layer 106 have the same width. The second P+ type diffusion layer 106 is formed below the first P+ type diffusion layer 105. The second P+ type diffusion layer 106 is not formed below the N type source diffusion layer 104.

Figure 15C:
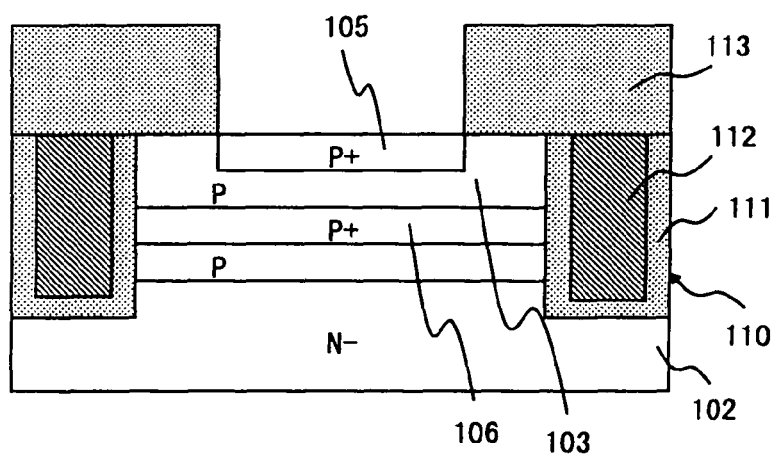
Figure 15D:
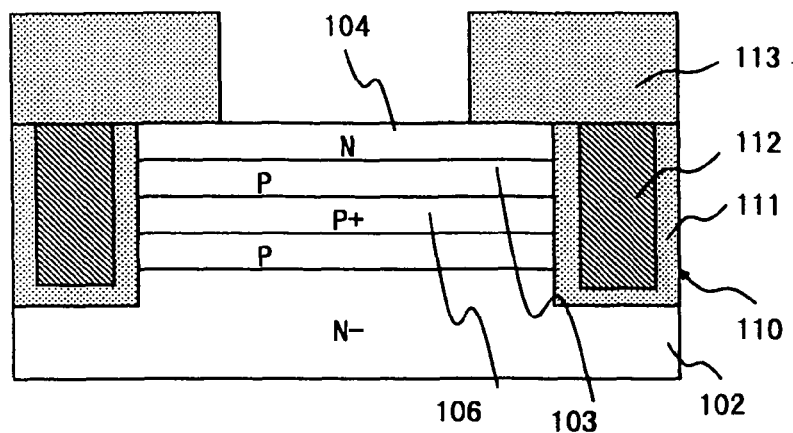
Figure 15E:
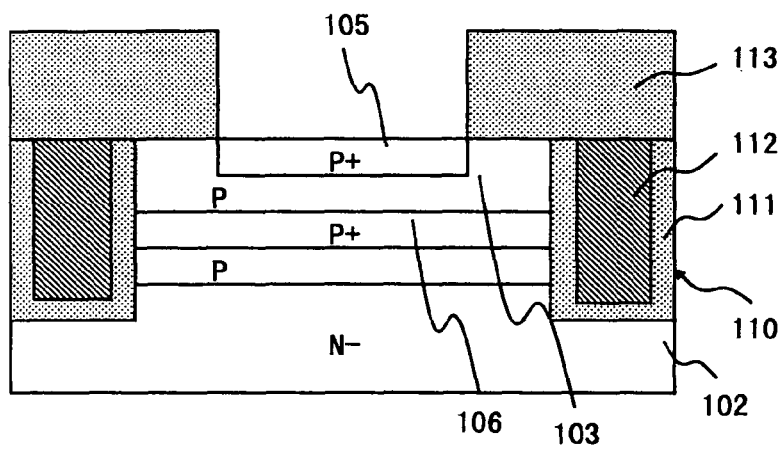
Figure 15F:
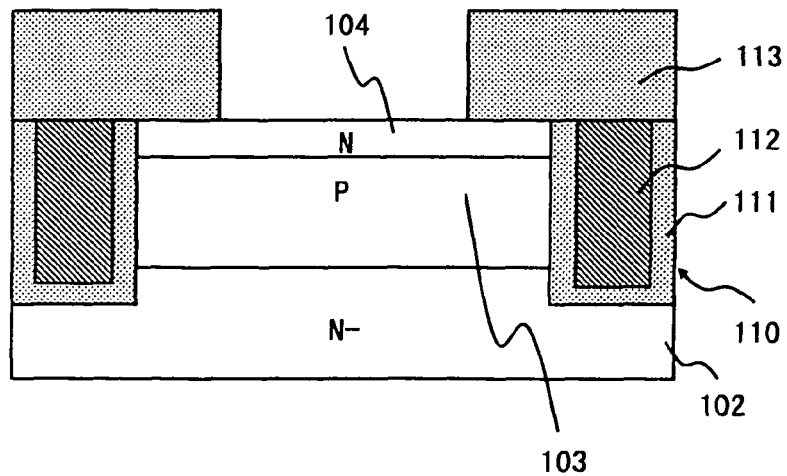
Figure 16A:
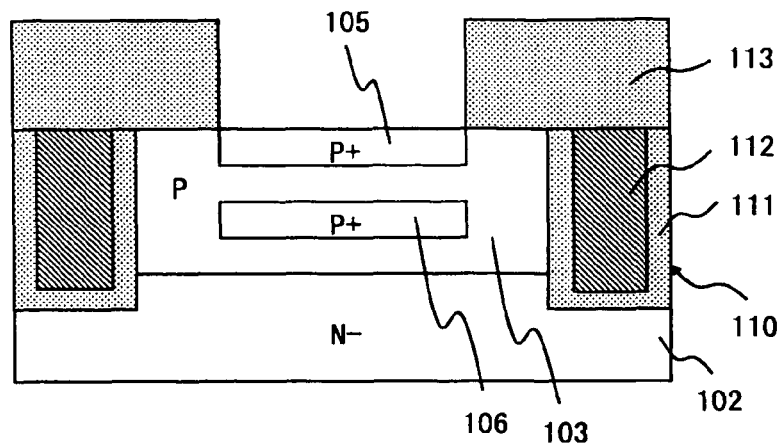
FIGS. 16A, 16C, 16E and 16G are cross-sectional diagrams taken along the line B-B in FIG. 10 showing a configuration of a semiconductor apparatus according to the present invention.
Figure 16B:
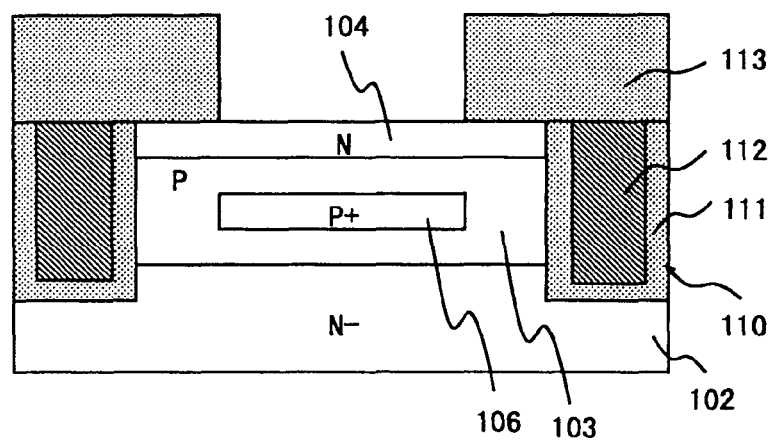
FIGS. 16B, 16D, 16F and 16H are cross-sectional diagrams taken along the line C-C in FIG. 10 showing a configuration of a semiconductor apparatus according to the present invention.
Figure 16C:
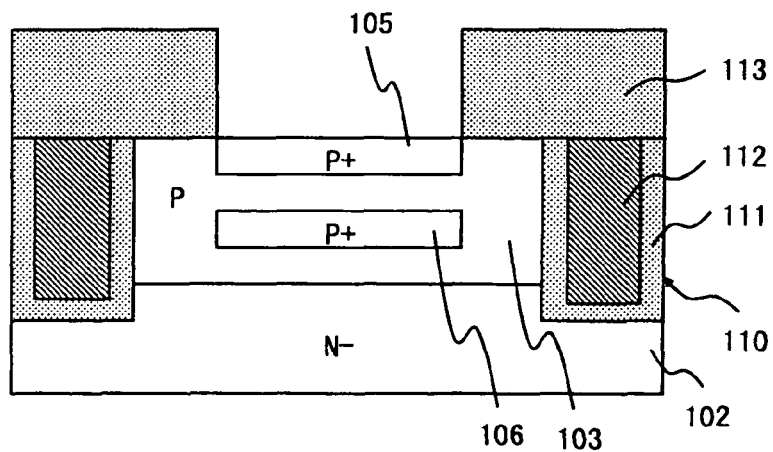
Figure 16D:
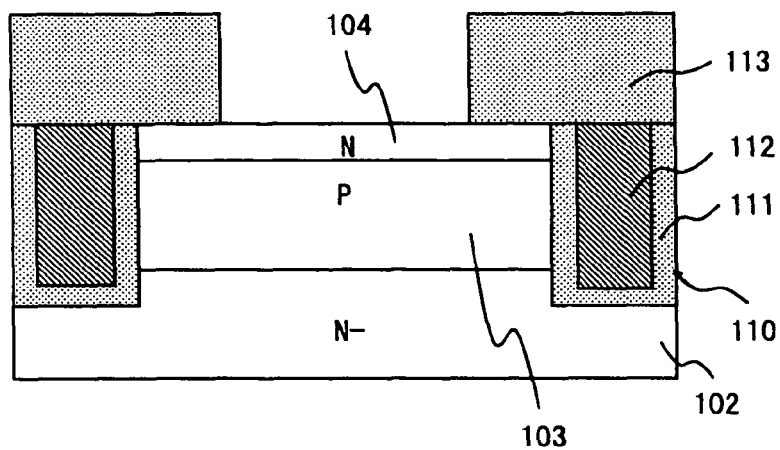
Figure 16E:
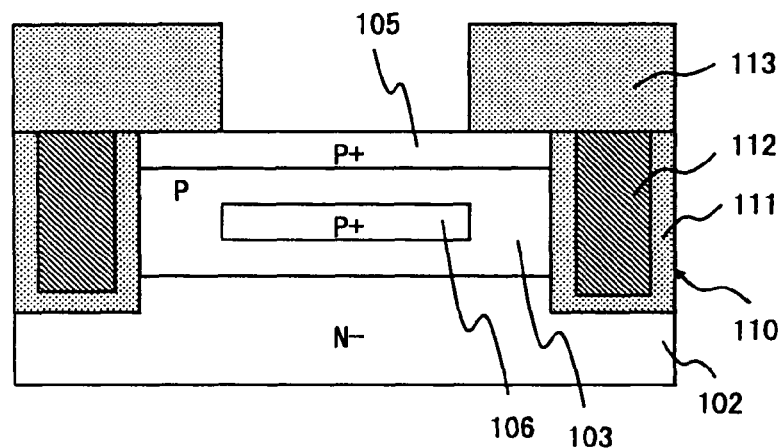
Figure 16F:
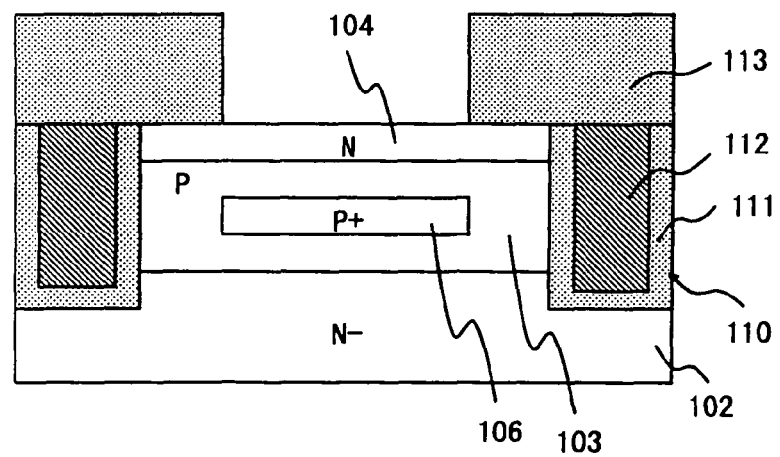
Figure 16G:
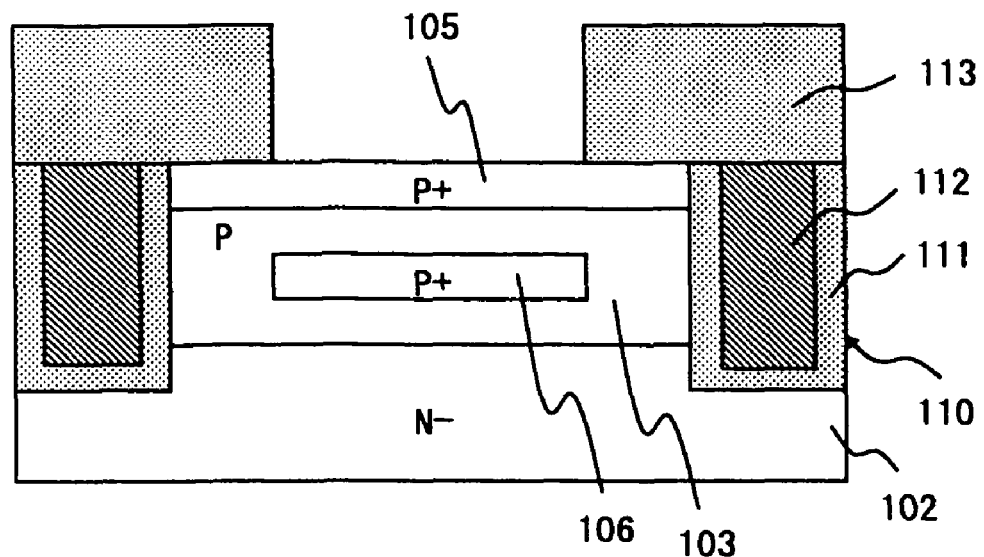
Figure 16H:
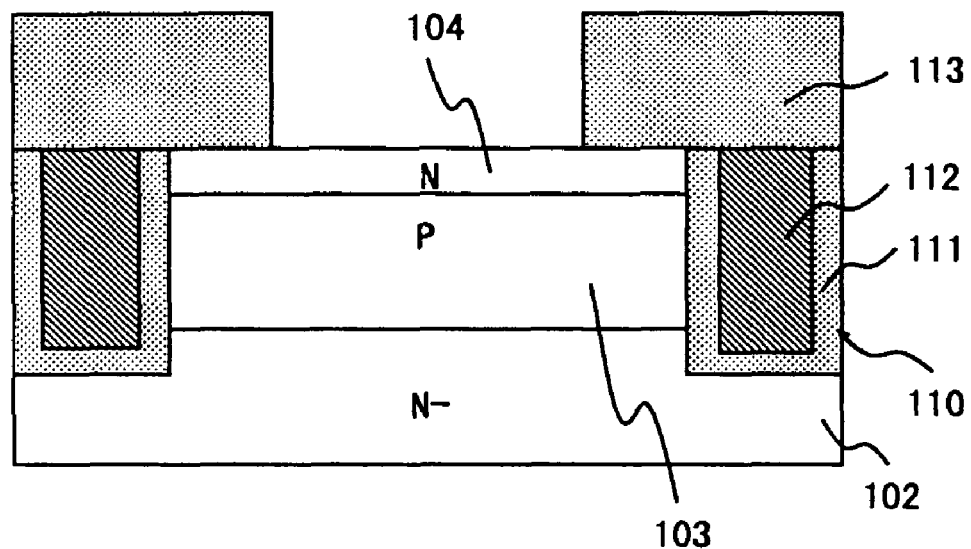

FIGS. 15C and 15D are examples where the first P+ type diffusion layer 105 is narrow having a similar configuration with FIGS. 14A and 14B. FIGS. 15E and 15F are examples where the first P+ type diffusion layer 105 is narrow having a similar configuration with FIGS. 15A and 15B. FIGS. 16A and 16B are examples where the first P+ type diffusion layer 105 is narrow having a similar configuration with FIGS. 14A and 14B. FIGS. 16C and 16D are examples where the first P+ type diffusion layer 105 is narrow having a similar configuration with FIGS. 15A and 15B. FIGS. 16E and 16F are examples where the second P+ type diffusion layer 106 is narrow having a similar configuration with FIGS. 14A and 14B. FIGS. 16G and 16H are examples where the second P+ type diffusion layer 106 is narrow having a similar configuration with FIGS. 15A and 15B.

As described in the foregoing, in this embodiment having rectangular cells, P+ type diffusion layers are formed in an upper part of the P type base diffusion layer and in the middle in vertical direction in the P type base diffusion layer. This improves destruction resistance against secondary breakdown as with the second embodiment.

Sixth Embodiment

A semiconductor apparatus of a sixth embodiment is described hereinafter in detail. The semiconductor apparatus of this embodiment is a trench gate MOSFET of rectangular cells. The trench gate MOSFET includes a first P+ type diffusion layer in an upper part of the P type base diffusion layer, a second P+ type diffusion layer in the middle in vertical direction in the P type base diffusion layer, and a third P+ type diffusion layer in a lower part of the P type base diffusion layer.

Figure 17A:
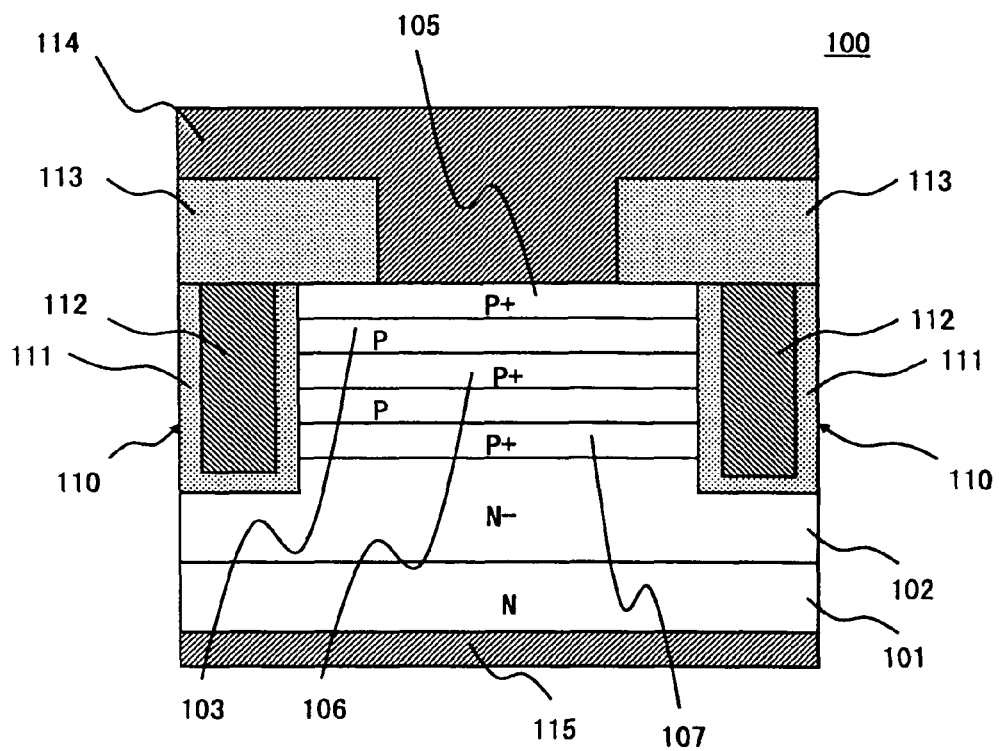
FIG. 17A is a cross-sectional diagram taken along with the line B-B in FIG. 10 showing a configuration of a semiconductor apparatus according to the present invention.
Figure 17B:
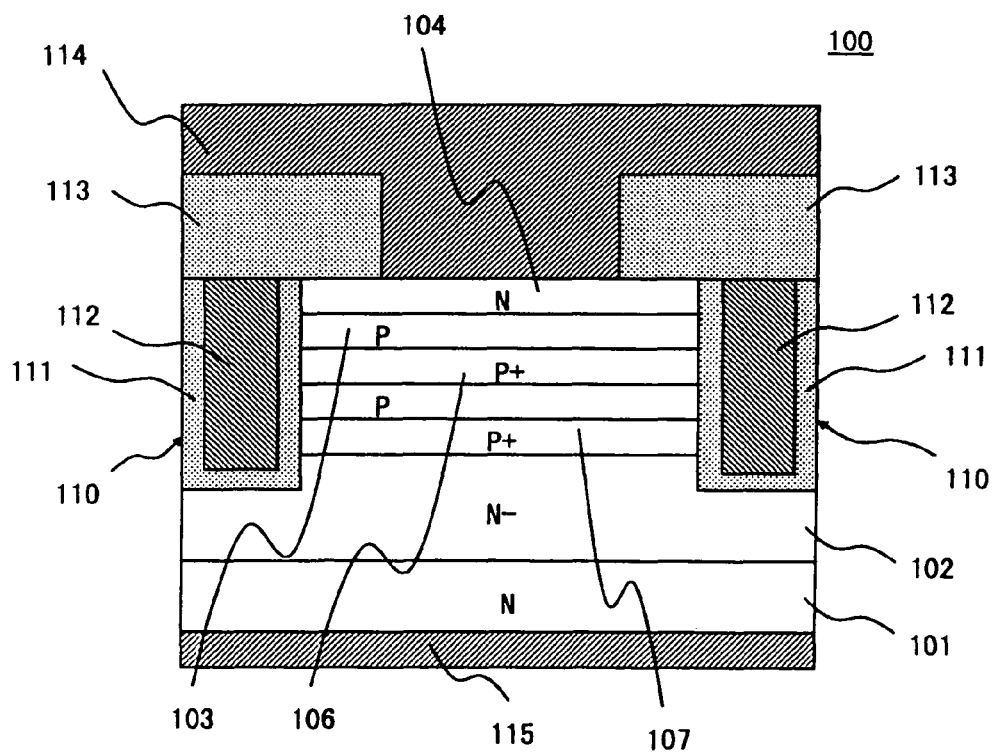
FIG. 17B is a cross-sectional diagram taken along with the line C-C in FIG. 10 showing a configuration of a semiconductor apparatus according to the present invention.

A configuration of a semiconductor apparatus of this embodiment is described hereinafter in detail with reference to FIGS. 17A and 17B. The semiconductor apparatus 100 is an example of cells having different shapes as compared to the semiconductor apparatus of the third embodiment. A plan view of the semiconductor apparatus 100 is identical to FIG. 10. FIG. 17A is a cross-sectional diagram taken along the line B-B of FIG. 10. FIG. 17B is a cross-sectional diagram taken along the line C-C of FIG. 10.

As shown in FIGS. 17A and 17B, a cross-section configuration of the semiconductor apparatus 100 is basically identical to the third embodiment. In FIGS. 17A and 17B, components identical to those in FIG. 8 are denoted by reference numerals identical to those therein.

In a center part (cross section B-B of the unit cell 20), the first P+ type diffusion layer 105 is formed on an entire surface of the P type base diffusion layer 103, and the second P+ type diffusion layer 106 is formed on an entire surface of approximately the middle part in vertical direction in the P type base diffusion layer 103. Further, the third P+ type diffusion layer 107 is formed on an entire surface of the bottom of the P type diffusion layer 103. In the both ends of the unit cell 20 (cross section C-C of the unit cell 20), the N type source diffusion layer 104 is formed on an entire surface of the P type base diffusion layer 103, and the second P+ type diffusion layer 106 is formed on an entire surface of the approximately middle part in vertical direction in the P type base diffusion layer 103. Further, the third P+ type diffusion layer 107 is formed on an entire surface of the bottom of the P type base diffusion layer 103. In this example, the second P+ type diffusion layer 106 and the third P+ type diffusion layer 107 have almost the same width and wider than the first P+ type diffusion layer 105. The second P+ type diffusion layer 106 and the third P+ type diffusion layer 107 are formed on an entire surface of the middle and the bottom of the P+ type base diffusion layer 103.

A manufacturing method is identical to the third embodiment and thus an explanation is omitted. In this embodiment, the first P+ type diffusion layer 105, the second P+ type diffusion layer 106, and the third P+ type diffusion layer 107 may have the same width or different widths as with the third embodiment.

Figure 18A:
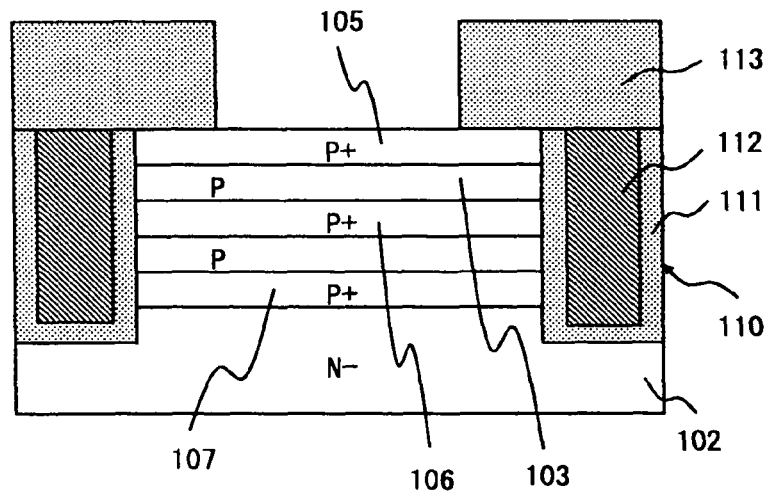
FIGS. 18A, 18C and 18E are cross-sectional diagrams taken along with the line B-B in FIG. 10 showing a configuration of a semiconductor apparatus according to the present invention.
Figure 18B:
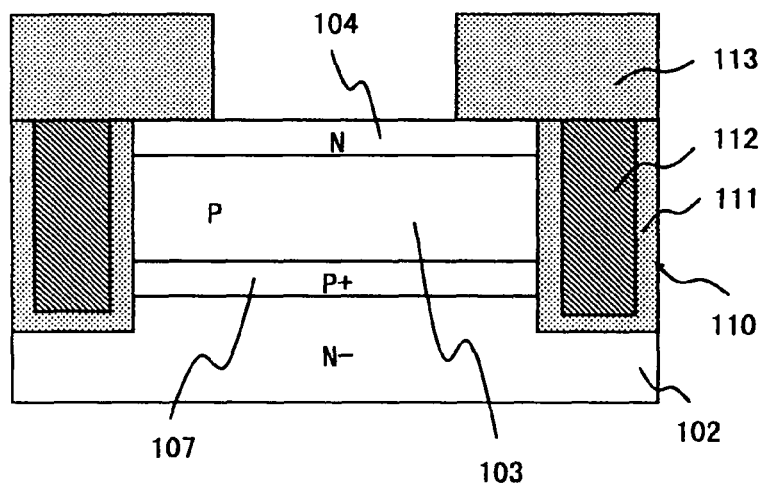
FIGS. 18B, 18D and 18F are cross-sectional diagrams taken along with the line C-C in FIG. 10 showing a configuration of a semiconductor apparatus according to the present invention.
Figure 18C:
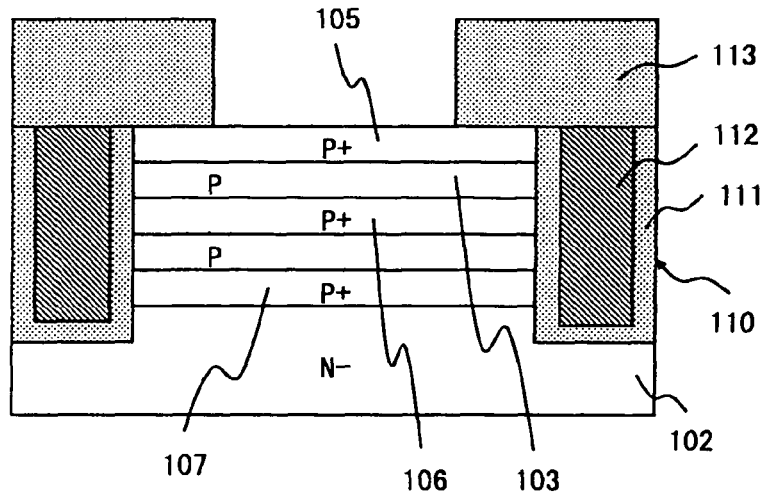
Figure 18D:
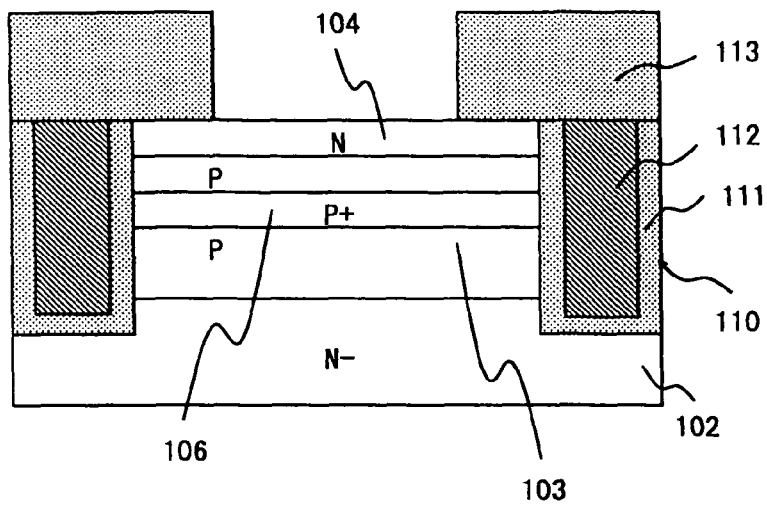
Figure 18E:
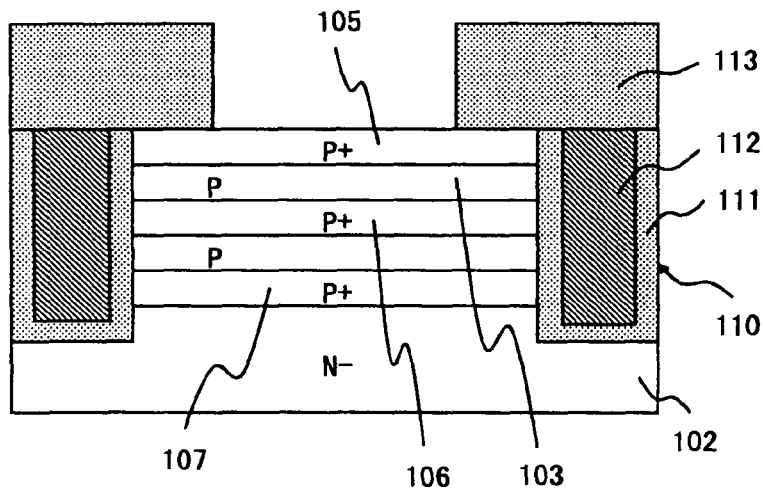
Figure 18F:
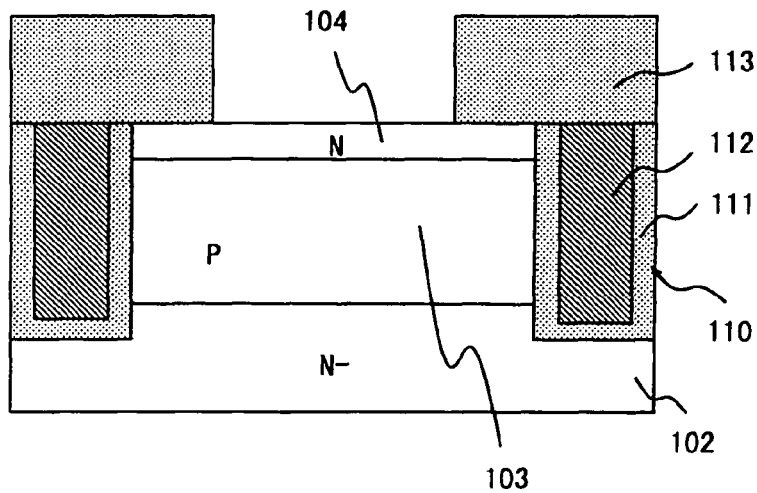

FIGS. 18A and 18B are examples where the first P+ type diffusion layer 105 and the second P+ type diffusion layer 106 have the same width, the third P+ type diffusion layer 107 is wider than the first P+ type diffusion layer 105 and the P+ type diffusion layer 106. Further, the second P+ type diffusion layer 106 and the third P+ type diffusion layer 107 are formed to an entire surface below the P+ type base diffusion layer 103. FIGS. 18C and 18D are examples where the first P+ type diffusion layer 105 and the third P+ type diffusion layer 107 have the same width, the second P+ type diffusion layer 106 is wider than the first P+ type diffusion layer 105 and the third P+ type diffusion layer 107. Further, the second P+ type diffusion layer 106 and the third P+ type diffusion layer 107 are formed to an entire surface of the middle of the P+ type base diffusion layer 103. FIGS. 18E and 18F are examples where the first P+ type diffusion layer 105, the second P+ type diffusion layer 106, and the third P+ type diffusion layer 107 have the same width, and a P+ type diffusion layer is not formed blow the N type source diffusion layer 104.

Figure 19A:
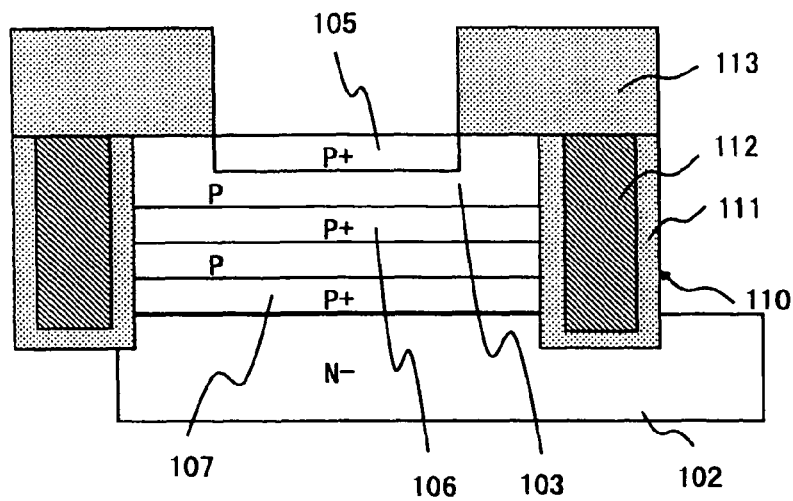
FIGS. 19A, 19C, 19E and 19G are cross-sectional diagrams taken along with the line B-B in FIG. 10 showing a configuration of a semiconductor apparatus according to the present invention.
Figure 19B:
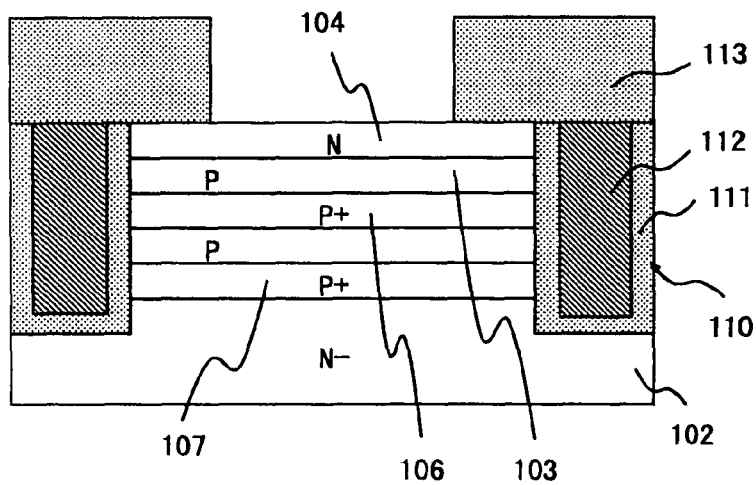
FIGS. 19B, 19D, 19F and 19H are cross-sectional diagrams taken along with the line C-C in FIG. 10 showing a configuration of a semiconductor apparatus according to the present invention.
Figure 19C:
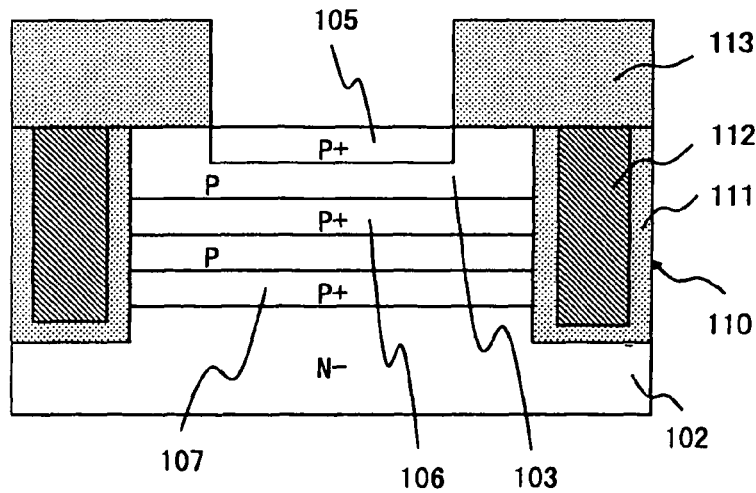
Figure 19D:
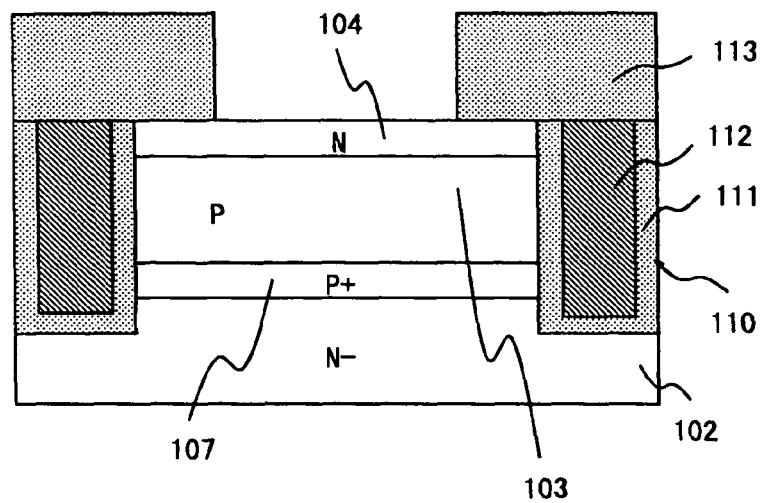
Figure 19E:
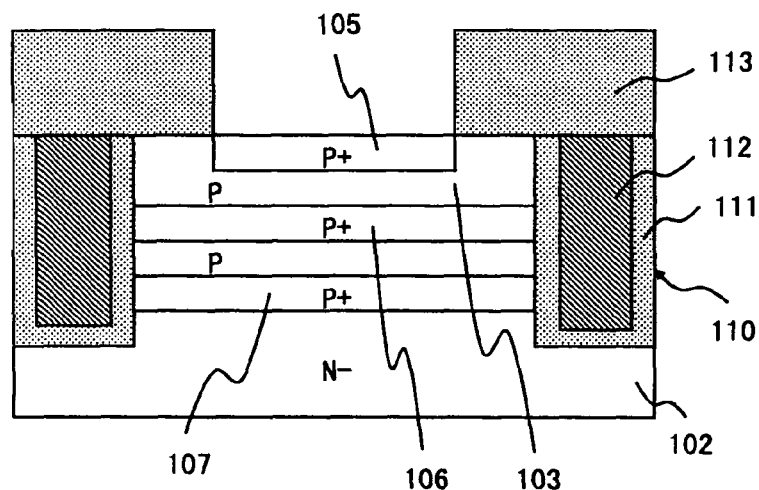
Figure 19F:
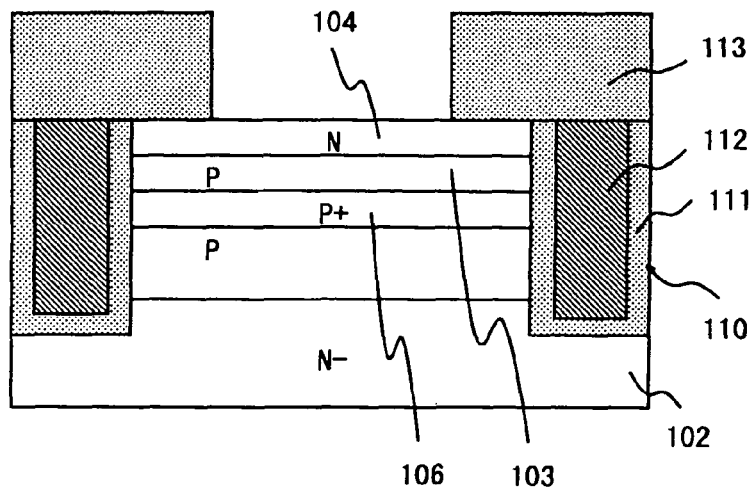
Figure 19G:
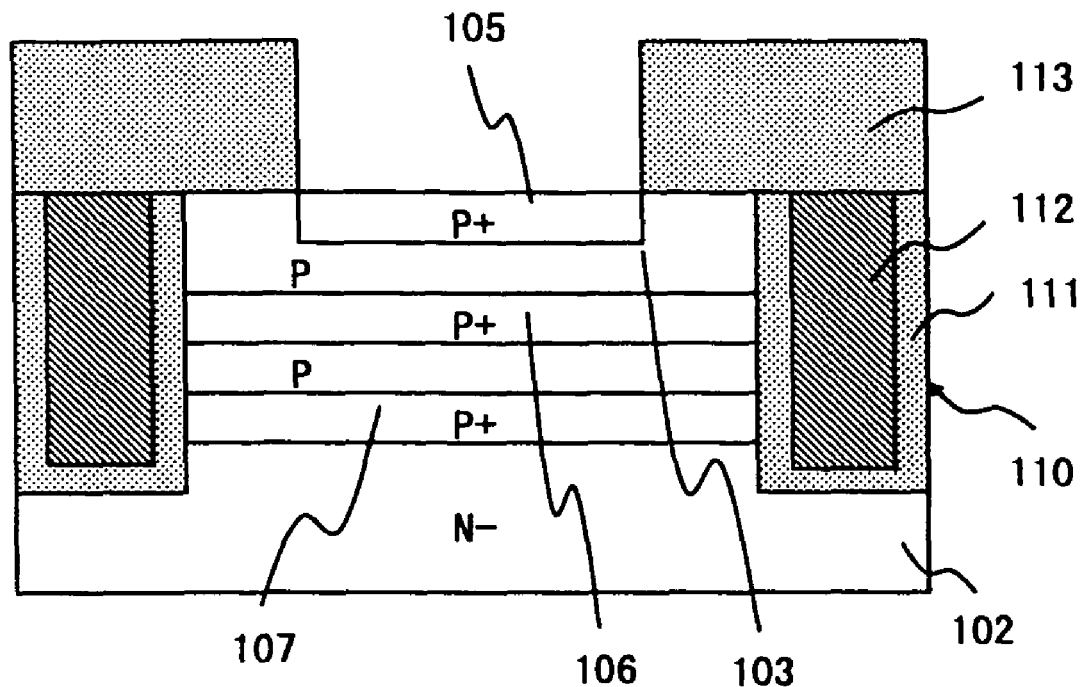
Figure 19H:
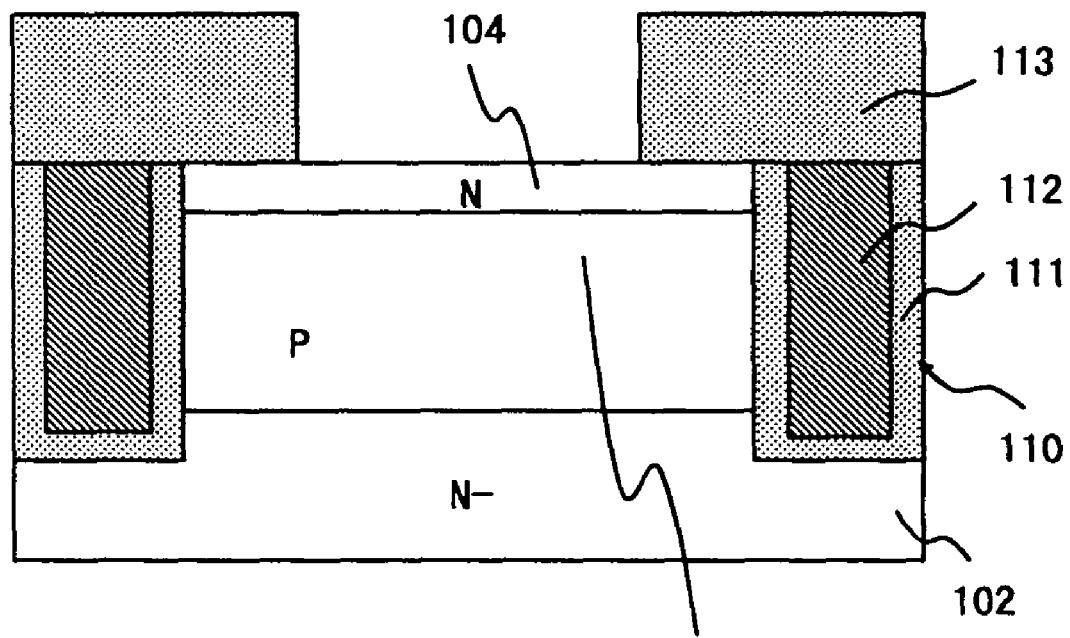

FIGS. 19A and 19B are examples where the first P+ type diffusion layer 105 is narrow having a similar configuration with FIGS. 17A and 17B. FIGS. 19C and 19D are examples where the first P+ type diffusion layer 105 is narrow having a similar configuration with FIGS. 18A and 18B. FIGS. 19E and 19F are examples where the first P+ type diffusion layer 105 is narrow having a similar configuration with FIGS. 18C and 18D. FIGS. 19G and 19H are examples where the first P+ type diffusion layer 105 is narrow having a similar configuration with FIGS. 18E and 18F.

Figure 20A:
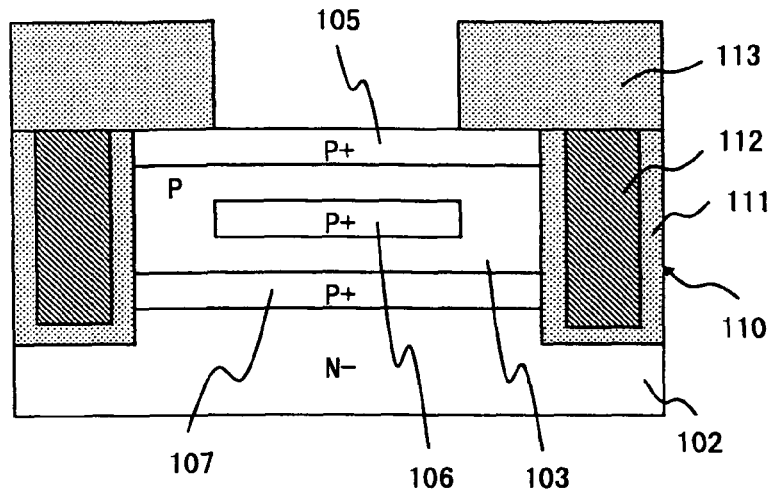
FIGS. 20A, 20C, 20E and 20G are cross-sectional diagrams taken along with the line B-B in FIG. 10 showing a configuration of a semiconductor apparatus according to the present invention.
Figure 20B:
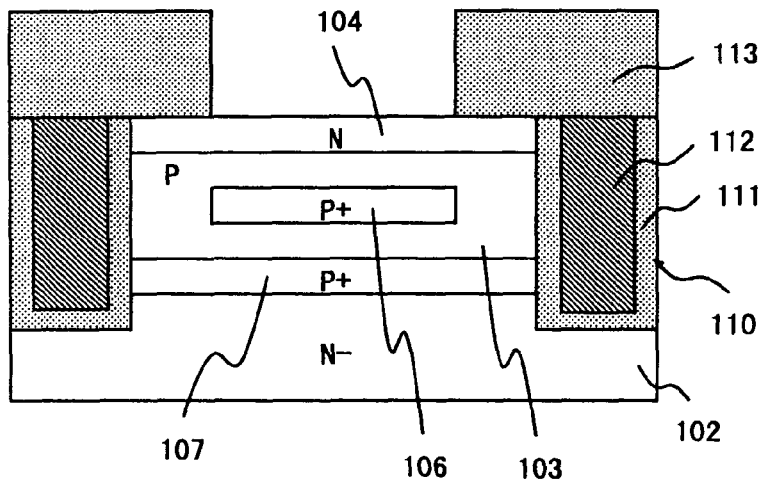
FIGS. 20B, 20D, 20F and 20H are cross-sectional diagrams taken along with the line C-C in FIG. 10 showing a configuration of a semiconductor apparatus according to the present invention.
Figure 20C:
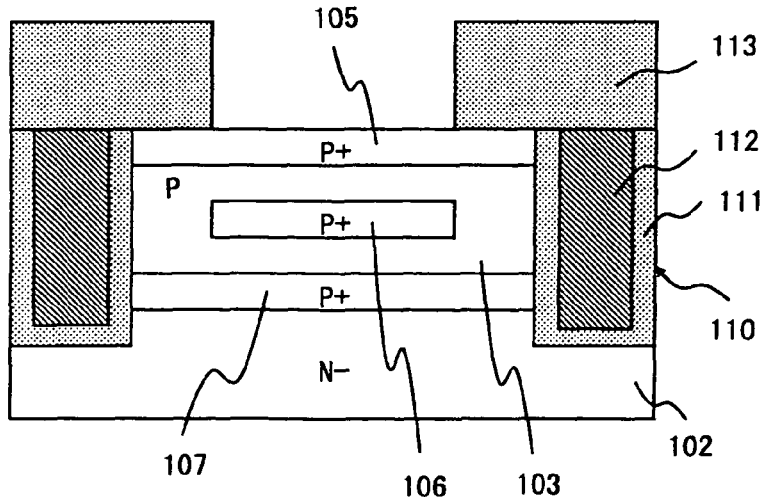
Figure 20D:
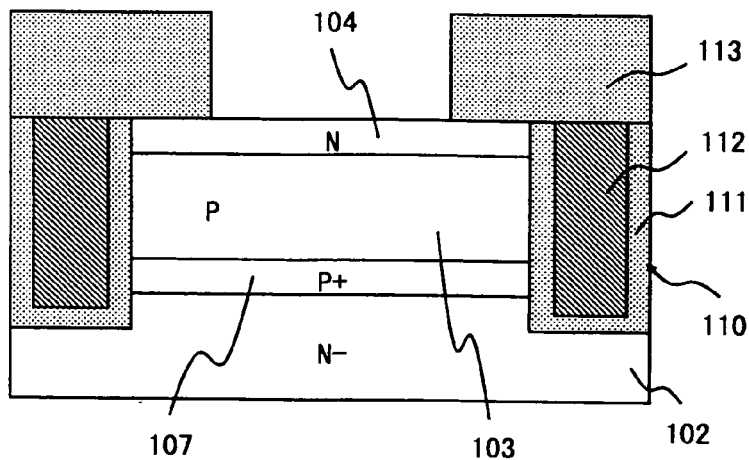
Figure 20E:
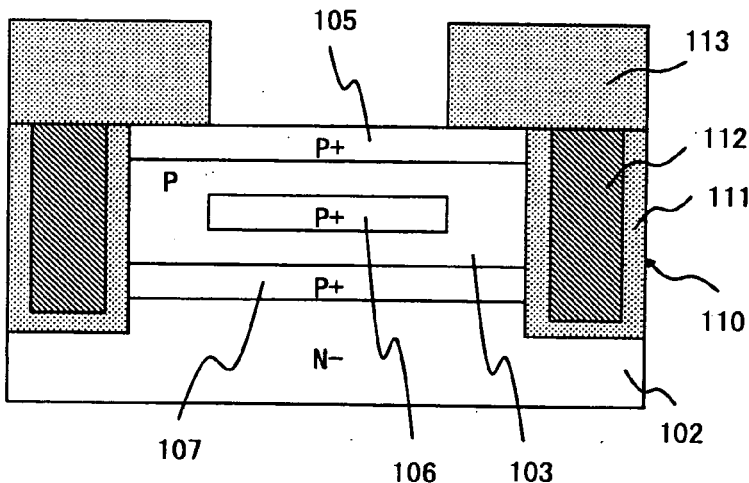
Figure 20F:
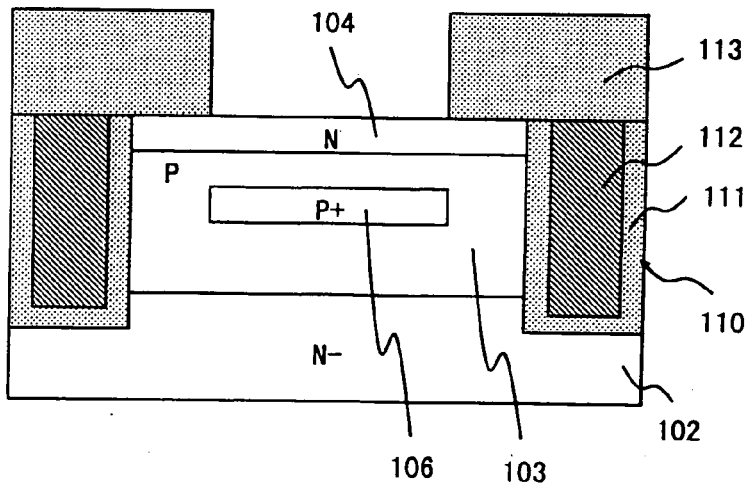
Figure 20G:
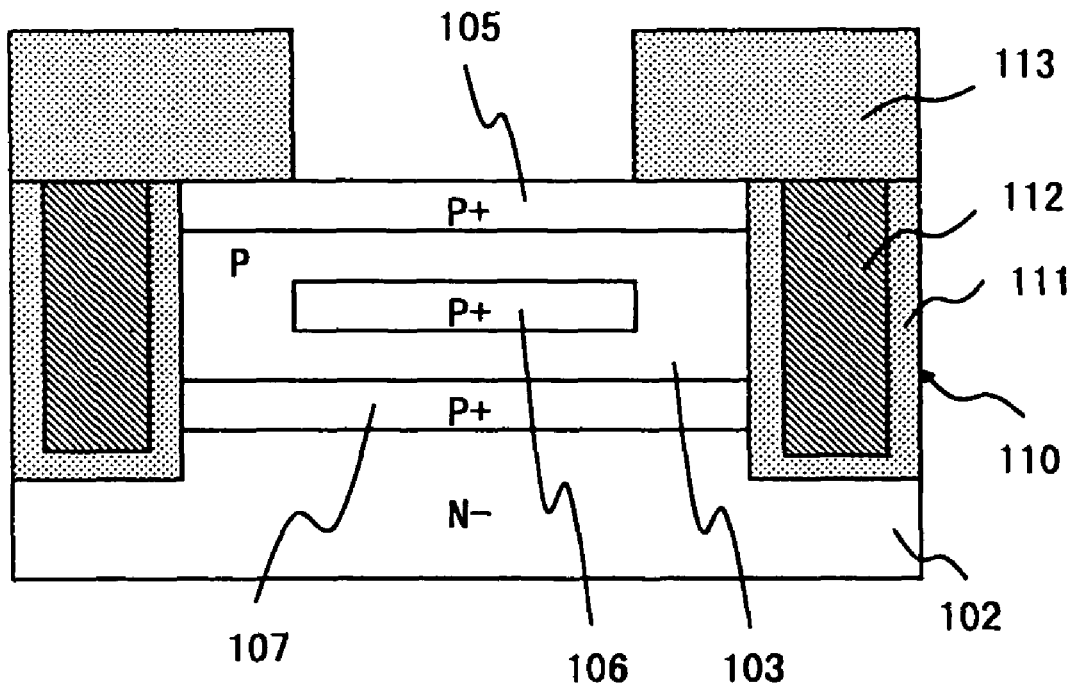
Figure 20H:
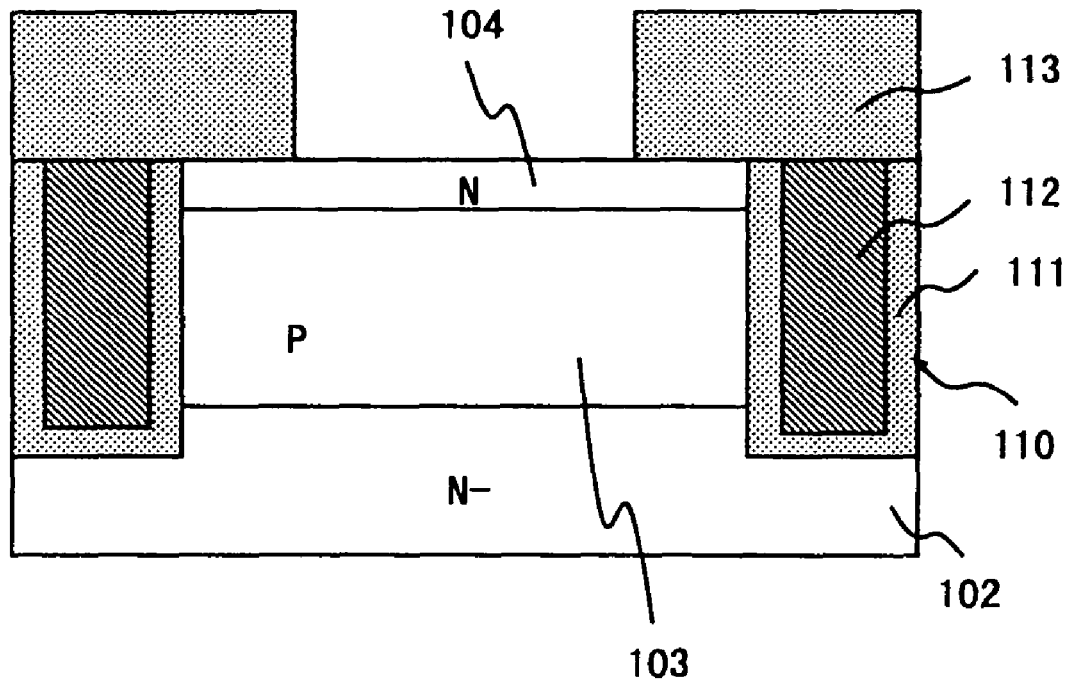

FIGS. 20A and 20B are examples where the second P+ type diffusion layer 106 is narrow having a similar configuration with FIGS. 17A and 17B. FIGS. 20C and 20D are examples where the second P+ type diffusion layer 106 is narrow having a similar configuration with FIGS. 18A and 18B. FIGS. 20E and 20F are examples where the second P+ type diffusion layer 106 is narrow having a similar configuration with FIGS. 18C and 18D. FIGS. 20G and 20H are examples where the second P+ type diffusion layer 106 is narrow having a similar configuration with FIGS. 18E and 18F.

Figure 21A:
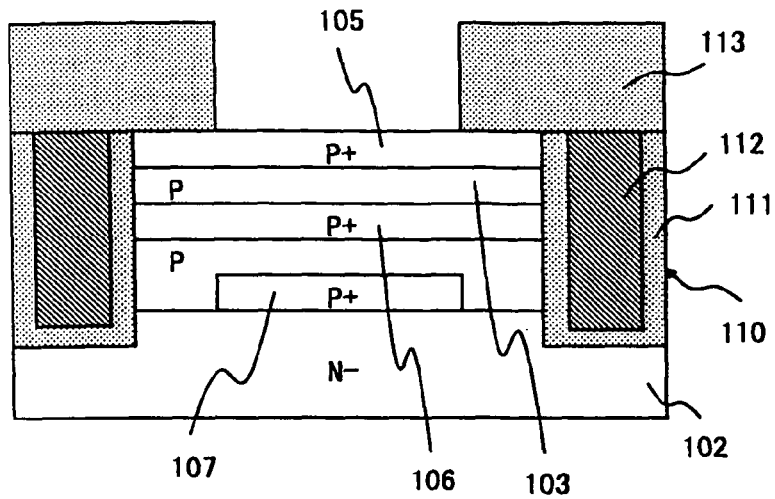
FIGS. 21A, 21C, 21E and 21G are cross-sectional diagrams taken along with the line B-B in FIG. 10 showing a configuration of a semiconductor apparatus according to the present invention.
Figure 21B:
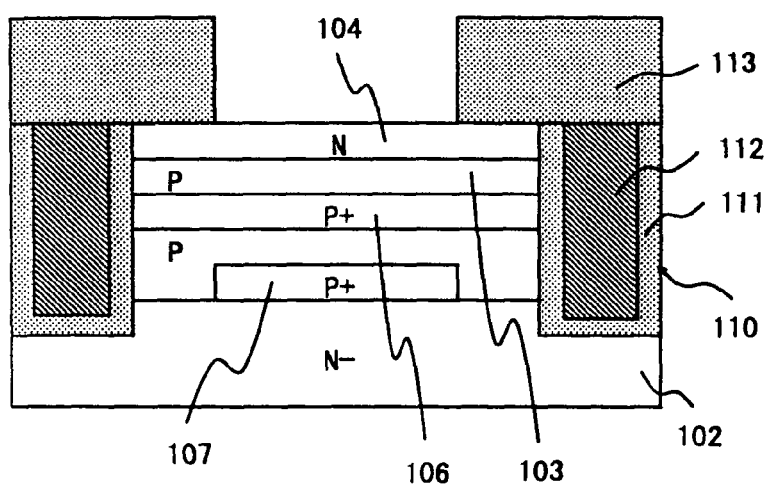
FIGS. 21B, 21D, 21F and 21H are cross-sectional diagrams taken along with the line C-C in FIG. 10 showing a configuration of a semiconductor apparatus according to the present invention.
Figure 21C:
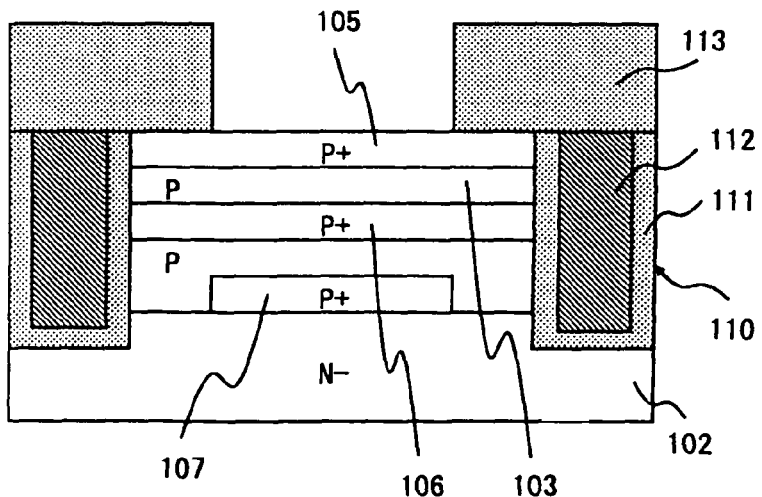
Figure 21D:
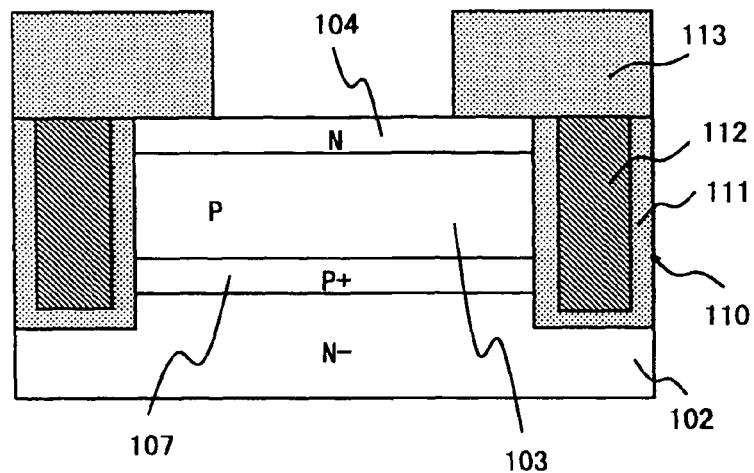
Figure 21E:
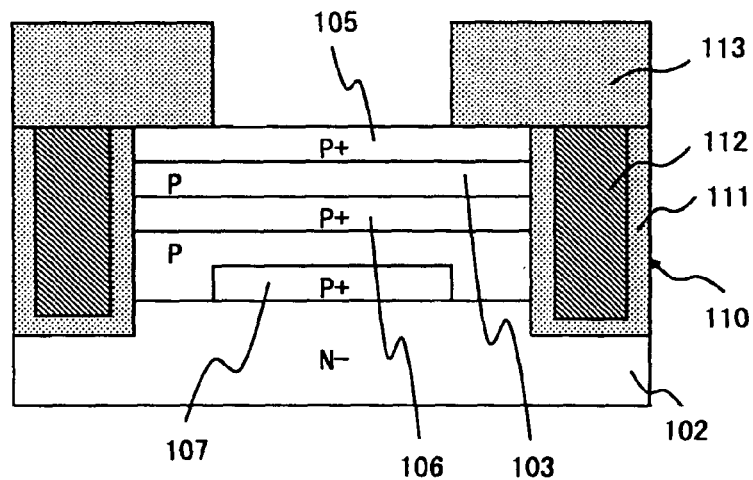
Figure 21F:
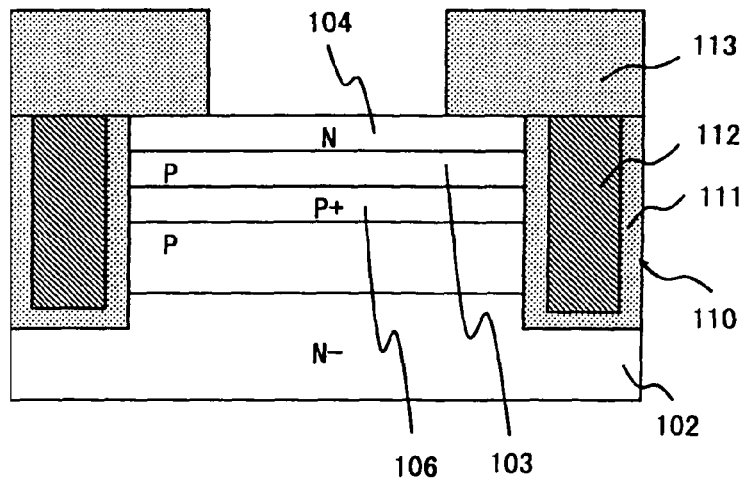
Figure 21G:
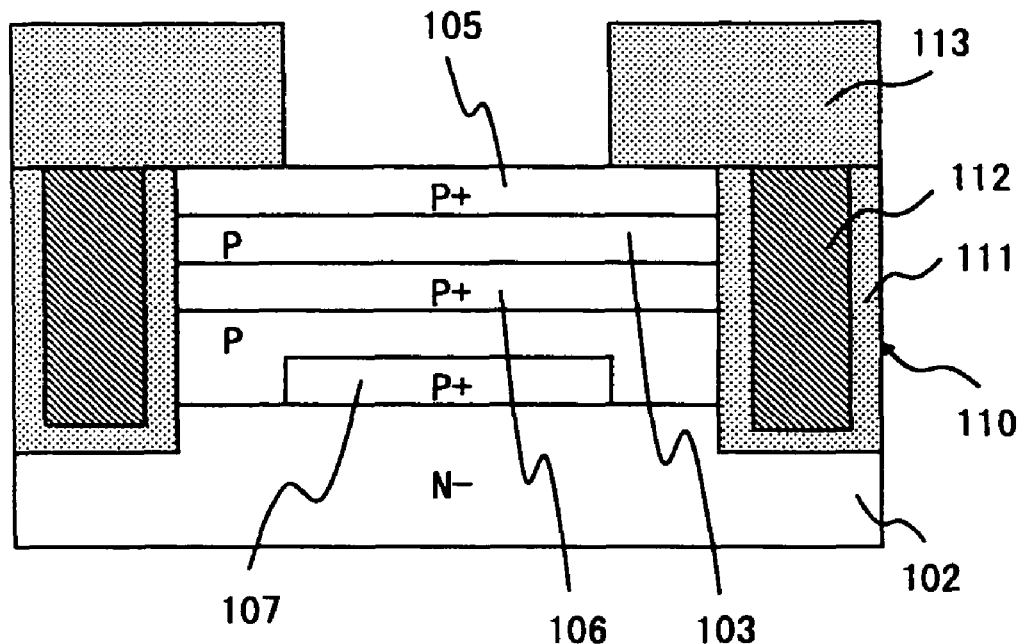
Figure 21H:
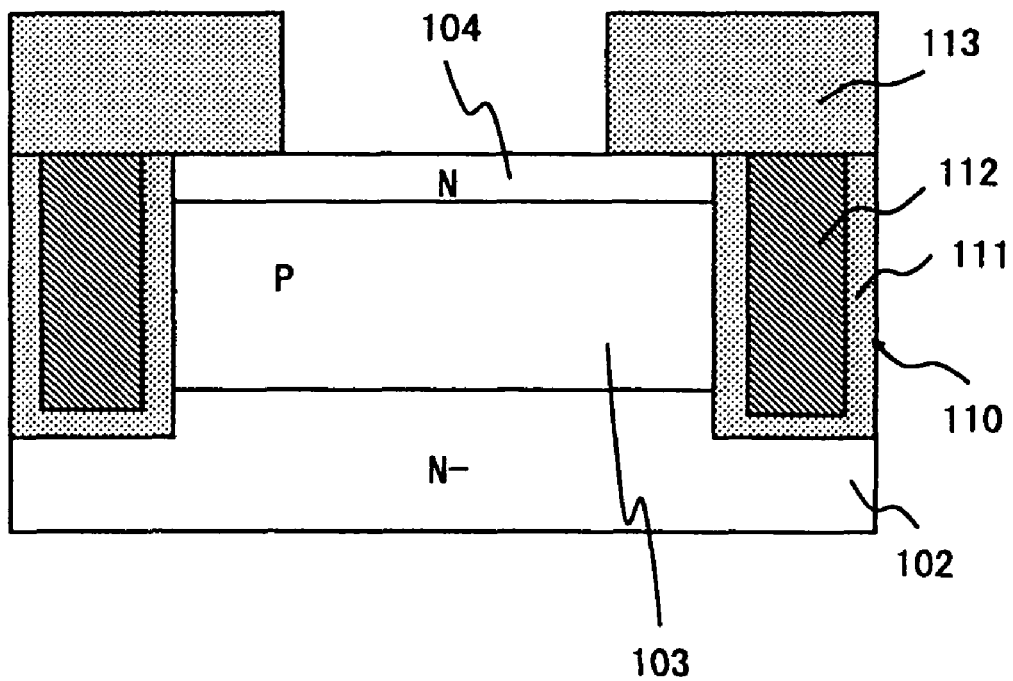

FIGS. 21A and 21B are examples where the third P+ type diffusion layer 107 is narrow having a similar configuration with FIGS. 17A and 17B. FIGS. 21C and 21D are examples where the third P+ type diffusion layer 107 is narrow having a similar configuration with FIGS. 18A and 18B. FIGS. 21E and 21F are examples where the third P+ type diffusion layer 107 is narrow having a similar configuration with FIGS. 18C and 18D. FIGS. 21G and 21H are examples where the third P+ type diffusion layer 107 is narrow having a similar configuration with FIGS. 18E and 18F.

Figure 22A:
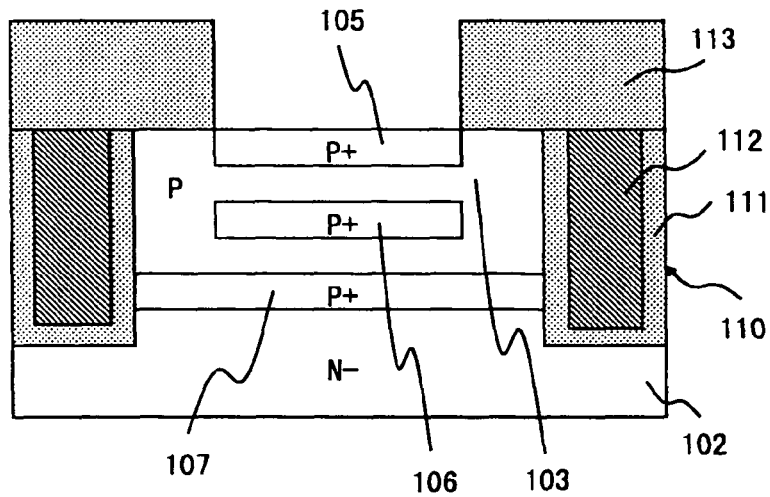
FIGS. 22A, 22C, 22E and 22G are cross-sectional diagrams taken along with the line B-B in FIG. 10 showing a configuration of a semiconductor apparatus according to the present invention.
Figure 22B:
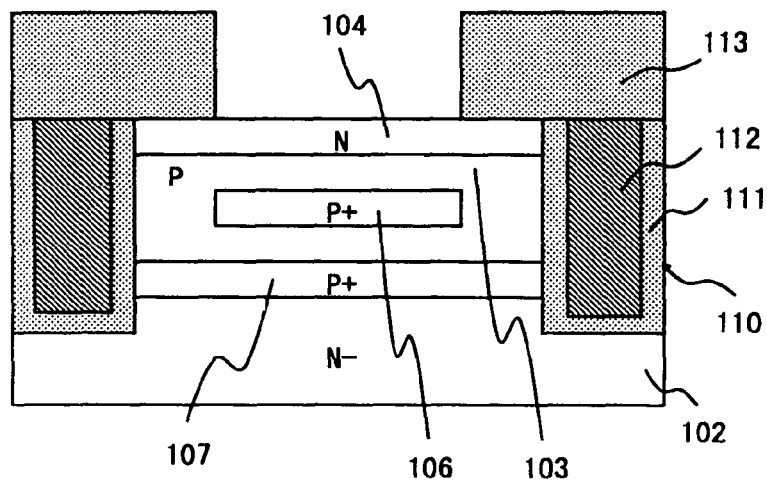
FIGS. 22B, 22D, 22F and 22H are cross-sectional diagrams taken along with the line C-C in FIG. 10 showing a configuration of a semiconductor apparatus according to the present invention.
Figure 22C:
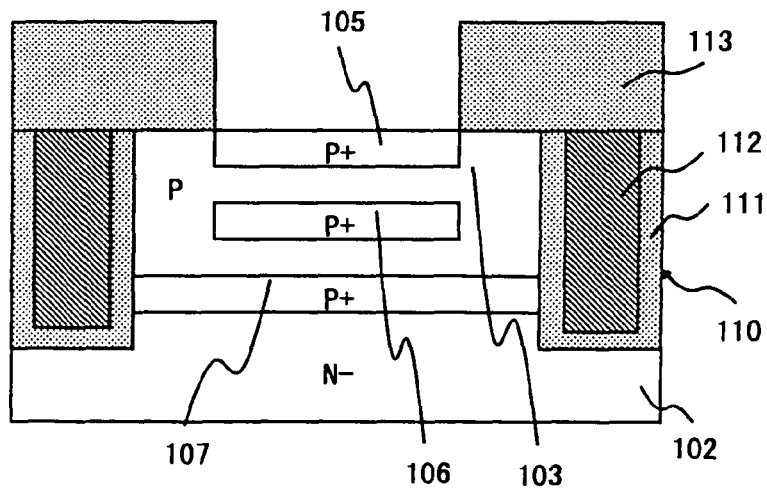
Figure 22D:
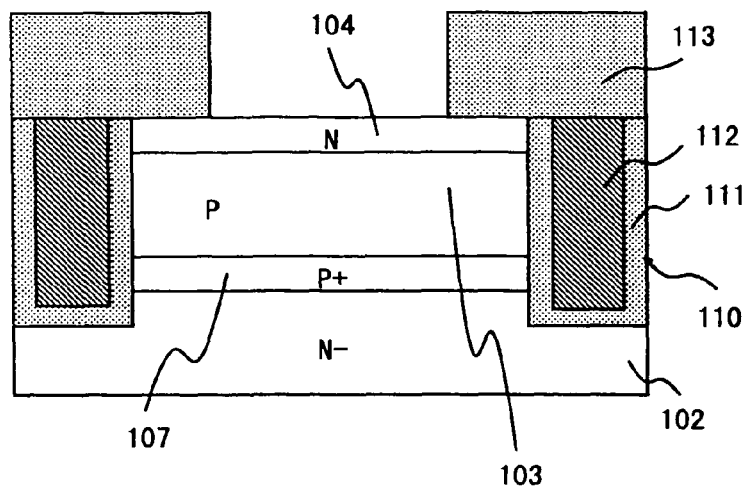
Figure 22E:
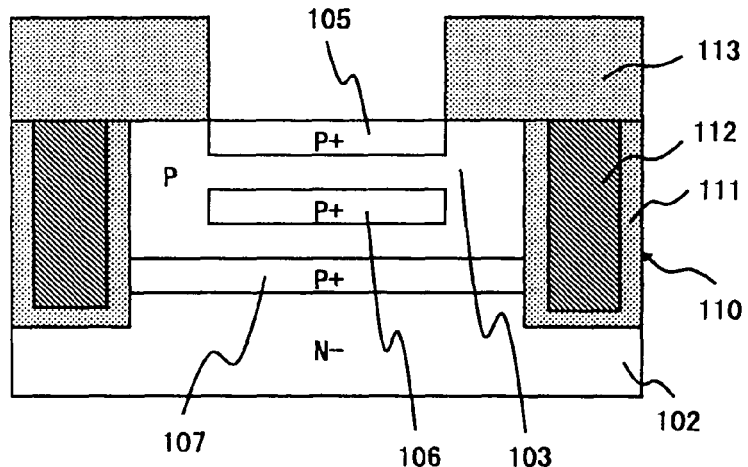
Figure 22F:
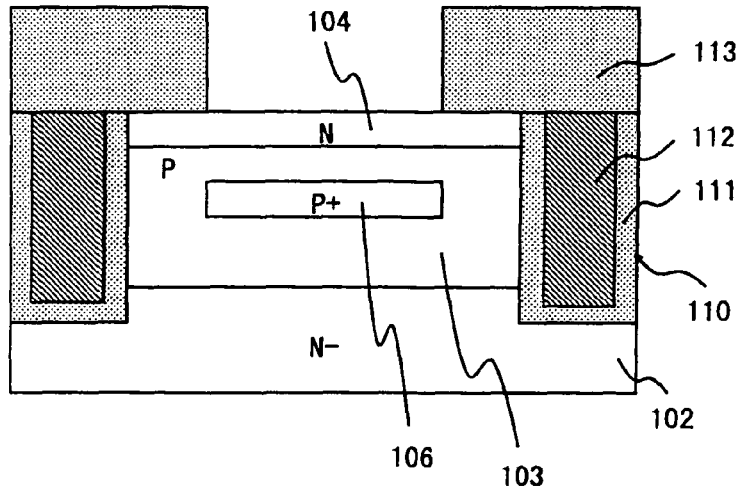
Figure 22G:
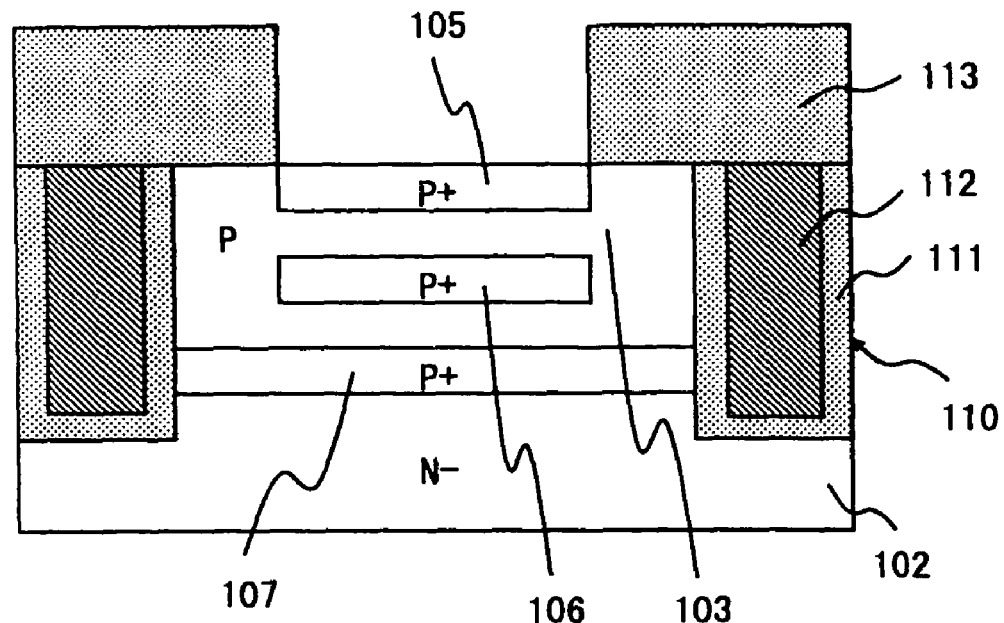
Figure 22H:
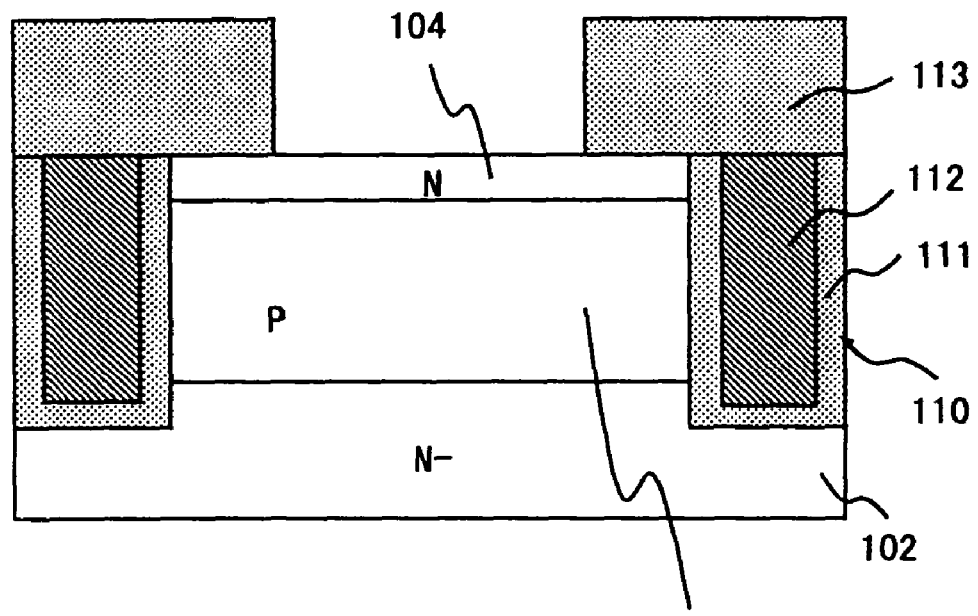

FIGS. 22A and 22B are examples where the first P+ type diffusion layer 105 and the second P+ type diffusion layer 106 are narrow having a similar configuration with FIGS. 17A and 17B. FIGS. 22C and 22D are examples where the first P+ type diffusion layer 105 and the second P+ type diffusion layer 106 are narrow having a similar configuration with FIGS. 18A and 18B. FIGS. 22E and 22F are examples where the first P+ type diffusion layer 105 and the second P+ type diffusion layer 106 are narrow having a similar configuration with FIGS. 18C and 18D. FIGS. 22G and 22H are examples where the first P+ type diffusion layer 105 and the second P+ type diffusion layer 106 are narrow having a similar configuration with FIGS. 18E and 18F.

Figure 23A:
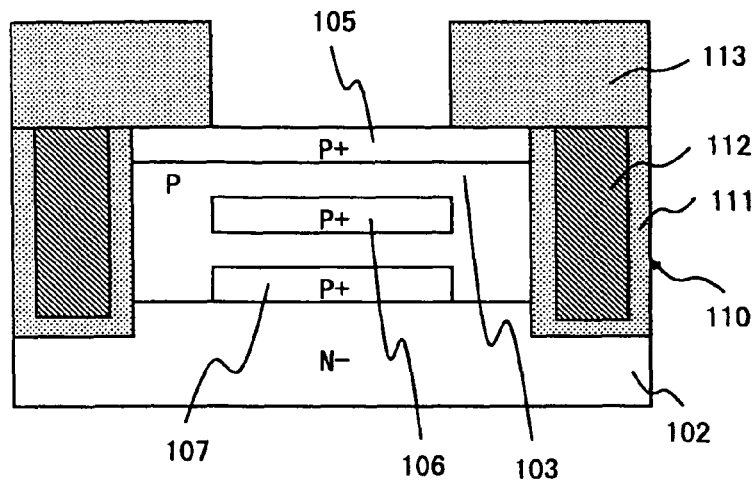
FIGS. 23A, 23C, 23E and 23G are cross-sectional diagrams taken along with the line B-B in FIG. 10 showing a configuration of a semiconductor apparatus according to the present invention.
Figure 23B:
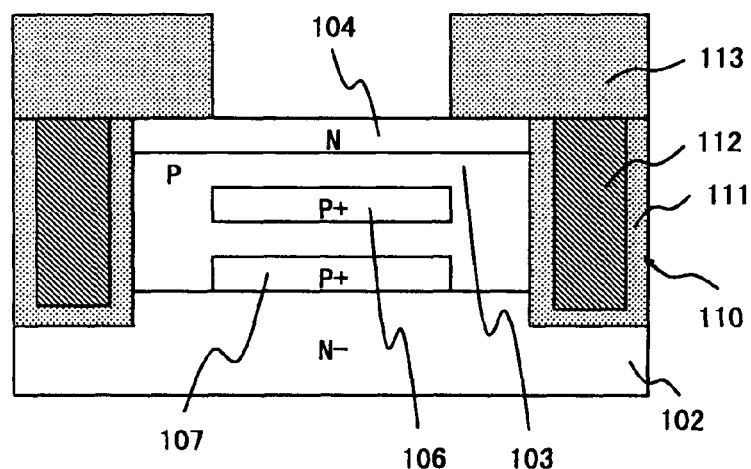
FIGS. 23B, 23D, 23F and 23H are cross-sectional diagrams taken along with the line C-C in FIG. 10 showing a configuration of a semiconductor apparatus according to the present invention.
Figure 23C:
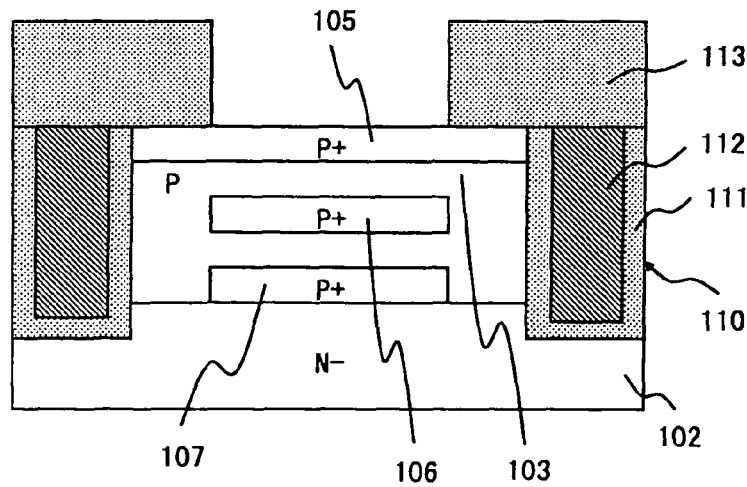
Figure 23D:
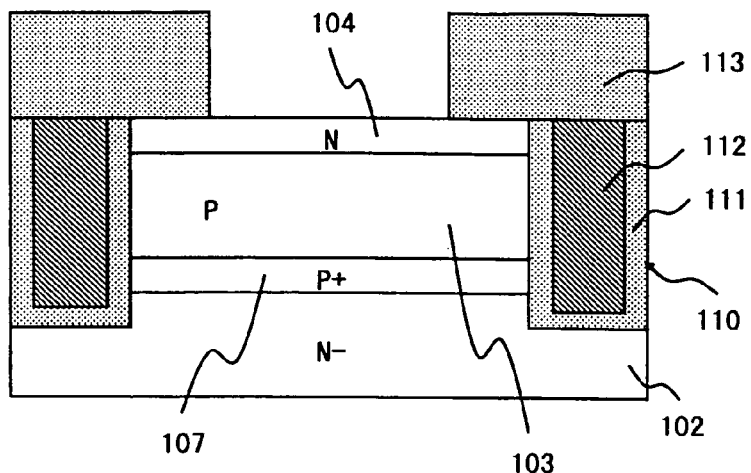
Figure 23E:
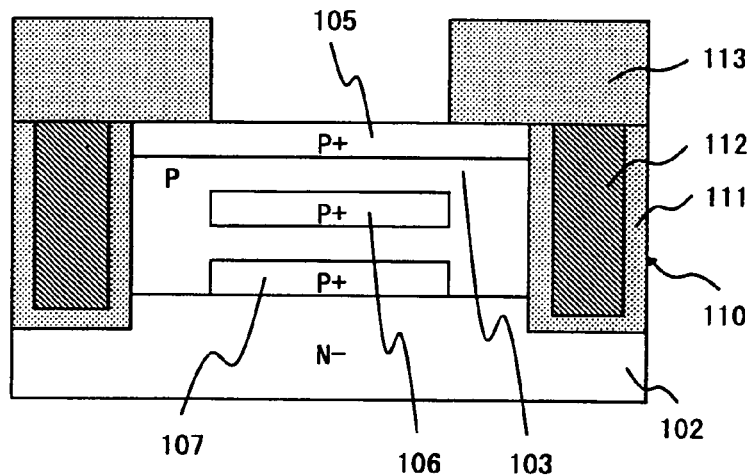
Figure 23F:
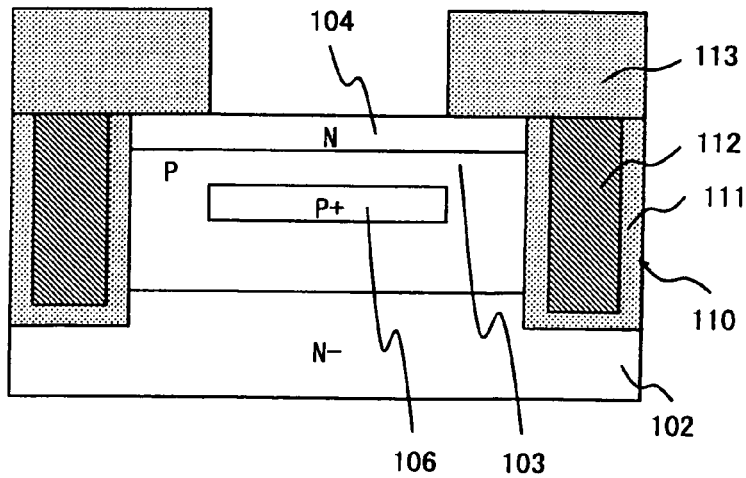
Figure 23G:
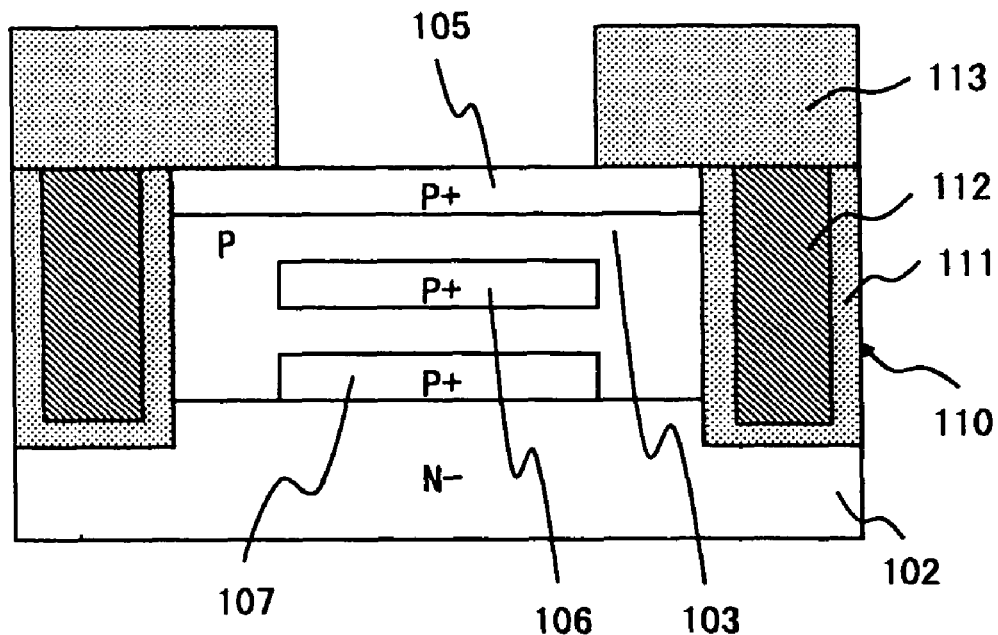
Figure 23H:
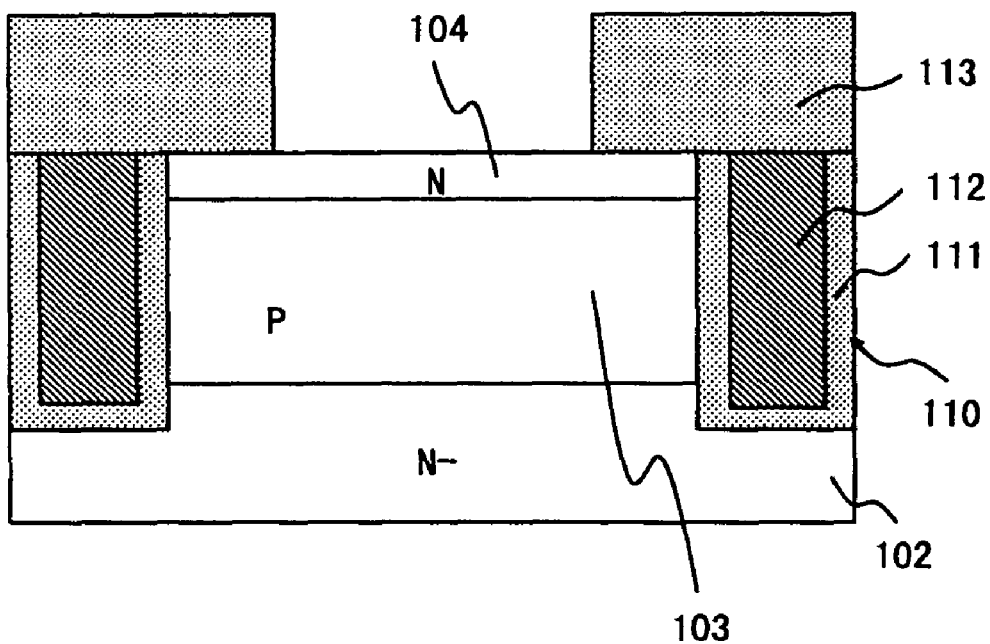

FIGS. 23A and 23B are examples where the second P+ type diffusion layer 106 and the third P+ type diffusion layer 107 are narrow having a similar configuration with FIGS. 17A and 17B. FIGS. 23C and 23D are examples where the second P+ type diffusion layer 106 and the third P+ type diffusion layer 107 are narrow having a similar configuration with FIGS. 18A and 18B. FIGS. 23E and 23F are examples where the second P+ type diffusion layer 106 and the third P+ type diffusion layer 107 are narrow having a similar configuration with FIGS. 18C and 18D. FIGS. 23G and 23H are examples where the second P+ type diffusion layer 106 and the third P+ type diffusion layer 107 are narrow having a similar configuration with FIGS. 18E and 18F.

Figure 24A:
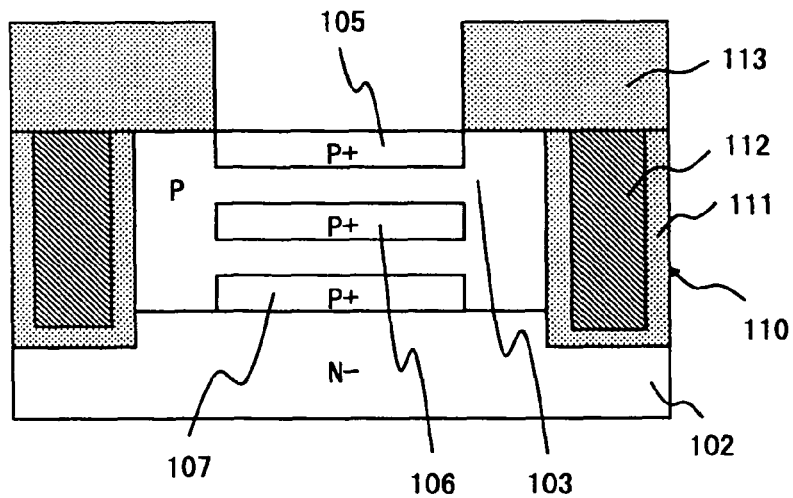
FIGS. 24A, 24C, 24E and 24G are cross-sectional diagrams taken along with the line B-B in FIG. 10 showing a configuration of a semiconductor apparatus according to the present invention.
Figure 24B:
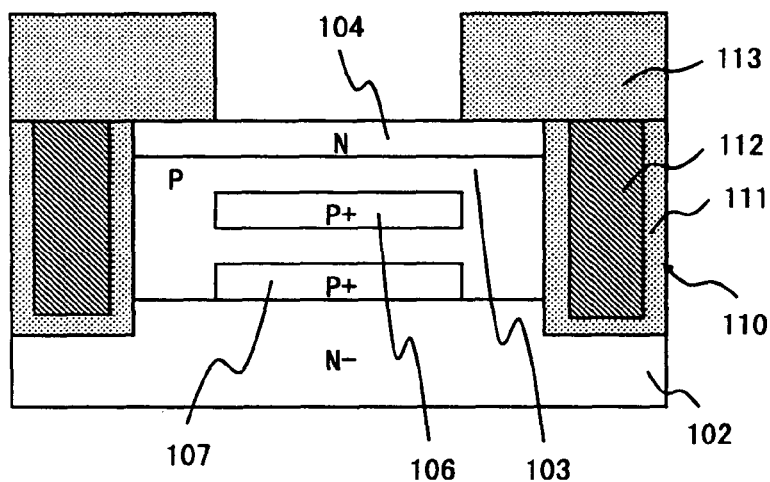
FIGS. 24B, 24D, 24F and 24H are cross-sectional diagrams taken along with the line C-C in FIG. 10 showing a configuration of a semiconductor apparatus according to the present invention.
Figure 24C:
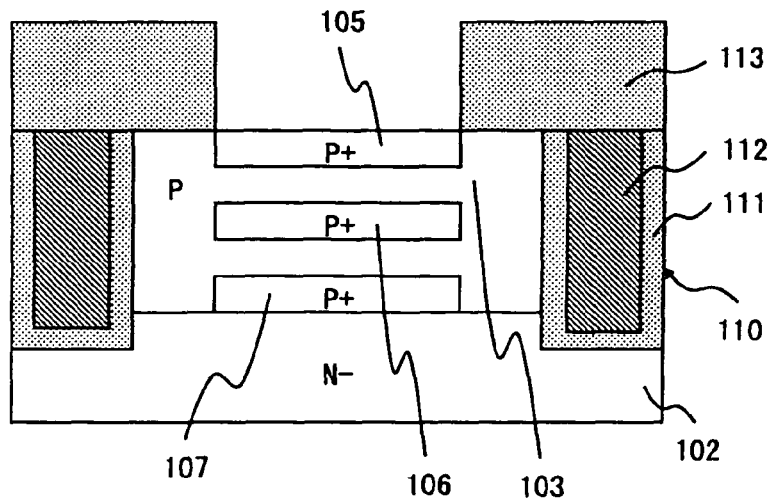
Figure 24D:
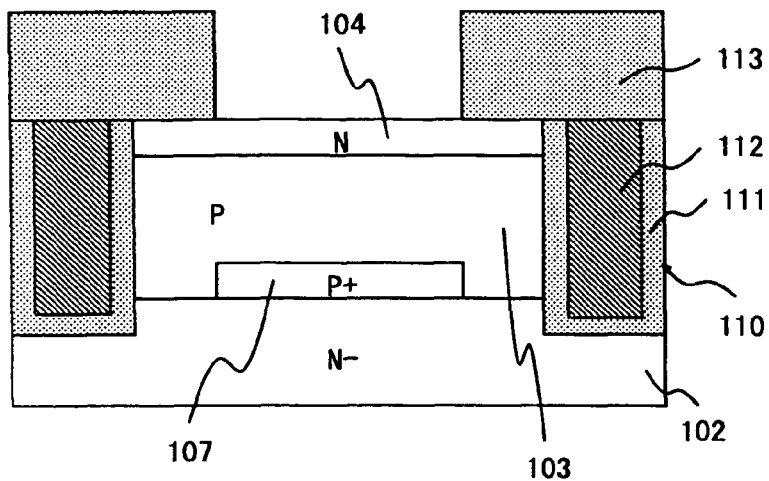
Figure 24E:
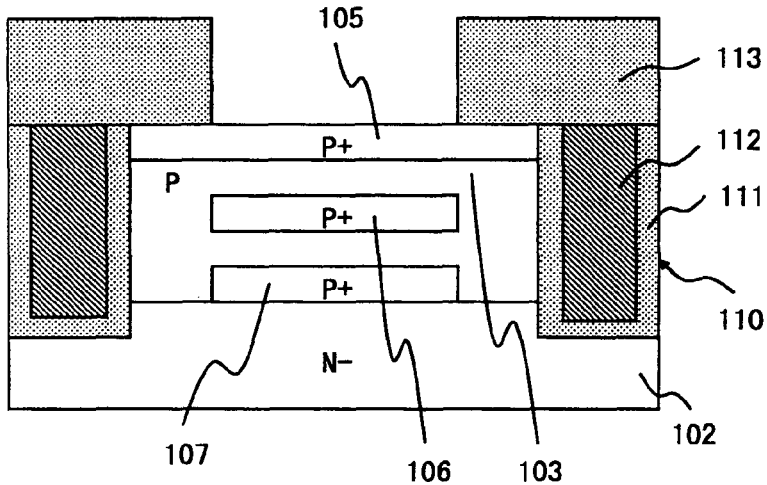
Figure 24F:
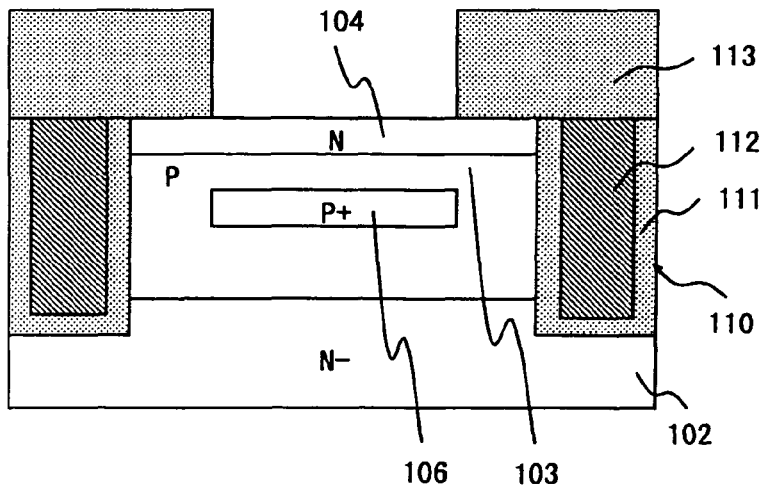
Figure 24G:
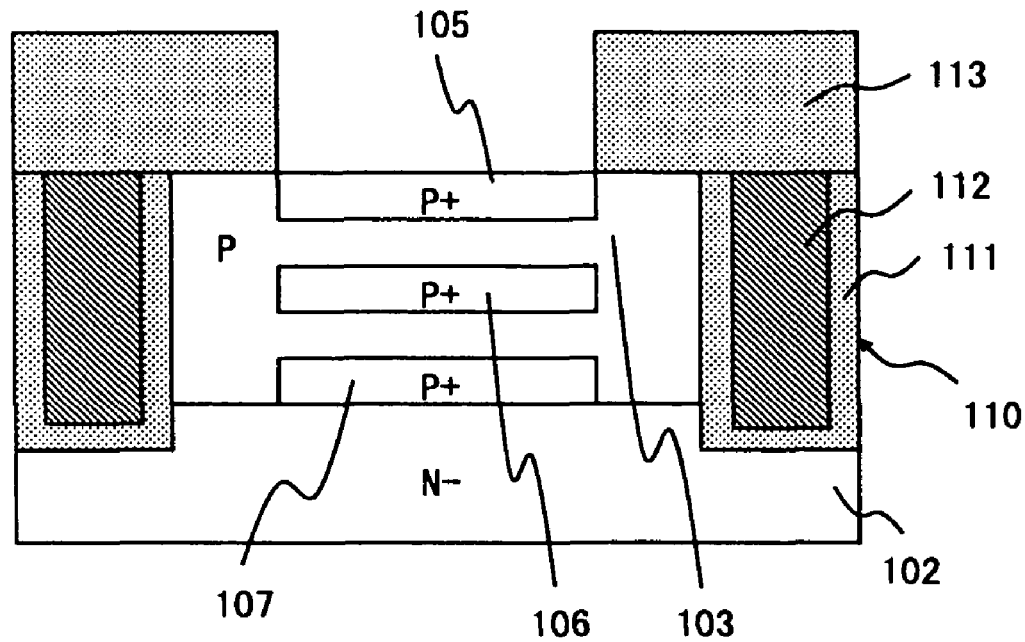
Figure 24H:
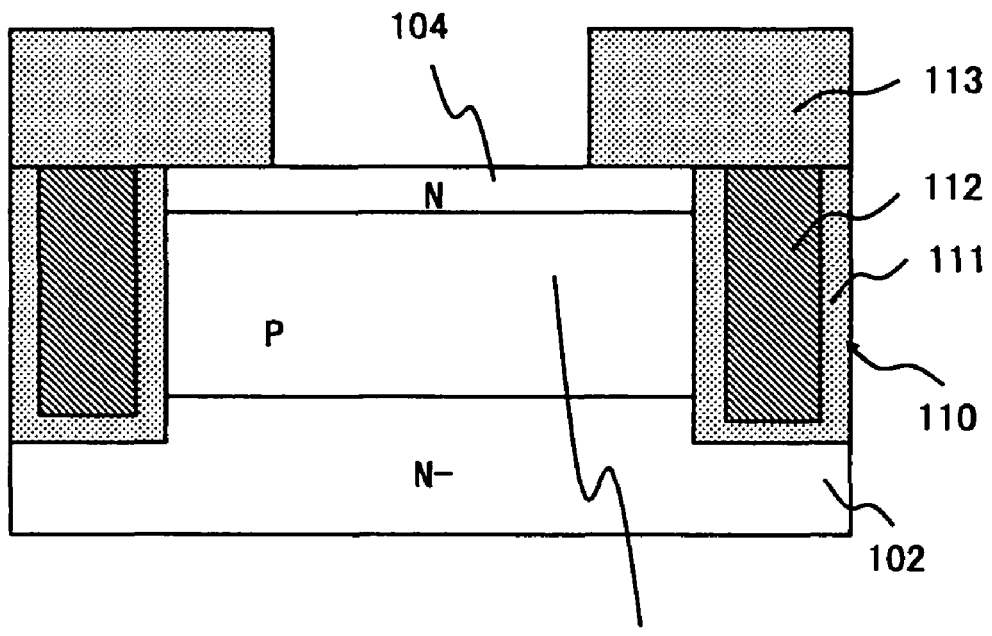

FIGS. 24A and 24B are examples where the first P+ type diffusion layer 105 and the second P+ type diffusion layer 106 and the third P+ type diffusion layer 107 are all narrow having a similar configuration with FIGS. 17A and 17B. FIGS. 24C and 24D are examples where the first P+ type diffusion layer 105 and the second P+ type diffusion layer 106 and the third P+ type diffusion layer 107 are all narrow having a similar configuration with FIGS. 18A and 18B. FIGS. 24E and 24F are examples where the second P+ type diffusion layer 106 and the third P+ type diffusion layer 107 and the third P+ type diffusion layer 107 are all narrow having a similar configuration with FIGS. 18C and 18D. FIGS. 24G and 24H are examples where the first P+ type diffusion layer 105 and the second P+ type diffusion layer 106 and the third P+ type diffusion layer 107 are all narrow having a similar configuration with FIGS. 18E and 18F.

As described in the foregoing, in this embodiment having rectangular cells, P+ type diffusion layers are formed in an upper part of the P type base diffusion layer, in the middle in vertical direction in the P type base diffusion layer, and in a lower part of the P type base diffusion layer, separated from each other. This improves destruction resistance of avalanche operation and parasitic bipolar transistor against secondary breakdown as with the third embodiment.

Other Embodiments

In the abovementioned example, rectangular and oblong cells are explained as an example for a trench gate MOSFET. However a cell is not restricted to these but can be other shapes including striped cell.

Further in the abovementioned example, two or three P+ type diffusion layers are provided in the P type base diffusion layer separated from each other. However it is not restricted to this but any number of P+ type diffusion layer may be provided.

Although an example of an N channel MOSFET is described in the foregoing, it is not restricted to this but may be a P channel MOSFET.

It is apparent that the present invention is not limited to the above embodiment and it may be modified and changed without departing from the scope and spirit of the invention.

What is claimed is:

1. A semiconductor apparatus, comprising:
a doped semiconductor layer formed on a semiconductor substrate of a first conductivity type;
a first gate trench formed in the semiconductor layer; and
a second gate trench formed in the semiconductor layer separated from the first gate trench in a first direction,
wherein the doped semiconductor layer comprises:
a low concentration base region of a second conductivity typed formed between the first and second gate trenches, the low concentration base region having a first edge in touch with the first gate trench and a second edge in touch with the second gate trench;
a first source region of the first conductivity type formed at an upper surface of the low concentration base region;
a second source region of the first conductivity type formed at the upper surface of the low concentration base region separated from the first source region in a second direction perpendicular to the first direction, each of the first and second source regions having a first edge in touch with the first gate trench and a second edge in touch with the second gate trench;
a first high concentration base region of the second conductivity type formed at an upper surface of the low concentration base region between the first and second source regions, the first high concentration base region comprising a first edge in touch with the first gate trench, a second edge in touch with the second gate trench, a third edge in touch with the first source region, and a fourth edge in touch with the second source region;
a second high concentration base region of the second conductivity type formed below the first high concentration base region, and in a third direction perpendicular to both the first direction and the second direction, so that the first and second high concentration base regions are separated by the low concentration base region, and the second high concentration base region is not provided below both of the first and second source regions; and
a third high concentration base region of the second conductivity type formed between the first and second high concentration base regions so that the first and third high concentration base regions are separated by the low concentration base region, the third and second high concentration base regions are separated by the low concentration base region, and the third high concentration base region is not provided below both of the first and second source regions.

2. The semiconductor apparatus according to claim 1, wherein the second high concentration base region comprises a first edge in touch with the first gate trench and a second edge in touch with the second gate trench.

3. The semiconductor apparatus according to claim 1, wherein the third high concentration base region comprises a first edge in touch with the first gate trench and a second edge in touch with the second gate trench.

* * * * *